US005103282A

United States Patent [19]

Isomura et al.

[11] Patent Number: 5,103,282

[45] Date of Patent: * Apr. 7, 1992

[54] SEMICONDUCTOR INTEGRATED CIRCUIT DEVICE HAVING A GATE ARRAY WITH A RAM AND BY-PASS SIGNAL LINES WHICH INTERCONNECT A LOGIC SECTION AND I/O UNIT CIRCUIT OF THE GATE ARRAY

[75] Inventors: Satoru Isomura, Tokyo; Masato Iwabuchi, Hachioji; Katsumi Ogiue, Hinode, all of Japan

[73] Assignee: Hitachi, Ltd., Tokyo, Japan

[ * ] Notice: The portion of the term of this patent subsequent to Sep. 25, 2007 has been disclaimed.

[21] Appl. No.: 579,698

[22] Filed: Sep. 10, 1990

Related U.S. Application Data

[63] Continuation of Ser. No. 198,311, May 24, 1988, Pat. No. 4,959,704.

[30] Foreign Application Priority Data

May 27, 1987 [JP] Japan .............................. 62-128233

[51] Int. Cl.[5] ............................................ H01L 27/10

[52] U.S. Cl. .................................... 357/45; 357/23.6; 357/41; 357/54; 365/63

[58] Field of Search .................... 357/23.6, 41, 45, 54; 365/63

[56] References Cited

U.S. PATENT DOCUMENTS

| | | | |
|---|---|---|---|
| 4,791,607 | 12/1988 | Igarashi et al. . | |
| 4,797,717 | 1/1989 | Ishibashi et al. | 357/45 |
| 4,803,534 | 2/1989 | Koike et al. | 357/45 |
| 4,845,544 | 7/1989 | Shimizu | 357/45 |
| 4,855,958 | 8/1989 | Ikeda | 357/45 |
| 4,873,559 | 10/1989 | Shimizu et al. | 357/23.6 |
| 4,890,148 | 12/1989 | Ikeda et al. | 357/45 |
| 4,959,704 | 9/1990 | Isomura et al. | 357/41 |

FOREIGN PATENT DOCUMENTS

| | | | |
|---|---|---|---|
| 47-100747 | 6/1982 | Japan | 357/45 |
| 57-100758 | 6/1982 | Japan | 357/45 |
| 60-134462 | 7/1985 | Japan | 357/45 |
| 60-145641 | 8/1985 | Japan | 357/45 |
| 61-97849 | 5/1986 | Japan | 357/45 |
| 61-97849 | 5/1986 | Japan . | |
| 61-97957 | 5/1986 | Japan | 357/45 |
| 61-274339 | 12/1986 | Japan . | |

*Primary Examiner*—Rolf Hille
*Assistant Examiner*—Steven Loke
*Attorney, Agent, or Firm*—Antonelli, Terry Stout & Kraus

[57] ABSTRACT

In a gate array with a RAM, by-pass signal lines which interconnect a logic section and I/O unit circuit of the gate array are disposed so as to extend above the RAM. In order to minimize mutual interference, signal lines formed from a layer which is adjacent to the by-pass signal lines are disposed so as to intersect the latter at right angles. In addition, interconnection pitches in different layers which extend parallel with each other are set so that noises are cancelled in differential sense circuits.

23 Claims, 52 Drawing Sheets

PBL(P+)
Epi
501(P-)
NBL(N+)
PBL(P+)

NBL(N+)
501(P-)
Epi

NBL(N+)
Epi
501(P-)
PBL(P+)

SEMICONDUCTOR INTEGRATED CIRCUIT DEVICE HAVING A GATE ARRAY WITH A RAM AND BY-PASS SIGNAL LINES WHICH INTERCONNECT A LOGIC SECTION AND I/O UNIT CIRCUIT OF THE GATE ARRAY

This is a continuation of application Ser. No. 198,311, filed May 25, 1988, now U.S. Pat. No. 4,959,704.

BACKGROUND OF THE INVENTION

The present invention relates to a semiconductor integrated circuit device and, more particularly, to a technique which may be effectively applied to an ultra-speed LSI having and a memory section a logic section.

General gate array techniques are disclosed, for example, in G.B. Patent Number 2,104,284, Takahashi et al., U.S. patent application Ser. No. 946,608, Kawashima, filed on Dec. 29, 1986, and also in the articles by Takahashi and Nishimura et al. in the July 1986 issue of "Denshi Zairyo (Electronic Materials)", a journal, pp. 104-109 and pp. 110-115, respectively.

To respond to the demand for achievement of high-speed computers, memory LSI's having peripheral logic functions additionally imparted thereto (hereinafter referred to as "logical memory LSI's") or "memoried logic LSIs" have recently been used as memory LSI's for large-sized computers by way of example.

These memory LSIs are introduced in the articles contributed to the same issue of the above-described journal by Shimizu and Fujii et al., pp. 66-71 and pp. 86-91, respectively.

The above-described article written by Fujii et al. also discloses a gate array IC wherein an I/O (input/output) section and logic section are connected together by a third-level Al interconnection which is extended above a memory section.

BRIEF SUMMARY OF THE INVENTION

The inventors of the present invention studied the prior art logical memory LSI's.

As a result, the present inventors have found that the conventional arrangement of a gate array that includes complementary MOSFET circuits as principal elements is incapable of satisfactorily coping with the demand for high-speed operation.

Further, it has been revealed that, even in the application to an intermediate-speed operation, the conventional arrangement wherein by-passes are provided at random by the use of the uppermost layer extended above the memory section involves a fear of coupling of a byass signal line and a memory signal line (data or word line) directly below it to cause crosstalk.

It has also been revealed that, if the lengths of the respective signal lines between the I/O section and the logic section are set at random, a skew is undesirably caused by different delays among a plurality of signals.

It is an object of the present invention to provide a technique which enables a reduction in the delay in transmission of signals.

It is another object of the present invention to provide a technique which enables prevention of occurrence of a skew.

It is one object of the present invention to provide a technique which enables a gate array to be arranged with a high degree of freedom.

It is one object of the present invention to provide a high-speed memory gata array.

It is one object of the present invention to provide a memory logic LSI which is conformable with a logic section of a high-speed mainframe computer.

It is one object of the present invention to provide a gate array integrated circuit (IC) including a random access memory (RAM) having a low power consumption.

It is one object of the present invention to provide a layout method which enables a reduction in crosstalk between signal lines in a memory section and signal lines which extend thereabove.

It is one object of the present invention to provide a gate array arranging method which enables each interconnection layer to be effectively utilized .

A description pertaining to the invention disclosed in this application will be given hereinunder.

A signal interconnection channel that is employed to form signal interconnections provided across a memory section to connect together a plurality of circuits is disposed above the memory section in such a manner that the signal interconnection channel intersects at right angles signal lines directly below it, thereby reducing capacitive and inductive couplings.

BRIEF DESCRIPTION OF THE DRAWINGS

FIGS. 3F to 30 are cross-sectional views respectively showing steps in the process of producing the mother chip and projecting electrodes;

FIGS. 5QA to 5QC are sectional views of an SRAM according to the embodiment 5—II of the present invention, in which:

FIG. 5QA is a sectional view of a bipolar transistor constituting a peripheral circuit;

FIG. 5QB is a sectional view of a memory cell, which shows the same portion as that shown in FIG. 5C; and FIG. 5QC is a sectional view of the memory cell, which shows the same portion as that shown in FIG. 5D.

DETAILED DESCRIPTION OF THE INVENTION

Figure 1A:
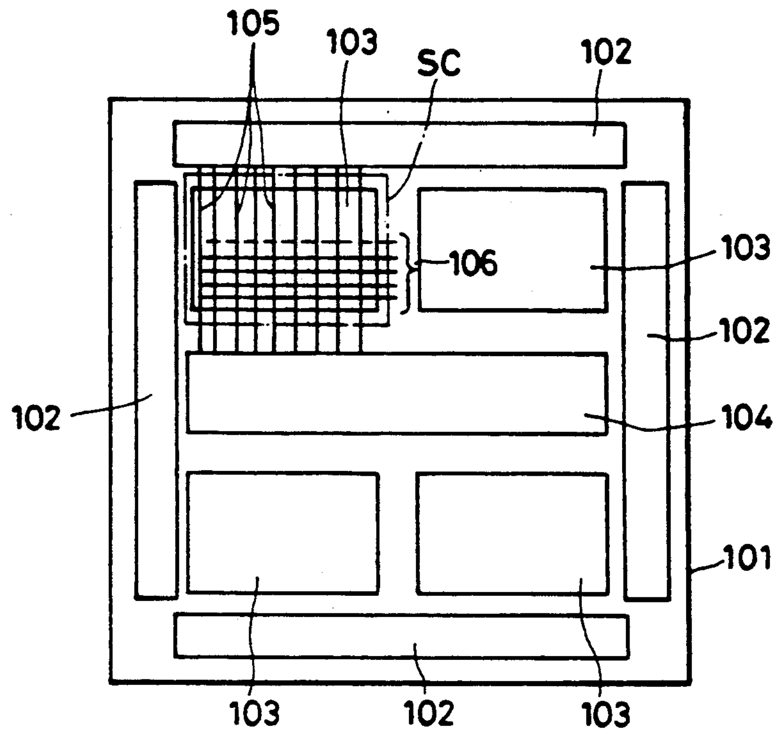
FIG. 1A is a plan view of a logical memory LSI according to the embodiment 1—I of the present invention.

Embodiments of the present invention will be described hereinunder with reference to the accompanying drawings. Throughout the drawings, elements or portions having the same functions are denoted by the same reference numerals, and as a general rule repetitive description is omitted. Accordingly, it should be noted that the portions or elements denoted by the same reference numerals are produced by the same processes as those which are explained in the description of the embodiments relevant thereto, unless otherwise specified.

The same rule also applied to the elements or portions denoted by the reference numerals the last two figures of which are the same, unless otherwise specified.

(1) Embodiment 1

FIG. 1A is a plan view of a logical memory LSI or memoried logic LSI according to the embodiment 1—I of the present invention.

As shown in FIG. 1A, in the logical memory LSI according to the embodiment 1, input/output circuit sections 102 are provided at the peripheral portion of a semiconductor chip 101, for example, silicon chip. The reference numeral 103 denotes memory sections, for example, RAM's, each of which is defined by a memory cell array comprising a multiplicity of memory cells. In this embodiment, four memory sections 103 are provided. Further, a logic section 104 comprising a multiplicity of gates is provided in the central portion of the semiconductor chip 101.

The input/output circuit sections 102 and the logic section 104 are connected together through signal interconnections 105. In this embodiment, a signal interconnection channel SC is provided above each memory section 103, and signal interconnections 105 are provided on the signal interconnection channel SC.

In the logical memory LSI according to this embodiment, the interconnection for a memory cell array constituting each memory section 103 is effected using, for example, a number of interconnection layers which is determined by subtracting one from a total number of interconnection layers, and the remaining one layer is employed for signal interconnections 105.

In FIG. 1A, a group of interconnections 106 are memory signal lines which are defined by an Al interconnection layer directly below the above-described signal interconnection channel SC, that is, data or word lines in the case of a RAM (random access memory).

The description will be continued below more specifically on the assumption that Al interconnection layers are represented by Al (1), Al (2), Al (3) . . . Al (N-1), Al(N), respectively, from the one which is closer to the surface of the chip 101, that is, from the lowermost layer, and, for example, a process, memory and logic circuit each of which includes N Al interconnection layers are referred to as an "N-Al process", "N-Al memory", and "N-Al logic circuit", respectively.

If each memory section 103 has the N-1-Al arrangement, the above-described signal by-pass interconnection channel SC, or the logic signal lines extending over the memory, comprises Al(N).

If, in this case, the word lines of the memory mat 102 comprise Al (N-1), the layout is arranged such that the word lines and the by-pass interconnections 105 intersect each other at right angels. Thus, it is possible to minimize possible crosstalk.

If Al (N-1) is employed to constitute data lines, the layout is arranged such that the data lines and the by-pass interconnections 105 comprising Al (N) intersect each other at right angles.

It should be noted that, although in FIG. 1A the signal by-pass interconnections 105 and the memory signal lines 106 are shown for only one memory mat, signal by-pass interconnections and memory signal lines are, of course, provided for the other memory mats.

Since the signal interconnection channel SC is provided above each memory section 103 as described above, it is possible to connect together the input/output circuit sections 102 and the logic section 104 though the signal interconnections 105 without the need to by-pass the memory sections 103 and it is therefore possible to minimize the length of the signal interconnections 105. Since this enables a reduction in the delay in transmission of signals, it is possible to increase the operating speed of the LSI. Further, since it is possible to equalize the lengths of signal interconnections 105 which are connected to the terminals of all the input/output circuit sections 102, it is possible to equalize the delays in signal transmission through these signal interconnections 105 and hence prevent occurrence of a skew. Thus, it is possible to handle equally all the input/output pins of the LSI and therefore the timing design for the LSI is facilitated.

In the case where the logical memory LSI according to this embodiment is arranged using, for example, a gate array type LSI also, it is possible to obtain advantageous effects similar to those described above by defining the signal interconnection channel SC by an interconnection layer extending above each memory section 103 and effecting automatic interconnection by automated design. Since, in this case, the signal interconnection channel SC can be used only for the signal interconnections 105, it is possible to achieve an increase in the degree of freedom with which automatic interconnection is carried out. Further, since there is an increase in the degree of freedom in setting of the respective positions of the terminals of the input/output circuit sections 102, it is possible to prevent local concentration of these terminals. As a result, automatic interconnection is facilitated. It should be noted that the arrangement in this case may be such that one or more signal interconnections 105 correspond to each terminal (connected to each input/output pin of the LSI package) of each input/output circuit section 102. If, in such a case, the signal interconnections 105 are automatically provided by automated design, it is possible to connect automatically the signal interconnections 105 to the input/output circuit sections 102 by defining the end poins of the signal interconnection 105 corresponding to the terminals of the input/output circuit section 102 as pins on the design.

Figure 1B:
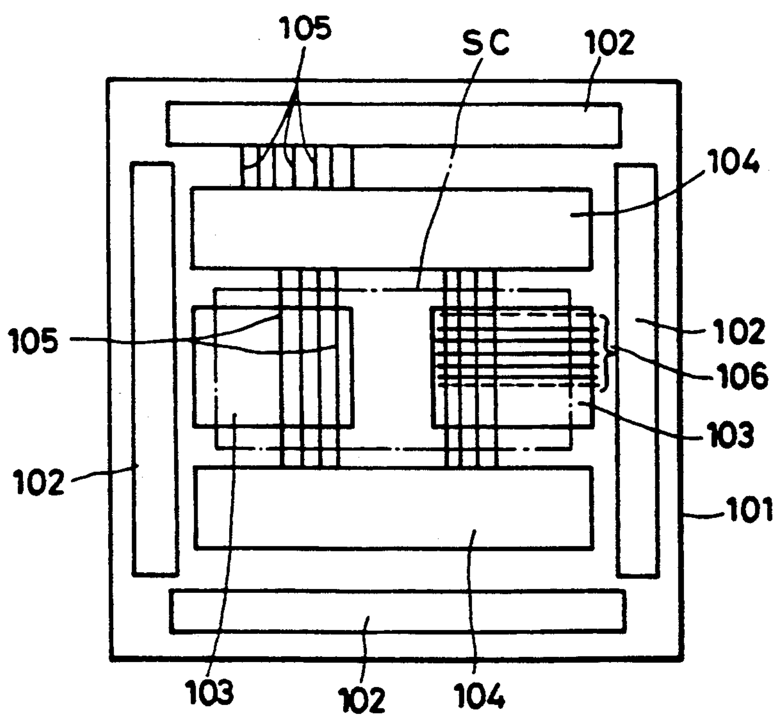
FIG. 1B is a plan view of a logical memory LSI according to the embodiment 1—II of the present invention.

FIG. 1B is a plan view of a logical memory LSI according to the embodiment 1-II of the present invention.

As shown in FIG. 1B, in the logical memory LSI according to the embodiment 1-II, the memory sections 103 are provided in the central portion of the semiconductor chip 101, and logic sections 104 are provided in such a manner as to surround the memory sections 103. In this embodiment also, the signal interconnection channel SC is provided above each memory section 103 in the same way as in the embodiment 1-I. Signal interconnections 105 which connect together the logic sections 104 are provided on the signal interconnection channels SC. Accordingly, it is possible to minimize and equalize the lengths of not only the signal interconnections 105 between the input/output circuit sections 102 and the logic sections 104 but also the signal interconnections 105 between the logic sections 104, and it is therefore possible to reduce the delay in transmission of signals and also prevent occurrence of a skew.

In this case also, it is possible to minimize crosstalk by arranging the layout such that memory signal lines of each memory mat 103, that is, word lines or bit lines (data lines), and the above-described by-pass signal interconnections 105 intersect each other at right angles in the same way as in the above-described embodiment 1-I.

Although the present invention has been described above specifically by way of embodiments, it should be noted here that the present invention is not necessarily limitative to the described embodiments and various changes and modifications may, of course, be imparted thereto without departing from the gist of the invention.

For example, the configurations and arrangements of the memory and logic sections 103 and 104 on the semiconductor chip 101 may be different from those in the above-described embodiments 1-I and 1-II. The present invention may also be applied to various kinds of semiconductor integrated circuit having memory and logic sections.

Advantageous effects obtained by a typical one of the inventions disclosed in this application will be briefly explained below.

Namely, it is possible to reduce the delay in transmission of signals and prevent occurrence of a skew.

(2) Embodiment 2

In this embodiment, a design technique which is applicable to each of the specific arrangements in the embodiment 1 concerning the layout on a chip will be described in more detail. The embodiment 2 constitutes an improvement or a part of the embodiment 1, although the embodiment 1 or the drawings concerning it are not necessarily referred to one by one.

Figure 2A:
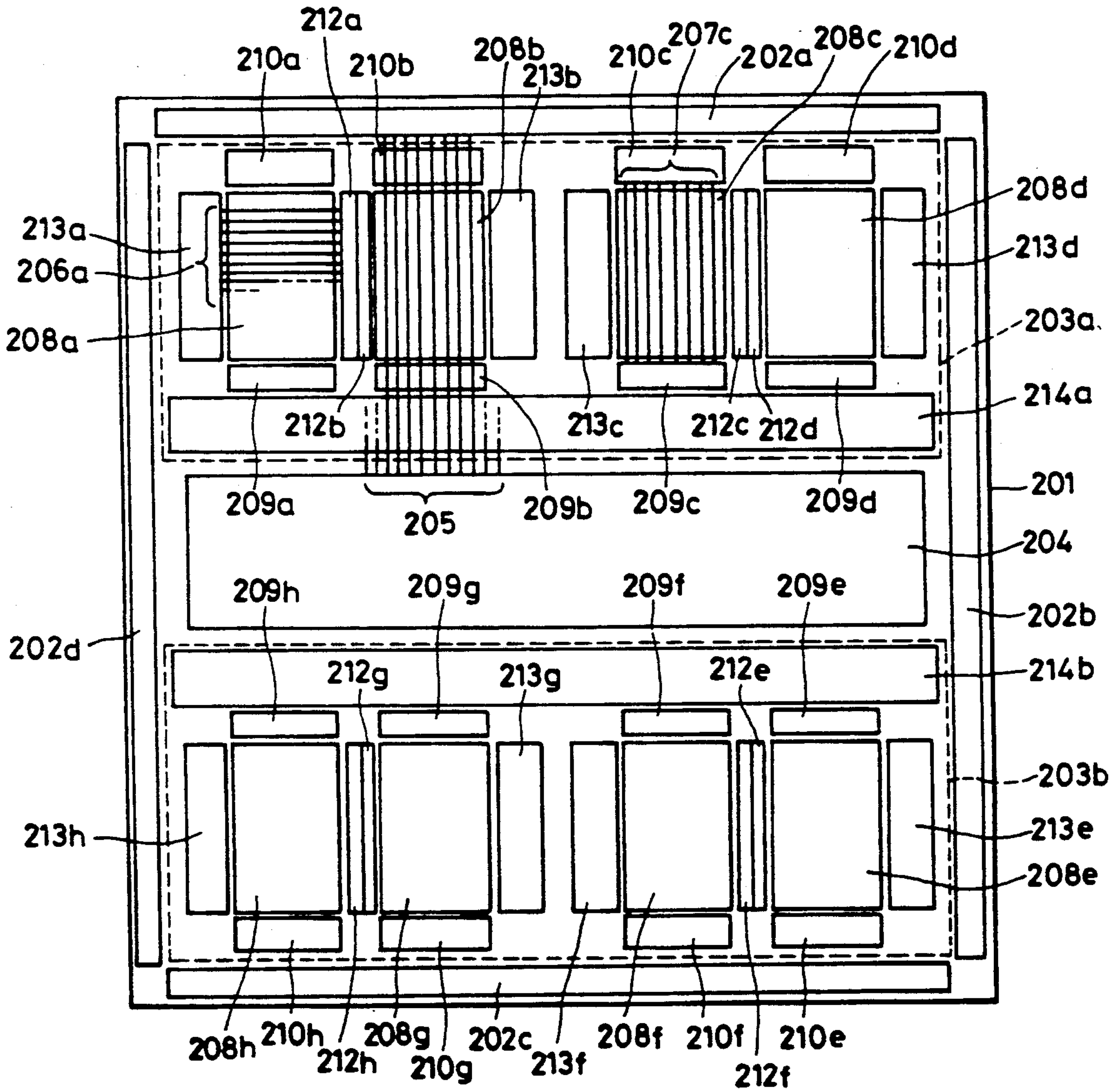
FIG. 2A is a general plan view of a logical memory LSI according to the embodiment 2 of the present invention.

FIG. 2A is a plan view showing the layout on the principal surface of a chip, which corresponds to FIG. 1A. Referring to FIG. 2A, the reference numeral 201 denotes a semiconductor chip defined by an Si single crystal substrate which is 15 by 15 mm square, and the numerals 202*a* to 202*d* denote input/output circuit sections each comprising about 20 to 100 input-only I/O cells, output-only I/O cells, I/O cells selectively used for either input or output, I/O cells used for both input and output (these cells will hereinafter be generally referred to as "I/O cells"). The reference numerals 203*a* and 203*b* denote memory regions each comprising an SRAM (Static Random Access Memory) and a peripheral circuit thereof, and the numeral 204 denotes a logic region constituting a gate array. The numeral 205 denotes signal interconnections which connect together the input/output circuit regions 202 and the logic region 204, while the numerial 206*a* denotes signal lines of each memory, that is, word lines, and the numeral 207*c* denotes the other signal lines of each memory, that is, bit lines (data lines). Although these signal lines 205, 206 and 207 are present in each memory mat and each interconnection channel region according to need or as a matter of course, the illustration thereof is appropriately omitted due to the reasons of drawing the figure.

Further, the reference numerals 208*a* to 208*h* denote memory cell mats of the SRAM, 209*a* to 209*h* sense circuits defined by differential amplifiers for reading information from the respective memory mats 208*a* to 208*h*, 210*a* to 210*h* data line decoders for the respective memory mats 208*a* to 208*h*, 212*a* to 212*h* word drivers, 213*a* to 213*h* word decoders or other word line control circuits, and 214*a*, 214*b* macrocell regions for constituting peripheral circuits such as buffers fo the respective memories.

Figure 2B:
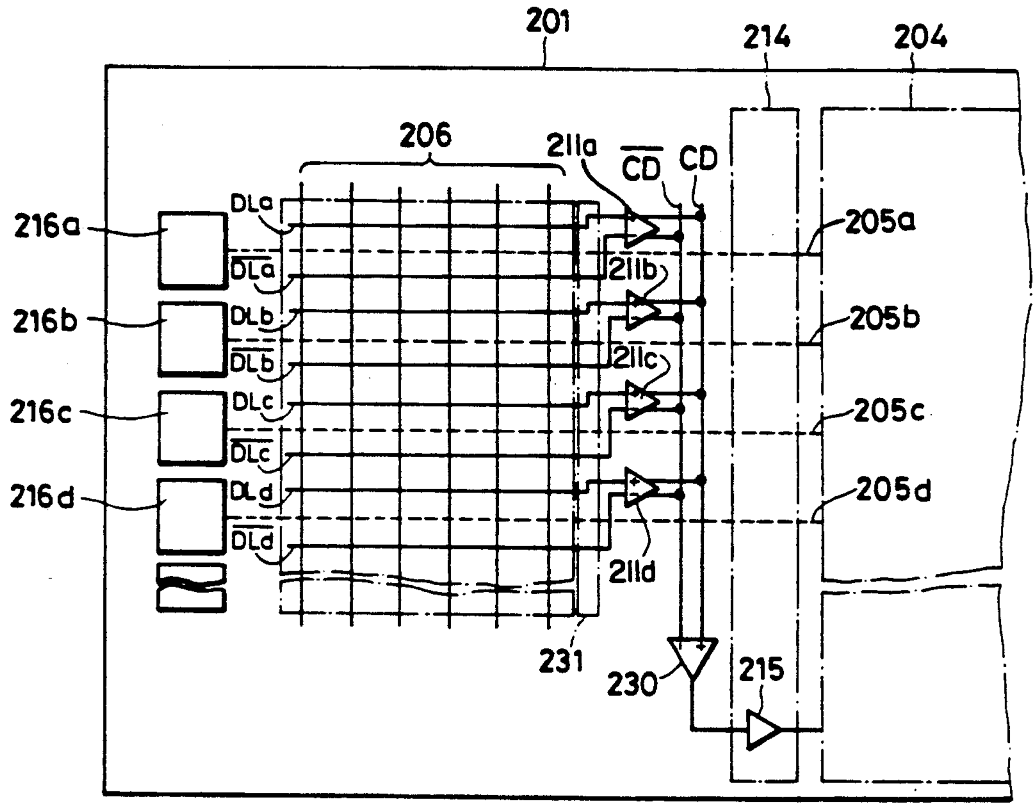
FIG. 2B is a schematic enlarged view of the memory LSI according to the embodiment 2 of the present invention.

FIG. 2B is a schematic enlarged view of an essential part of the circuit system illustrated in FIG. 2A, which schematically shows specific improvements. In the figure, the reference symbols DLa, $\overline{DLa}$, DLb, $\overline{DLb}$. . . DLd, $\overline{DLd}$ denote complementary data line pairs, 201 a chip, 204 a logic circuit region (gate array region), 205*a* to 205*d* signal interconnections for the logic circuit which extend above the memory, 206 word lines, 211*a* to 211*d* differential amplifiers for detecting data stored in memory cells by making a comparison between the above-described complementary data line pairs, respectively, CD, $\overline{CD}$ common data lines, 230 a main amplifier, 231 a column switch group, 215 a buffer circuit provided in a macrocell 214, and 216*a* to 216*d* I/O cells for exchanging external signals with the logic section 204 which are formed within an input/output circuit region.

Since the memory mats, peripheral circuits such as decoders, macrocells are arranged using Al (1) to Al (N-1), the signal lines of the gate array 204 and the I/O cells 216*a* to 216*d* can be arranged as desired using Al (N), and therefore it is possible to extend these signal lines in a substantially straight-line form above and all over the memory region 203*a* or 203*b* so that a possible signal skew is minimized.

(3) Embodiment 3

In this embodiment, the above-described embodiments 1 to 2 concerning the layout according to the present invention are applied to a device process for a logic module which may be applied to a logical control arithmetic section or central processing unit of a mainframe computer. As to the module, a description of a chip according to the present invention, other chips, and a mother chip used to mount these chips will first be made.

Figure 3A:
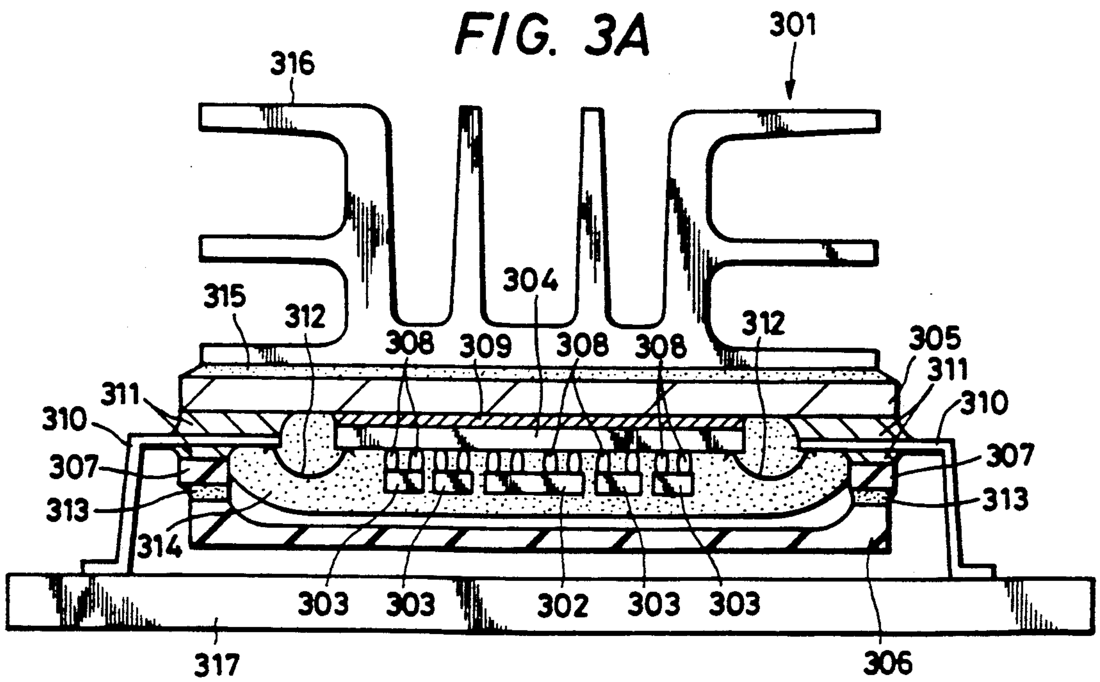
FIG. 3A is a cross-sectional view showing the arrangement of a semiconductor device to which the present invention is applied.

Referring to FIG. 3A, a semiconductor device 301 has a structure in which a mother chip (chip carrier) 304 having a plurality of semiconductor chips 302 abd 303 mounted thereon is sealed with a base board 305, a frame member 307 and a sealing cap 306.

Figure 3B:
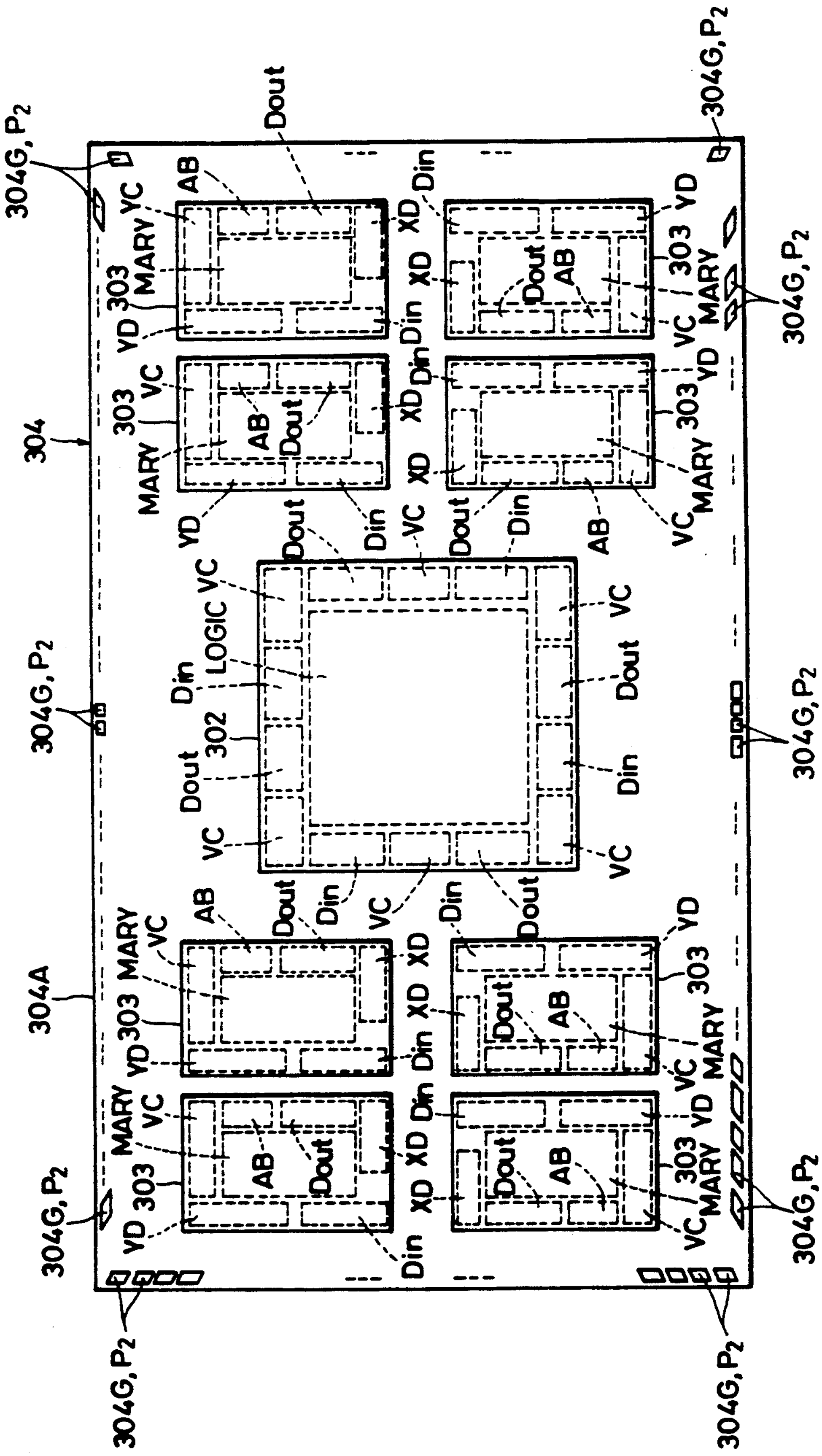
FIG. 3B is a plan view of the mother chip of the semiconductor device shown in FIG. 3A.

The semiconductor chips 302 and 303 are mounted on the mother chip 304 through projecting electrodes 308. In other words, the semiconductor chips 302 and 303 are mounted on the mother chip 304 by the face-down bonding method (or the CCB method, more exactly, controlled-collapse solder bumps method). As shown in FIG. 3B (a plan view of the mother chip), on the mother chip 304 are mounted one semiconductor chip (logic LSI) having a logical function and eight semiconductor chips (memory LSI's) each having a memory function. Since the semiconductor element forming surface of each of the semiconductor chips 302 and 303 is arranged so as to face the mounting surface of the mother chip 304, FIG. 3B shows the reverse surface of each of the semiconductor chips 302 and 303, that is, the surface on the side thereof which is remote from the semiconductor element forming surface.

As shown in FIG. 3B, the semiconductor chip (logic LSI) has a logic circuit section Logic disposed in its central portion. The logic circuit section Logic is defined by basic cells which are arranged regularly in a matrix, each basic cell comprising one or more semiconductor elements. The basic cells are connected together using a plurality of interconnection layers to constitute a predetermined logic circuit, the semiconductor elements constituting the cells also being connected using the plurality of interconnection layers. In other words, the semiconductor chip 302 is arranged so as to have a predetermined logical function according to the so-called gate array system. The semiconductor chip 302 in this embodiment comprises three interconnection layers. The first- and second-level interconnection layers are mainly used to constitute a predetermined logic circuit, while the third-level interconnection layer is mainly used to form power supply interconnections. The semiconductor elements that constitute the basic cells in the logic circuit section Logic are bipolar transistors.

Peripheral circuits including input circuits Din, output circuits Dout and power supply circuits VC are disposed at the peripheral portion of the semiconductor chip 302. Semiconductor elements that constitute each of the input, output and power supply circuits Din, Dout and VC are connected mainly using the first- and second-level interconnection layers in the same way as in the case of the logic circuit section Logic. The semiconductor elements that constitute each peripheral circuit are bipolar transistors in the same way as in the case of the logic circuit section Logic.

Figure 3C:
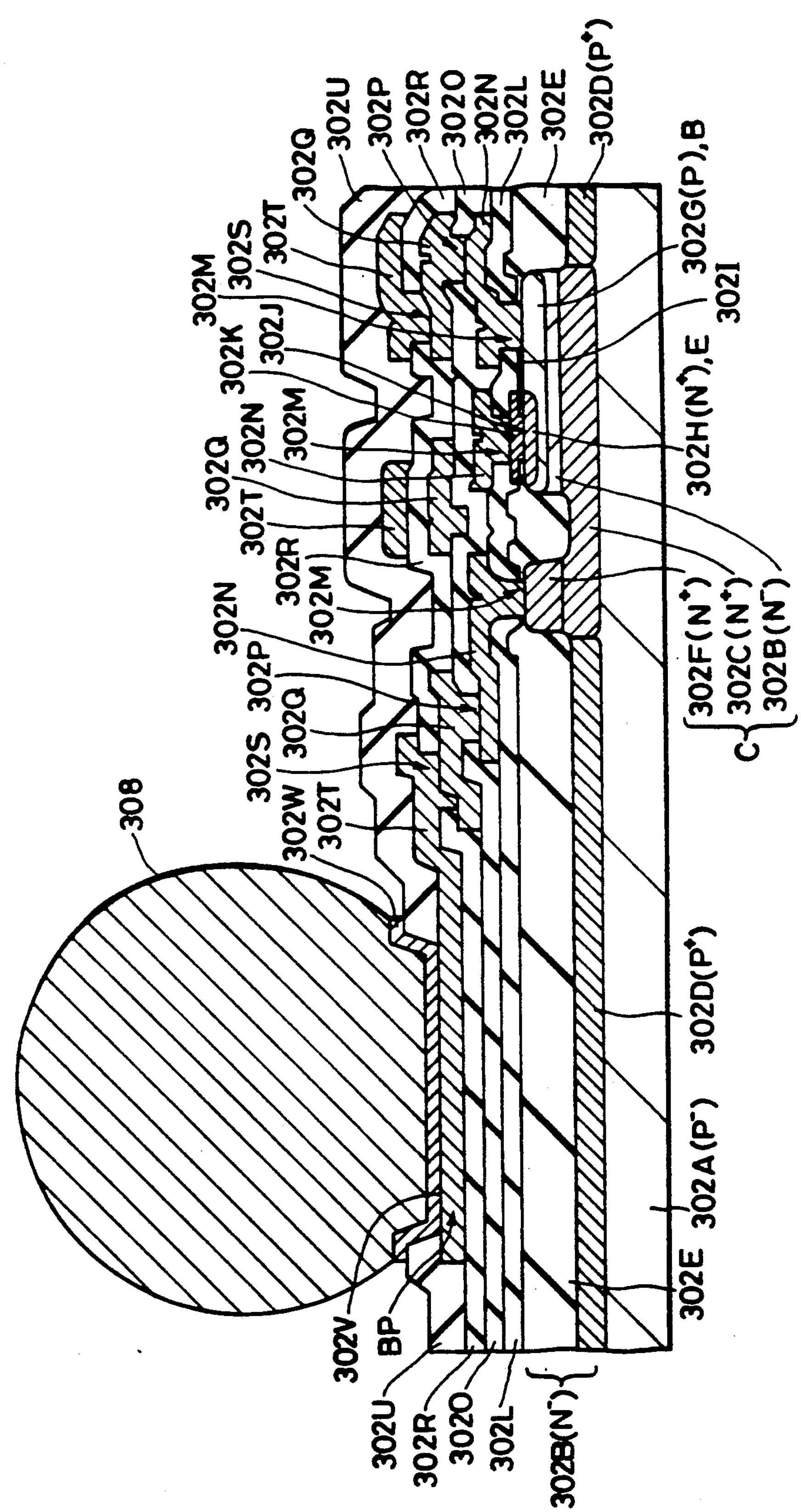
FIG. 3C is a cross-sectional view of the semiconductor chip of the semiconductor device shown in FIG. 3A.

FIG. 3C (a cross-sectional view) shows a specific structure of each of the bipolar transistors constituting the logic circuit section Logic and the peripheral circuits of the semiconductor chip 302.

As shown in FIG. 3C, the bipolar transistor is fabricated on the principal surface of a $P^-$-type semiconductor substrate 302A made of single crystal silicon. The bipolar transistor is electrically isolated from the surrounding regions by an isolation region which is defined by the semiconductor substrate 302A, a $P^+$-type semiconductor region 302D and an element isolation insulating film 302E. The semiconductor region 302D is formed between the semiconductor substrate 302A and an $n^-$-type epitaxial layer 302B grown on the surface thereof. In other words, the semiconductor region 302D is a buried semiconductor region. The element isolation insulating film 302E is formed on the principal surface of the epitaxial layer 302B so as to reach the semiconductor region 302D. The element isolation insulating film 302E is defined by a silicon oxide film formed by oxidizing the principal surface of the epitaxial layer 302B.

The bipolar transistor is an npn transistor comprising an n-type collector region C, a p-type base region B and an n-type emitter region E.

The collector region C includes a $n^+$-type semiconductor region 302C, the epitaxial layer 302B and an $n^+$-type semiconductor region 302F for pulling up potential. The semiconductor region 302C is defined by a buried semiconductor region provided between the semiconductor substrate 302A and the epitaxial layer 302B in the same way as in the case of the semiconductor region 302D. The semiconductor region 302F is provided in the principal surface region of the epitaxial layer 302B so as to reach the semiconductor region 302C. A first-level interconnection 302N is connected to the semiconductor region 302F of the collector region C through a contact hole 302M formed in an interlayer insulating film 302L. The interconnection 302N is defined by an aluminum film or an aluminum film having Cu or Si added thereto. Cu reduces stress migration, while Si suppresses occurrence of alloy spiking.

The base region B is defined by a p-type semiconductor region 302G which is provided in the principal surface region of the epitaxial layer 302B constituting a part of the collector region C. An interconnection 302N is connected to the semiconductor region 302G defining the base region S.

The emitter region E is defined by an $n^+$-type semiconductor region 302H which is provided in the principal surface region of the semiconductor region 302G constituting the base region B. An emitter electrode 302K is connected to the semiconductor region 302H defining the emitter region E through a contact hole 302J formed in an insulating film 302I. The emitter electrode 302K is formed from a polycrystalline silicon film having an n-type impurity (P or As) introduced thereinto. The semiconductor region 302H is formed by diffusion into the semiconductor region 302G of the n-type impurity introduced into the emitter electrode 302K. The polycrystalline silicon film for forming the emitter electrode 302K is, although not shown, used to constitute interconnections, resistor elements and so on in order regions. An interconnection 302N is similarly connected to the emitter electrode 302K.

A second-level interconnection layer 302Q is provided above the first-level interconnection layer 302N through an interlayer insulating film 302O. A third-level interconnection layer 302T is provided above the second-level interconnection layer 302Q through an interlayer insulating film 302R. As described above, the semiconductor chip 302 has a three-layer interconnection structure. The interconnection layers 302N and 302Q are connected together through contact holes 302P formed in the interlayer insulating film 302. The interconnection layers 302Q and 302T are connectedc together through contact holes 302S. Each of the interconnection layer 302Q and 302T is formed of the same material as that of the interconnection layer 302N. Each of the interlayer insulating films 302L, 302O and 302R is mainly formed from a silicon oxide film.

A passivation film 302U is provided above the third-level interconnection layer 302T. The passivation film 302U is defined by a silicon nitride film deposited by plasma CVD by way of example.

The third-level interconnection layer 302T defines external terminals (bonding pads) BP on each of the peripheral circuits and on the logic circuit section Logic which is connected with the peripheral circuits. As shown in FIG. 3C, an opening 302V is formed in that portion of the passivation film 302U which is above the external terminal BP defined by the interconnection 302T. A barrier metal layer 302W is provided through the opening 302V on that portion of the interconnection 302T which constitutes the external terminal BP. The barrier metal layer 302W is defined by a composite film prepared by successively stacking Cr, Cu and Cu films. The Cr film is formed with a thickness of about 1200 to 1500 [Å]. The Cu film is formed with a thickness of about 5000 to 7000 [Å]. The Au film is formed with a thickness of about 700 to 1100 [Å]. One end portion of a projecting electrode 308 which is formed on the mother chip 302 is connected through the barrier meral layer 302W to that portion of the interconnection 302T which constitutes the external terminal BP.

Figure 3D:
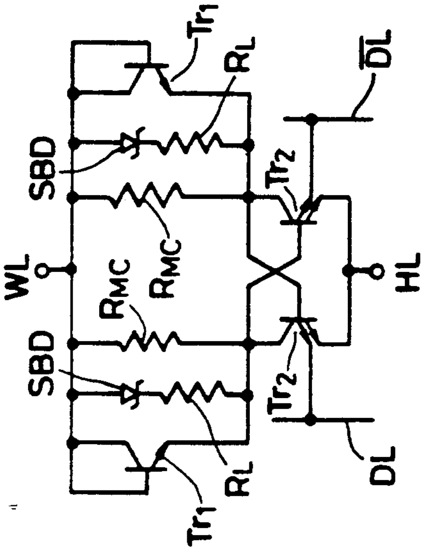
FIG. 3D is an equivalent circuit diagram of a memory cell providing a memory function which is incorporated in the semiconductor chip shown in FIG. 3A.

The above-described semiconductor chips (memory LSI's) are defined by SRAM's, respectively. As shown in FIG. 3B, each semiconductor chip 303 has a memory call array MARY disposed in its central portion. The memory cell array MARY is defined by a plurality of memory cells which are disposed in a matrix. Each memory cell is, as shown in FIG. 3D (an equivalent circuit diagram of the memory cell), defined by a Schottky-barrier type cell comprising bipolar transistors. The memory cell is arranged within a region which is defined by a work line WL and a data hold line HL which extend in the column direction and a pair of complementary digit lines Dl and e,ovs/DL/ . More specifically, the memory cell comprises two parasitic npn bipolar transistors $Tr_1$, two backward npn bipolar transistors $Tr_2$, two Schottky barrier diodes SBD, two memory cell resistors $R_{MC}$, and two low-resistance elements $R_L$.

As shown in FIG. 3B, peripheral circuits including an input circuit Din, an output circuit Dout, a power supply circuit VC, an address buffer circuit AB, an X-driver circuit XD and Y-driver circuit YD are disposed at the peripheral portion of each semiconductor chip 303. Semiconductor elements constituting each of these peripheral circuits are bipolar transistors. The bipolar transistors constituting the semiconductor chip (memory LSI) 303 and those which constitute the semiconductor chip (logic LSI) 302 have substantially the same structure.

The semiconductor chip 303 has a two-layer interconnection structure (i.e., two aluminum interconnection layers). External terminals BP on the semiconductor chip 303 are defined by the second-level interconnection layer. The external terminals BP are formed on the peripheral circuits. No external terminals BP are formed on the memory cell array MARY with a view to reducing soft errors due to α-particles emanating from radioactive elements (U, Th, etc.) contained in the projecting electrodes 308 in a trace amount. Although memory cells comprising bipolar transistors are more resistant to soft errors than those which comprise MISFET's, no external terminals BP are formed on the memory array MARY in order to increase the margin of safety with respect to soft errors.

Figure 3E:
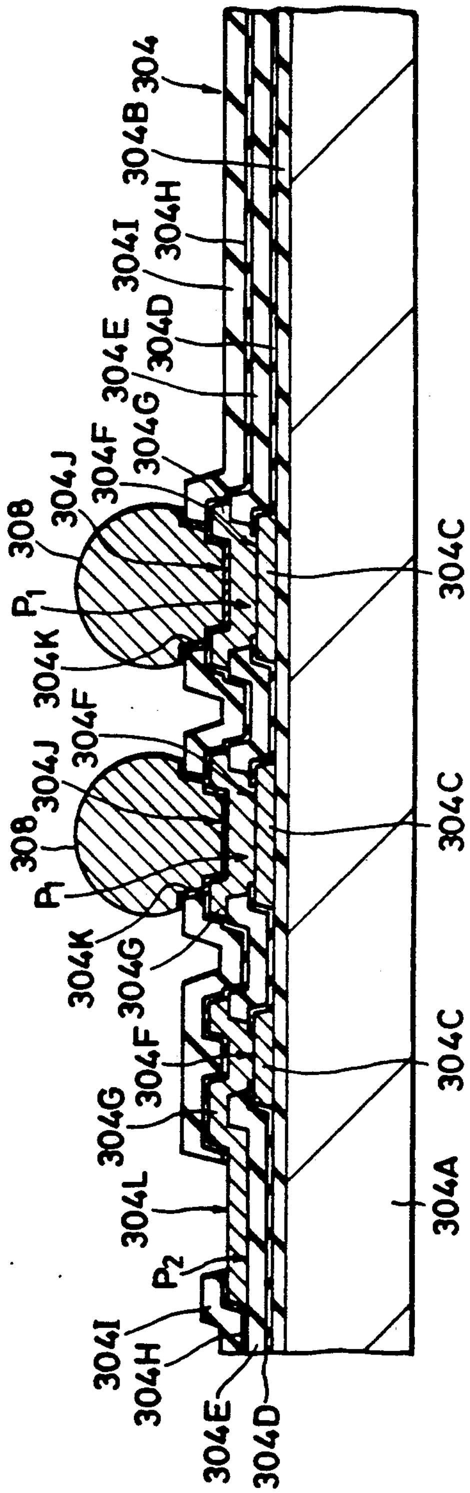
FIG. 3E is a cross-sectional view of the mother chip shown in FIG. 3B.

The above-described mother chip 304 is arranged as shown in FIG. 3B and FIG. 3E (a cross-sectional view of the mother chip). The mother chip 304 has a first-level interconnection layer 304C provided on the surface of a silicon substrate 304A through an interlayer insulating film 304B by way of example. The silicon substrate 304A has no difference in thermal expansion coefficient from the semiconductor chips (single crystal silicon substrates 302A) 302 and 303 and exhibits excellent thermal conductivity. The interlayer insulating film 304B is defined by a silicon oxide film formed by oxidizing the principal surface of the silicon substrate 304A. The interconnection layer 304C is defined by an aluminum film or an aluminum film having Si added thereto.

A second-level interconnection layer 304G is provided above the first-level interconnection layer 304C through a stack of interlayer insulating films 304D and 304E. The interconnection layers 304G and 304C are formed of substantially the same material. The interconnection layers 304G and 304C are connected together thorugh contact holes 304F formed in the interlayer insulating films 304D and 304E. The interlayer insulating film 304D is mainly used as an etching stopper layer and defined by a silicon nitride film which is deposited by, for example, plasma CVD. The interlayer insulating film 304E is mainly used to isolate electrically the interconnections 304C and 304G and is defined by a silicon oxide film deposited by, for example, sputtering. The contact holes 304F are formed by subjecting the interlayer insulating film 304E to an isotropic wet etching and subjecting the interlayer insulating film 304D to an anisotropic dry etching.

A stack of passivation films 304H and 304I is provided on the second-level interconnection layer 304G. The passivation film 304H is defined by, for example, a silicon nitride film. The passivation film 304I is defined by, for example, a silicon oxide film.

The second-level interconnection layer 304G is, as shown in FIG. 3E, arranged to constitute internal terminals $P_1$ within pretetermined regions in the central portion of the mother chip 304. The internal terminals $P_1$ are arranged so as to be connected to the respective external terminals BP of the semiconductor chips 302 and 303 through the corresponding projecting electrodes 308. A barrier metal layer 304K is provided on each interconnection 304G constituting an internal terminal $P_1$ through an opening 304J formed in the stack of passivation films 304H and 304I. The barrier metal layer 304K has substantially the same structure (Au/Cu/Cr) as that of the barrier metal layers 302W provided on the respective surfaces of the external terminals BP of the semiconductor chips 302 and 303. The openings 304J are formed by an isotropic wet etching. Projecting electrodes 308 are provided on the respective barrier metal layers 304K.

The second-level interconnection layer 304G is arranged to constitute external terminals $P_2$ in predetermined regions in the peripheral portion of the mother chip 304. An opening 304L is provided in the stack of passivation films 304H and 304I above each interconnection 304G that constitutes an external terminal $P_2$. The opening 304L is arranged such that a bonding wire 312 is connected to the interconnection 304G constituting an external terminal $P_2$. The opening 304l is formed by subjecting the passivation film 304I to an isotropic wet etching.

The above-described projecting electrodes 308 are, although described later in detail, formed on the respective interconnections 304G constituting internal terminals $P_1$ of the mother chip 304 through the respective barrier metal layers 304K by the use of the lift-off technique. More specifically, the other end of a projecting electrode 308 is connected to each internal terminal $P_1$. The projecting electrodes 308 are formed of solder (i.e., solder projecting electrodes).

The mother chip 304 is, as shown in FIG. 3A, mounted on the base board 305 through a bonding metal layer 309. The base board 305 is defined by, for example, a silicon carbide substrate which features a small difference in thermal expansion coefficient with respect to the mother chip 304 and excellent thermal conductivity. The bonding metal layer 309 is formed of, for example, an Au-Sn alloy.

Leads 310 are provided at the peripheral portion of the base board 305 and between it and the frame member 307. The leads 310 are rigidly secured to both the base board 305 and the frame member 307 by means of a low-melting glass 3111. The leads 310 are formed of, for example, an Fe-Ni alloy (42-alloy). The inner lead portion of each lead 310 is connected to an interconnection 304G constituting an external terminal $P_2$ of the mother chip 304 through a bonding wire 312.

The bonding wire 3612 is formed of aluminum. The bonding wire 312 is connected to both the inner lead portion of the lead 310 and the interconnection 304G constituting an external terminal $P_2$ of the mother chip 304 by the ultrasonic bonding method.

The mother chip 304 having the semiconductor chips 302 and 303 mounted thereon, together with the inner lead portions of the leads 310 and the bonding wires 312, are hermetically sealed with a sealing material 314. As the sealing material 314, silicone gel is employed by way of example. The sealing material 134, e.g., silicone gel, is formed by potting.

The base board 305 and the frame member 307 are rigidly secured to each other by means of a low-melting glass 311, while the frame member 307 and the sealing cap 306 are rigidly secured together by means of an adhesive 313. As the adhesive 313, silicone rubber is used by way of example. The frame member 307 is formed of, for example, a mullite material. The sealing cap 306 is formed of, for example, a ceramic material.

A heat-dissipating fin 316 is provided on the reverse surface of the base board 305 (i.e., the surface on the side thereof which is remote from the mother chip mounting surface) through an adhesive 315. The heat-dissipating fin 316 is provided for the purpose of dissipating heat generated in the semiconductor chips 302 and 303 to the outside. As the adhesive 315, silicone rubber is used by way of example.

The outer lead portion of each of the above-described leads 310 has an L-shaped configuration. A solder layer (not shown) is provided on the surface of the outer lead portion. The outer lead portion is connected to a wiring board (baby board) 317.

The process for forming the mother chip 304 and projecting electrodes 308 of the above-described semiconductor device 301 will next be briefly explained with reference to FIGS. 3F to 30 (fragmentary sectional views respectively showing steps in the manufacturing process).

First, a silicon substrate 304A is prepared. Then, an interlayer insulating film 304B is formed on the whole surface of the silicon substrate 304A. The interlayer insulating film 304B is defined by a silicon oxide film formed by oxidizing the surface of the silicon substrate 304A. The interlayer insulating film 304 has a thickness of, for example, about 1.1 to 1.3 [$\mu$m].

Figure 3F:
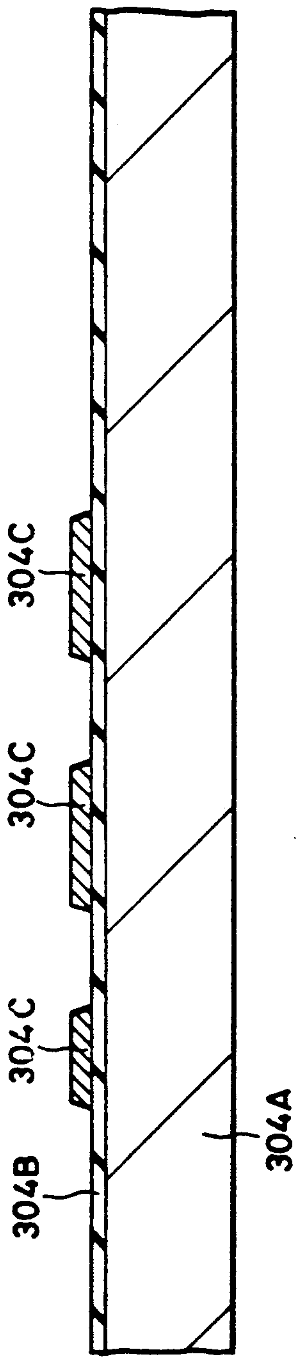

Next, as shown in FIG. 3F, a first-level interconnections 304C are formed on the interlayer insulating film 304B. The interconnections 304C are formed from an aluminum (Al-Si) film with a thickness of about 1.8 to 2.2 [$\mu$m] which is deposited by sputtering. The interconnections 304C are formed by patterning the aluminum film by means of an isotropic wet etching. In other words, the interconnections 304C are formed so that the step configuration of the side walls are made gentle to thereby enable an improvement in the step coverage of an interconnection layer which is to be deposited thereabove.

Next, interlayer insulating films 304D and 304E are successively deposited on the whole surface of the substrate 304A including the surfaces of the interconnections 304C. The interlayer insulating film 304D is formed at an etching rate which is different from that of the interlayer insulating film 304E because the insulating film 304D is used as an etching stopper layer. The interlayer insulating film 304D is defined by a silicon nitride film with a thickness of about 0.4 to 0.6 [$\mu$m] which is deposted by, for example, plasma CVD. The interlayer insulating film 304E is formed so as to provide satisfactory electrical isolation between the interconnections 304C and an interconnection layer which is provided thereabove. the interlayer insulating film 304E is defined by a silicon oxide film with a thickness of about 3.4 to 3.6 [$\mu$m] which is deposited by, for example, sputtering.

Figure 3G:
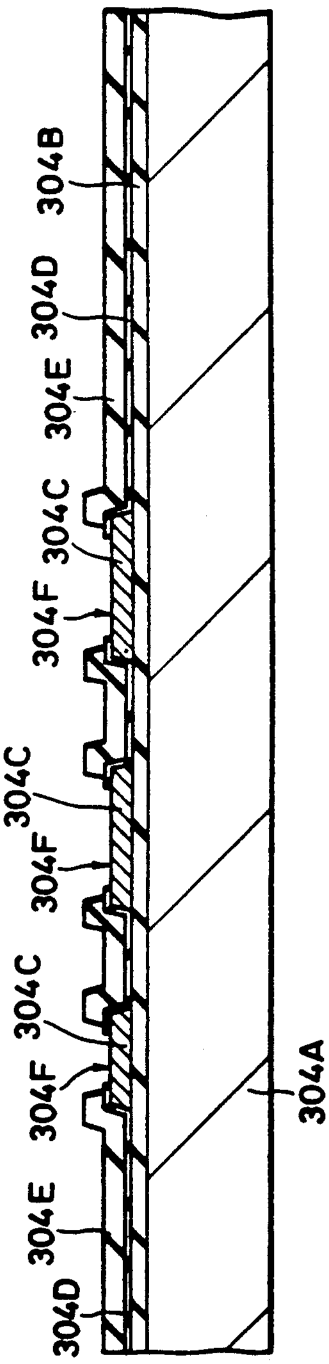

Next, as shown in FIG. 3G, those portions of the stack of interlayer insulating films 304D and 304E which extend over the interconnections 304C which are to be connected with an interconnection layer provided thereabove are removed to form contact holes 304F. The contact holes 304F may be formed by subjecting the interlayer insulating film 304E to an isotropic wet etching and subjecting the interlayer insulating film 304D to an anisotropic dry etching. At the time of formation of the contact holes 304F, the control of the etching rate of the interlayer insulating film 304E which is satisfactorily thick can be readily effected because the interlayer insulating film 304D is used as an etching stopper layer. Since the contact holes 304F are formed by etching the interlayer insulating film 304E by means of an isotropic wet etching, the step configuration of the contact holes 304F are made gentle and it is therefore possible to improve the step coverage of an interconnection layer which is to be provided on the wall surfaces of the contact holes 304F.

Figure 3H:
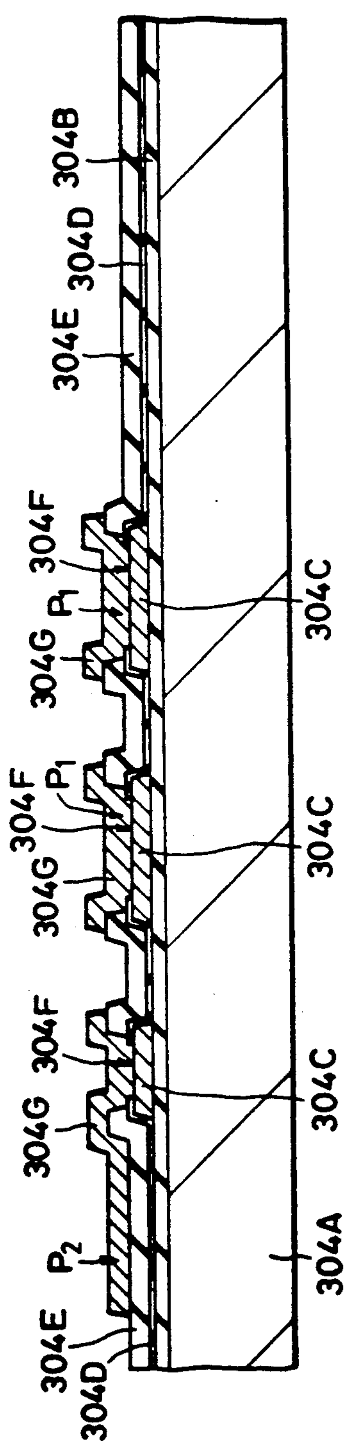

Next, as shown in FIG. 3H, second-level interconnections 304G are formed on the interlayer insulating film 304E so as to be connected to the interconnections 304C through the contact holes 304F, respectively. The interconnections 304G are used not only to transmit signals but also to form the internal and external terminals $P_1$ and $P_2$ of the mother chip 304. The interconnections 304G are defined by an aluminum (Al-Si) film with a thickness of about 2.4 to 2.6 [μm] which is deposited by sputtering in the same way as in the case of the interconnections 304C. The interconnections 304G are formed by patterning the aluminum film by means of an isotropic wet etching.

Figure 3I:
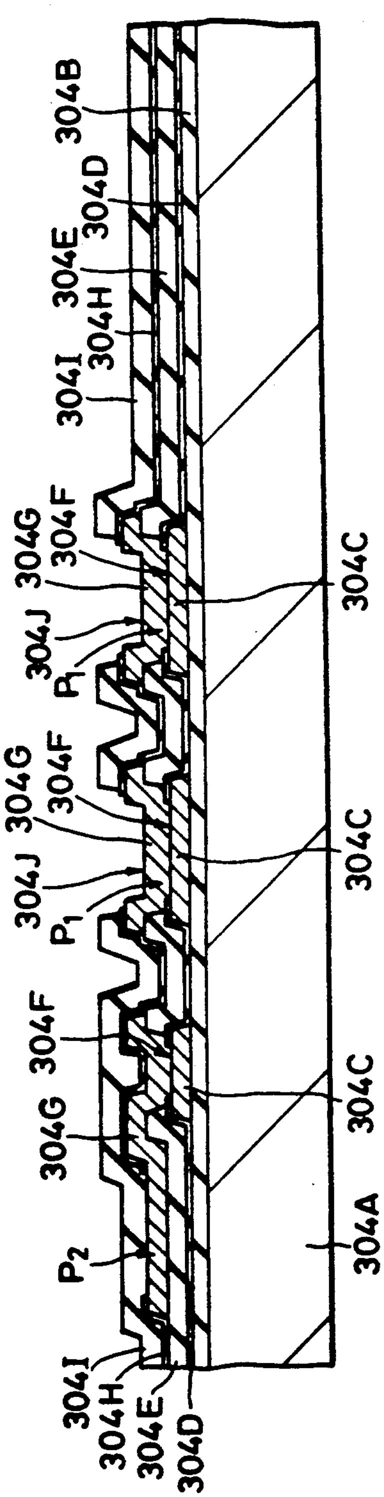

Next, a passivation film 304H is formed on the whole substrate surface including the surfaces of the interconnections 304G. The passivation film 304 is defined by a silicon nitride film with a thickness of about 0.4 to 0.6 [μm] which is formed by, for example, plasma CVD. Next, a passivation film 304I is formed on the whole substrate surface including the surfaces of the interconnections 304 and the surface of the passivation film 304HG. The passivation film 304I is defined by a silicon oxide film with a thickness of about 3.4 to 3.6 [μm] which is deposited by, for example, sputtering. Thereafter, as shown in FIG. 3I, those portions of the passivation film 304I which extend over the internal terminal forming regions of the interconnections 304G are removed to form openings 304J. The openings 304J are formed by subjecting the passivation film 304I to an isotropic wet etching. Then, the passivation film 304H is provided with openings by a dry etching.

Figure 3J:
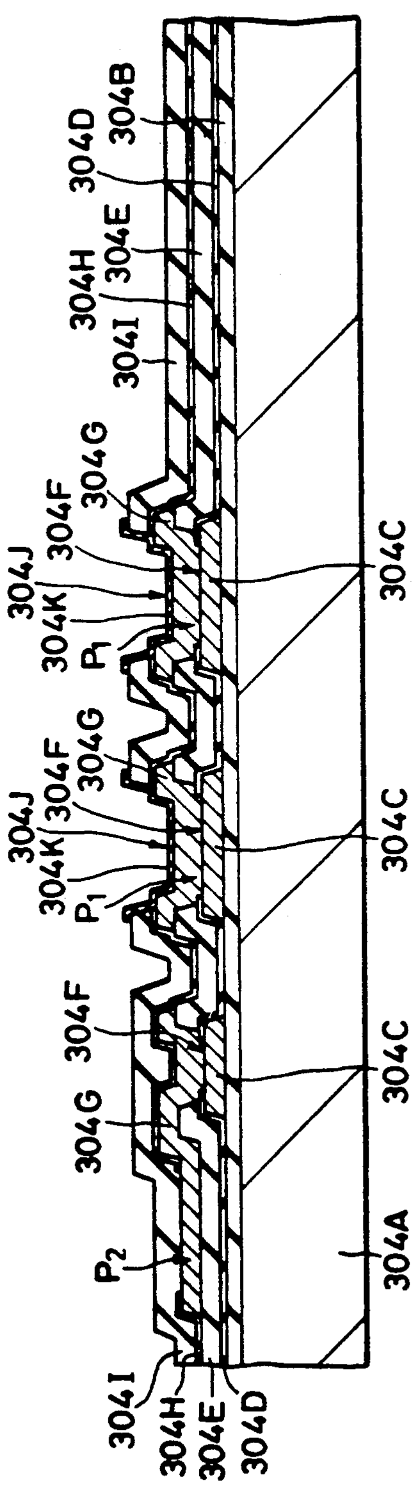

Next, as shown in FIG. 3J, a barrier metal layer 304K is formed on the internal terminal forming region of each interconnection 304G within the corresponding opening 304J. The barrier metal layer 304K is formed by successively depositing CR, Cu and Au films. The Cr film is formed by evaporation or sputtering with a thickness of about 1200 to 1500 [Å]. The Cu film is formed by evaporation or sputtering with a thickness of about 5000 to 7000 [Å]. The Au film is formed by evaporation or sputtering with a thickness of about 700 to 1100 [Å]. The barrier metal layers 304K are formed by patterning the stack of Cr, Cu and Au films by means of a combination of an isotropic wet etching and an anisotropic dry etching by way of example.

Figure 3K:
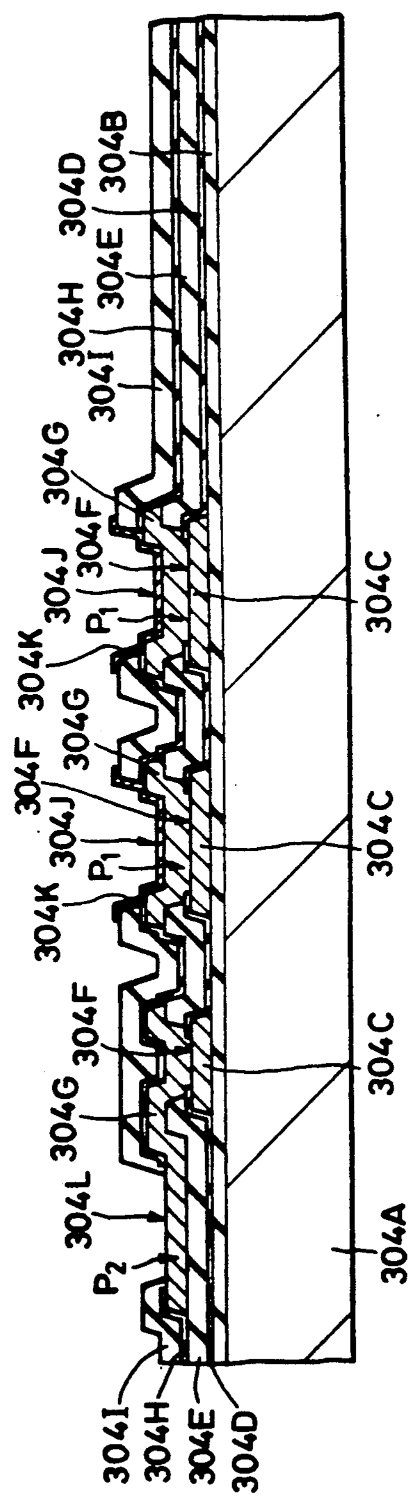

Next, as shown in FIG. 3K, those portions of the passivation film 304I which extend over the external terminal forming regions of the interconnections 304G are removed to form openings 304L. The openings 304L have substantially the same structure as that of the openings 304J. More specifically, the openings 304L are formed by subjecting the passivation film 304I to an isotropic wet etching.

Next, the reverse surface of the silicon substrate 304A is subjected to back-grinding, and a barrier metal layer (not shown) is formed on the reverse surface of the substrate 304A thus processed. This barrier metal layer has substantially the same structure as that of the barrier metal layers 304K. Thereafter, Au is evaporated on the surface of the barrier metal layer provided on the reverse surface of the silicon substrate 304A. This Au layer constitutes a part of the bonding metal layer 309 which is used to secure the mother chip 304 to the base board 305.

Figure 3L:
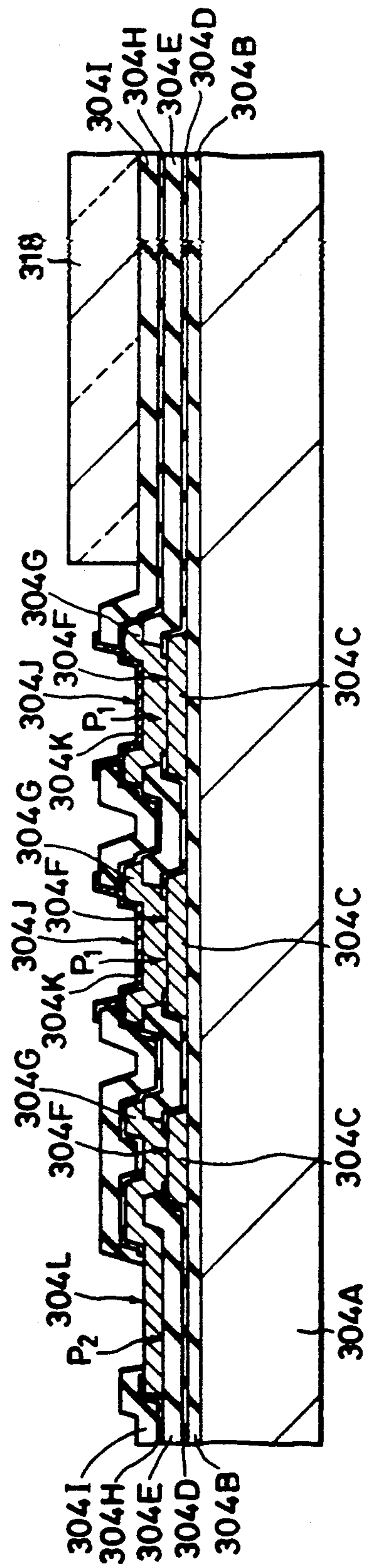

Next, the lift-off process for forming projecting electrodes 308 is carried out. More specifically, as shown in FIG. 3L, a first resist film 318 is first formed on those regions of the passivation film 304I where no projecting electrodes (conductive films) 308 are to be formed. In order words, at the region of the mother chip 304 where the semiconductor chip (logic LSI) 302 is mounted, projecting electrodes 308 are formed in the region for forming the logic circuit section Logic and the region for forming the peripheral circuits, and therefore these regions are not covered with the first resist film 318, and it is formed on that region of the passivation film 304I which is defined between these two regions. At that region of the mother chip 304 where each semiconductor chip (memory LSI) 303 is mounted, projecting electrodes 308 are formed in the peripheral circuit forming region, and therefore, this region is not covered with the first resist film 318, and it is formed on the passivation film 304I within the memory array forming region. Since no projecting electrodes 308 are formed in those regions of the mother chip 304 where no semiconductor chips 302, 303 are mounted, the first resist film 318 is formed on the passivation film 304 within all those regions.

The first resist film 318 is defined by a photoresist film, e.g., a polymethyl methacrylate (monomer) film, with a thickness of about 1.0 to 6.0 [μm]. The first resist film 318 is first coated on the whole substrate surface and then baked at a temperature of about 120 [° C.], and thereafter predetermined portions are exposed to light and then developed, thereby leaving the resist film 318 only within the regions where no projecting electrodes 308 are to be formed.

Figure 3M:
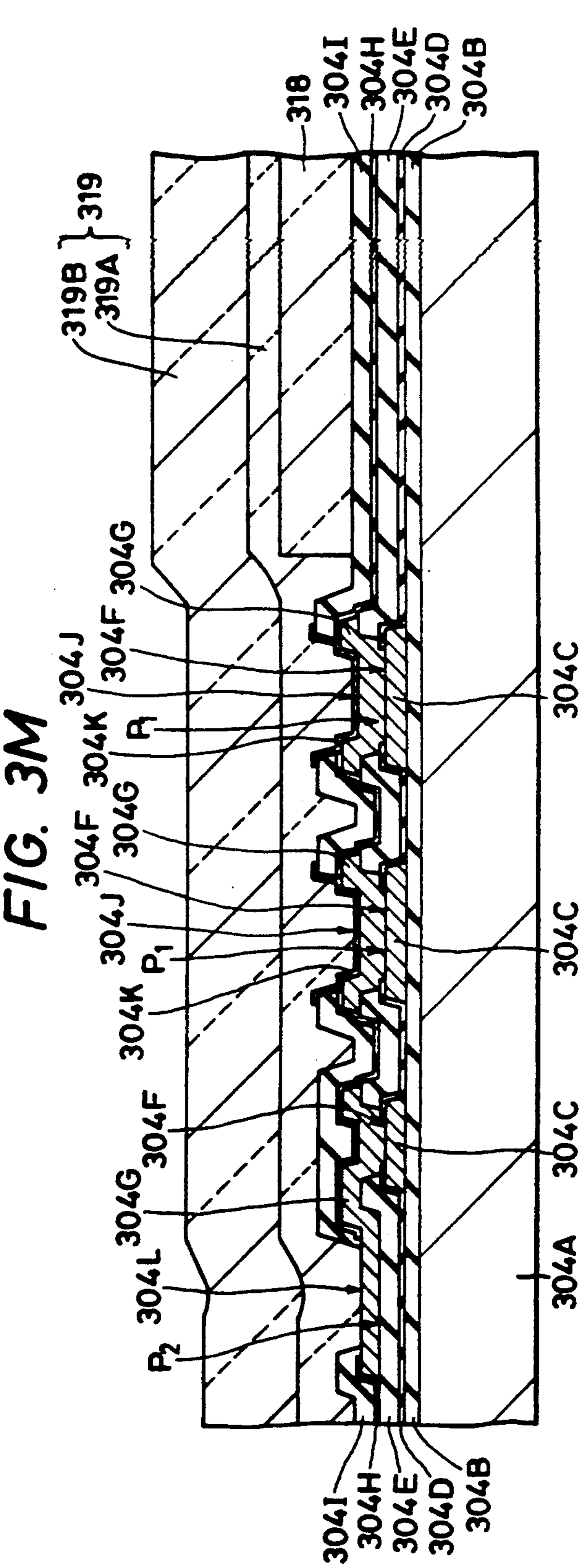

Next, as shown in FIG. 3M, a second resist film 319 is formed on the whole substrate surface including the surface of the passivation film 304I where projecting electrodes 308 are to be formed and the surface of the first resist film 318 where no projecting electrodes 308 are to be formed. The second resist film 319 has two-layer structure formed by stacking a resist film 319B on the surface of a ground resist film 319A.

The ground resist film 319A is formed such that the resist film 319B is brought into close contact with the ground despite the step configurations due to the presence of the interconnections 304C, 304G, the contact holes 304, the openings 304J and the edge of the first resist film 318. In other words, the ground resist film 319A is formed such as to prevent the resist film 319B from separating from the ground. The ground resist film 319A is defined by a photoresist film, e.g., a polymethyl methacrylate film, in the same way as in the case of the first resist film 318, the ground resist film 319A having a thickness of about 3.4 to 3.63 [μm]. The ground resist film 319A may be formed in such a manner that, after it has been coated on the whole substrate surface, the film 319A is baked at a temperature of about 120 [° ].

The resist film 319B is formed with a relatively large thickness in order to obtain a height required for projecting electrodes 308. The resist film 319B is defined by a photoresist film, e.g., a polymethyl methacrylate film, in the same way as in the case of the first resist film 318 and the ground resist film 319A, the resist film 319B having a thickness of about 30 to 40 [μm]. A cover film (not shown) which has a thickness of about 20 [μm] is provided on the surface of the resist film 319B so as to serve as a protective film for protecting the exposed film 319B until the development is started. The resist film 319B is laminated on the surface of the ground resist film 319A by the thermocompression bonding.

Figure 3N:
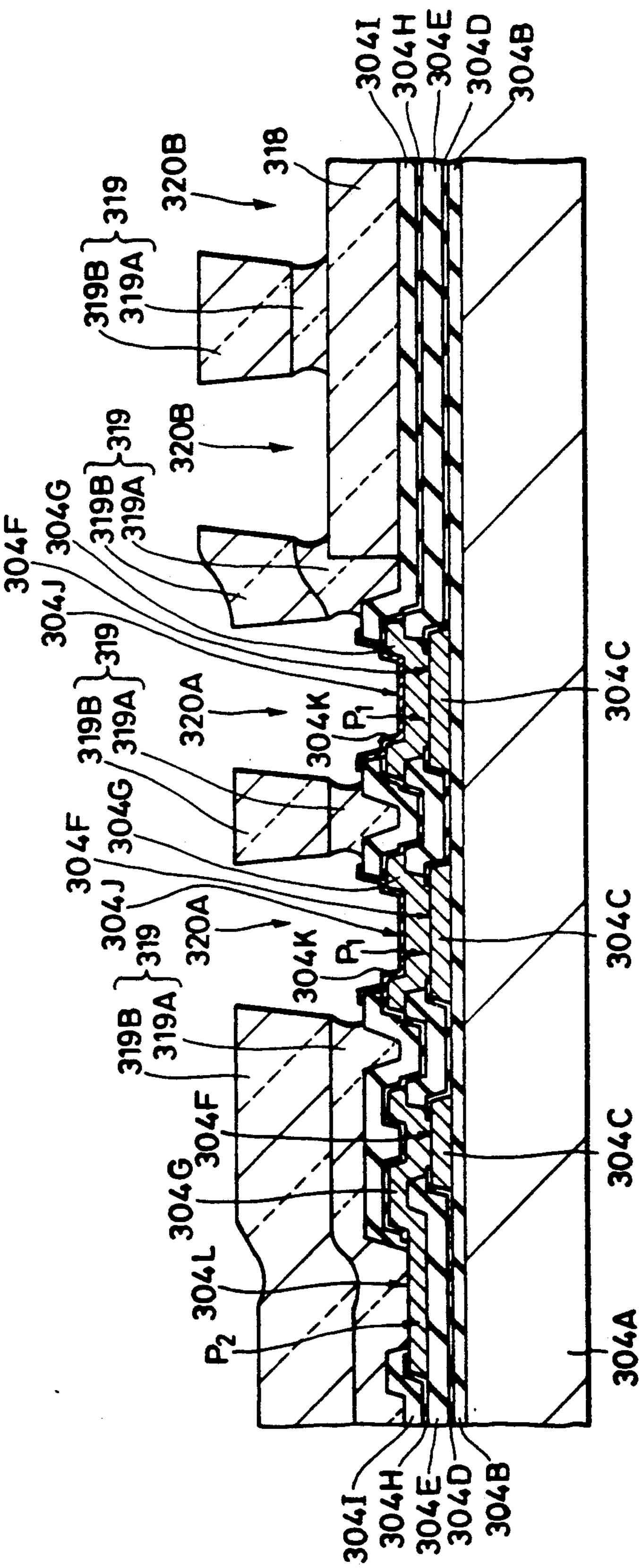

Next, as shown in FIG. 3N, first openings 320A are provided in those portions of the second resist film 319 where projecting electrodes 308 are to be formed (i.e., above the internal terminals $P_1$) and, at the same time, second openings 320B for forming dummy projecting electrodes 308A are provided in the regions of the second resist film 319 where no projecting electrodes 308 are formed (i.e., above the first resist film 318). The first and second openings 320A and 320B may be formed by exposing and then developing the second resist film 319. The first openings 320A are formed at spacings of, for example, about 200 to 300 [μm]. The first openings 320A for forming projecting electrodes 308 are provided at a high density in order to achieve a multi-terminal device structure. On the other hand, the second openings 320B are provided at spacings which are equal to or larger than those of the first openings 320A. The second openings 320B need not be formed at a high density as compared with the first openings 320A; it is preferable to provide the second openings 320B at a somewhat larger spacings than those of the first openings 320A with a view to increasing the production yield. However, in order to enable the first and second resist films 318 and 319 to separate reliably so that no separation failure occurs, it is necessary to provide at least one first or second openings 320A or 320B per area which is about 1 by 1 mm square.

Figure 30:
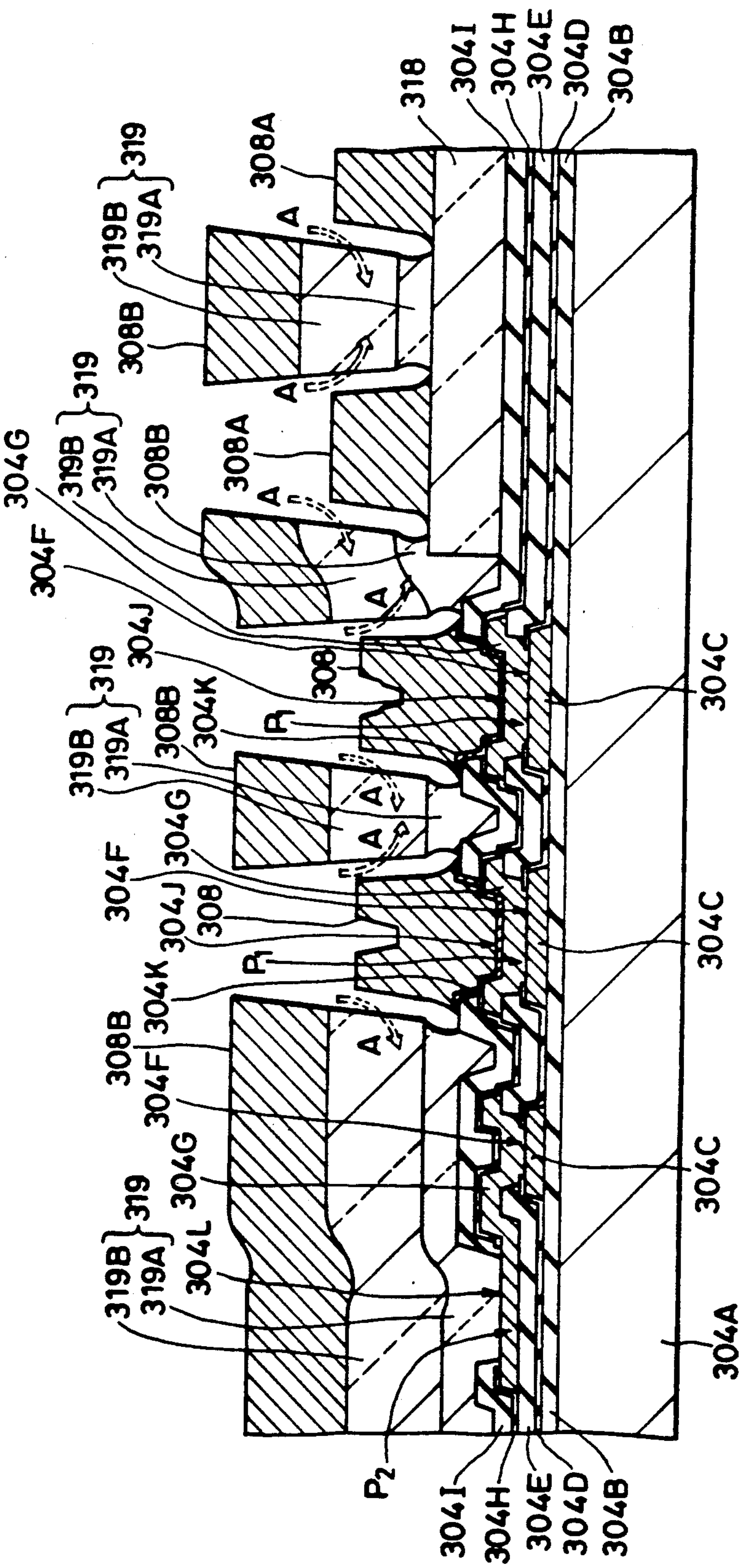

Next, as shown in FIG. 30, a metal film (conductive film) 308B is formed on the whole substrate surface including the surface of the second resist film 319. As the metal film 308B, solder which is deposited by evaporation is used. The solder used in the present invention is an alloy of 95 [wt %] of Pb and 5 [wt %] of Sn by way of example. The metal film 308B has a thickness of, for example, 15 to 100 [μm] (corresponding to the height of projecting electrodes 308). By forming the metal film 308B on the whole substrate surface, it is possible to form projecting electrodes 308 on the barrier metal layers 304K provided on the interconnections 304G constituting internal terminals $P_1$ within the first openings 320A formed in the second resist film 319. The projecting electrodes 308 are formed as shown by the mark o (some projecting electrodes 308 being represented simply by the mark •) in FIG. 3P. It is also possible to form dummy projecting electrodes 308A on the first resist film 318 within the second openings 320B formed in the second resist film 319 (i.e., in the regions where no projecting electrodes 308 are to be formed). The dummy projecting electrodes 308A are formed as shown by the mark • (some dummy projecting electrodes 308A being represented simply by •) in FIG. 3P.

Next, the second and first resist films 319 and 318 are removed. The removal is carried out using a remover or stripping liquid, e.g., methylene chloride. If necessary, an ultrasonic treatment may be carried out at the time of the removal. Since the ground resist film 319A and resist film 319B of the second resist film 319 and the first resist film 318 are defined by photoresist films of the same kind, it is possible to remove all of them by one separating process. Since the first openings 320A are provided densely in the projecting electrode forming regions, the stripping liquid can satisfactorily permeate into the second resist film 319 as shown by the arrows A in FIG. 30. In the regions where no projecting electrodes 308 are formed, the second openings 320B for forming dummy projecting electrodes 308A are provided at a density which is equal or close to that of the first openings 320A and therefore the stripping liquid can satisfactorily permeate into the second and first resist films 319 and 318 as shown by the arrows A in FIG. 30.

The removal of the second and first resist films 319 and 318 enables the dummy projecting electrodes 308A on the first resist film 318 and the metal film 308B on the second resist film 319 to be removed with the projecting electrodes 308 left on the interconnections 304G defining internal terminals $P_1$ through the respective barrier metal layers 304K.

After the formation of the projecting electrodes 308, these electrodes 308 are subjected to reflow process to complete the mother chip 304, as shown in FIG. 3E. The reflow process is carried out at a temperature of, about, 340 to 350 [° C.].

Thus, according to the present invention, there is provided a process for producing a semiconductor device 301 wherein projecting electrodes (conductive films) 308 are formed on the surface of a mother chip 304 by the lift-off technique, the process comprising the steps of: forming a first resist film 318 over regions of the surface of the other chip 304 where no projecting electrodes 308 are to be formed; forming a second resist film 319 on the whole surface of the mother chip 304 including the surface of the first resist film 318 and the surfaces of regions where projecting electrodes 308 are to be formed; forming the first openings 320A for forming projecting electrodes 308 in the projecting electrode forming regions of the second resist film 319, and also forming second openings 320B for forming dummy projecting electrodes (dummy conductive films) 308A in those regions of the second resist film 319 where no projecting electrodes 308 are to be formed; depositing a metal film 308B on the whole surface of the mother chip 304 including the portions of the surface of the mother chip 304 which are exposed through the first openings 320A, the portions of the surface of the first resist film 318 which are exposed through the second openings 320B and the surface of the second resist film 319; and removing the second and first resist films 319 and 318, thereby leaving projecting electrodes 308 within the first openings 320A, respectively, and removing the metal film 308B on the second resist film 319 and the dummy projecting electrodes 308 on the first resist film 318. Thus, according to the present invention, the second openings 320B for forming dummy projecting electrodes 308A are formed in those regions of the second resist film 319 where no projecting electrodes 308 are to be formed, and a remover, or a stripping liquid, is positively permeated into the second resist film 319 through the second openings 320B. Therefore, it is possible to separate effectively and efficiently the second resist film 319 in those regions where no projecting electrodes 308 are formed.

In addition to the above-described means, the first and second resist films 318 and 319 are formed of the same material, and after the deposition of the metal film 308B, the first and second resist films 318 and 319 are removed in the same separating step. Therefore, it is possible to remove the first resist film 318 in the step of removing the second resist film 319. Accordingly, it is unnecessary to carry out the step of exclusively removing the first resist film 318 and hence possible to reduce the number of steps in the semiconductor device manufacturing process correspondingly.

Since the second resist film 319 has a two-layer structure in which a resist film 319B is formed on a ground resist film 319A which has excellent fluidity, it is possible to ease the step configuration due to the formation of the first resist film 318 and therefore improve the adhesion between the resist film 319B and the ground. Accordingly, it is possible to prevent occurrence of such a separation failure that the resist film 319B undesirably separates before or after the evaporation of the metal film 308B or before the step of separating the second and first resist films 319 and 318. Thus, it is possible to increase the production yield.

The process for assembling the semiconductor device 301 will next be briefly explained with reference to FIGS 3Q to 3T (schematic sectional views of the semiconductor device in each step of the assembling process).

Figure 3P:
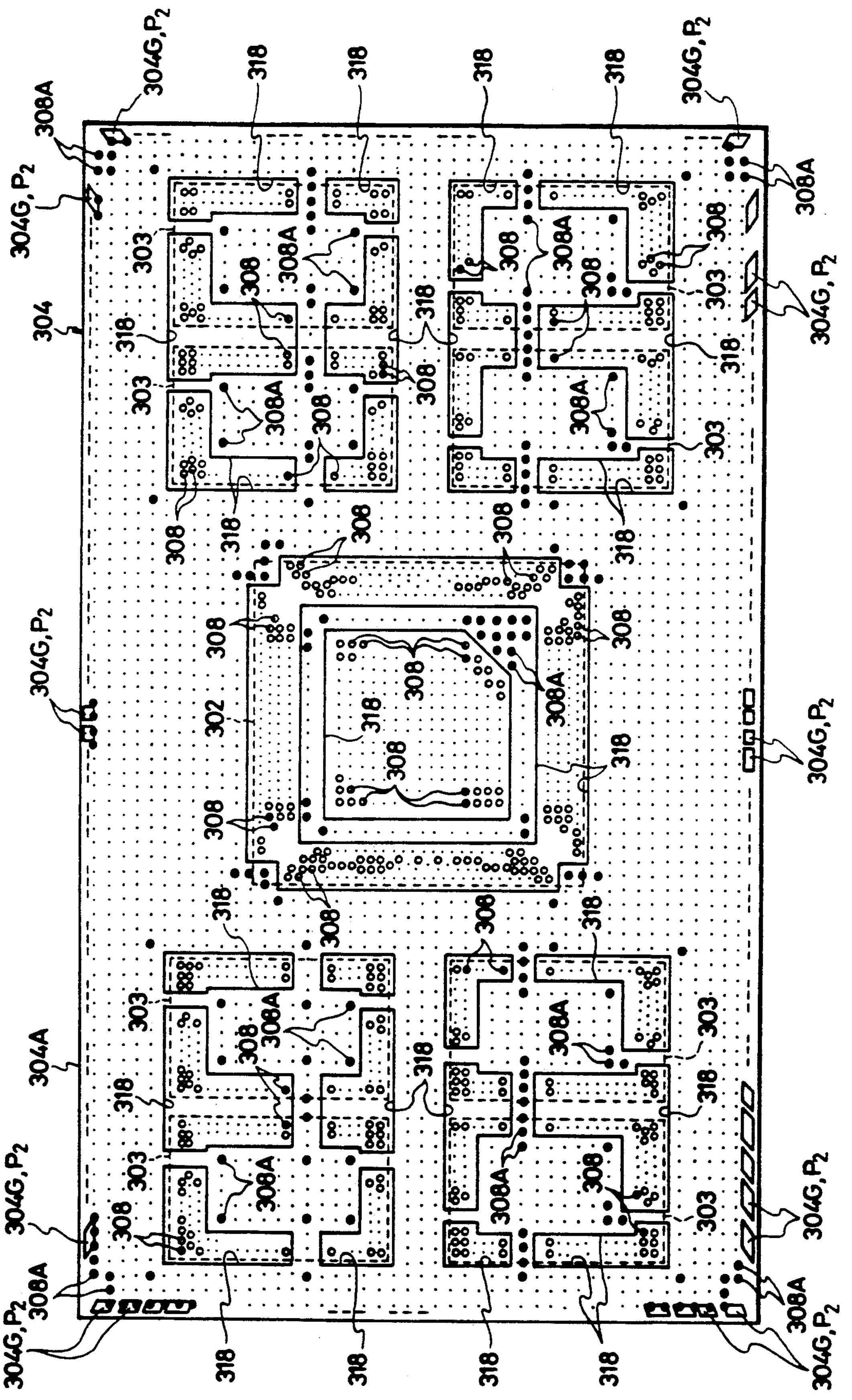
FIG. 3P is a plan view of the mother chip, which shows regions in which the projecting electrodes and dummy projecting electrodes are formed.
Figure 3Q:
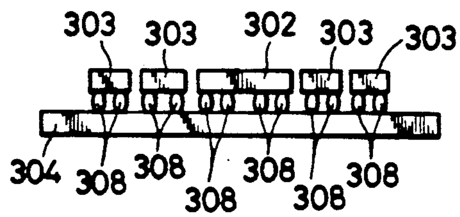
FIGS. 3Q to 3T are cross-sectional views respectively showing steps in the process of assembling the above-described semiconductor device.

First, as shown in FIG. 3Q, the semiconductor chips 302 and 303 are mounted on the mother chip 304 through the projecting electrodes 308. The projecting electrodes 308 are formed on the mother chip 304, as described above, and by subjecting the projecting electrodes 308 to reflow process, the semiconductor chips 302 and 303 and the mother chip 304 are rigidly connected to each other. The reflow process is carried out at a temperature of about 340 to 350 [° C.], as described above.

Next, the mother chip 304 is mounted on the base board 305. The base board 305 and the mother chip 304 are rigidly secured together by means of the bonding metal layer 309. The bonding metal layer 309 is made of an Au-Sn alloy, as described above.

Figure 3R:
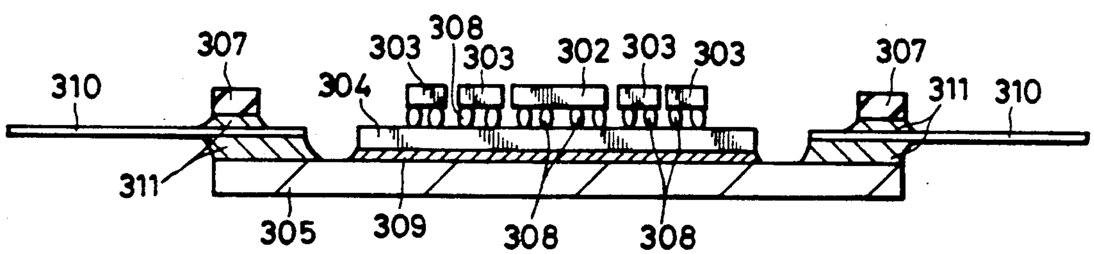

Next, as shown in FIG. 3R, the frame member 307 is secured to the peripheral portion of the base board 305. At the same time as the frame member 307 is secured, the leads 310 are secured between the base board 305 and the frame member 307. The securing of the frame member 307 and the leads 310 to the base board 35 is effected by means of a low-melting glass 311.

Next, the external terminals $P_2$ of the mother chip 304 and the inner lead portions of the corresponding leads 310 are connected together by means of bonding wires 312. The bonding is effected by the ultrasonic bonding method.

Figure 3S:
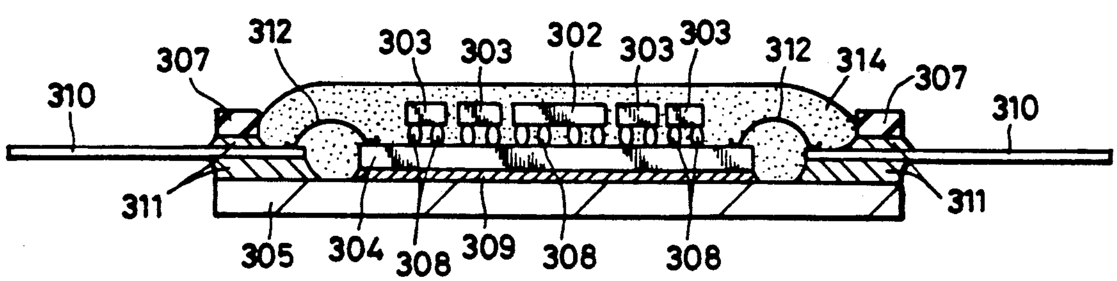

Next, as shown in FIG. 3S, the mother chip 304, semiconductor chips 302, 303 and bonding wires 312 which are within the region defined by the frame member 307 are hermetically sealed with a sealing material 314. As the sealing material 314, silicone gel is used. Silicone gel is applied by the potting method and then set by baking.

Next, the sealing cap 306 is secured to the frame member 307 through an adhesive 313. The operation of securing the sealing cap 306 is conducted with the cavity defined by the base board 305, the frame member 307 and the sealing cap 306 being held under a vacuum.

Next, a solder layer is formed on the surface of the outer lead portion of each lead 310. The formation of the solder layer is effected by dipping the assembly into a solder tank.

Figure 3T:
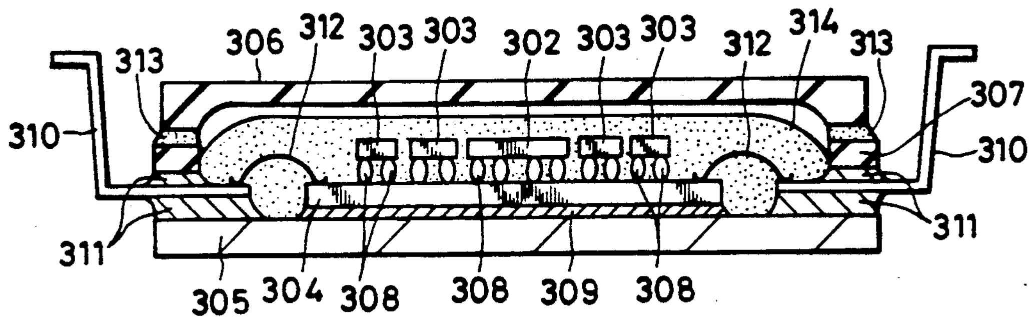

Next, as shown in FIG. 3T, the outer lead portions of the leads 310 are cut off from the support portions of the lead frame and then shaped into a predetermined configuration.

Next, the heat-dissipating fin 316 is secured to the reverse surface of the base board 305 through an adhesive 315. Thus, the semiconductor device 301 is completed.

Next, the semiconductor device 301 is mounted on the wiring board 17, as shown in FIG. 3A.

The semiconductor device according to the present invention is produced by the above-described chip manufacturing process and electrode forming process and is mounted on the above-described mother chip, Although in the foregoing embodiment a logic LSI and memory LSI's used thereby are mounted on a mutual mother chip, this arrangement may be disadvantageous in a field of application where information is exchanged at high speed.

Accordingly, in the following embodiment, the logic circuit is divided into a plurality of sections and each logic circuit section is incorporated into a memory LSI with which it exchanges data particularly frequently. The hybrid semiconductor chips thus prepared are mounted on a mother chip similar to the above and packaged in the same way as in the above-described embodiment.

In this embodiment, the present invention is applied to a hybrid semiconductor chip (Bi-CMOS) which comprises bipolar transistors and complementary MISFET's (CMOS) and which has a memory function.

Figure 3U:
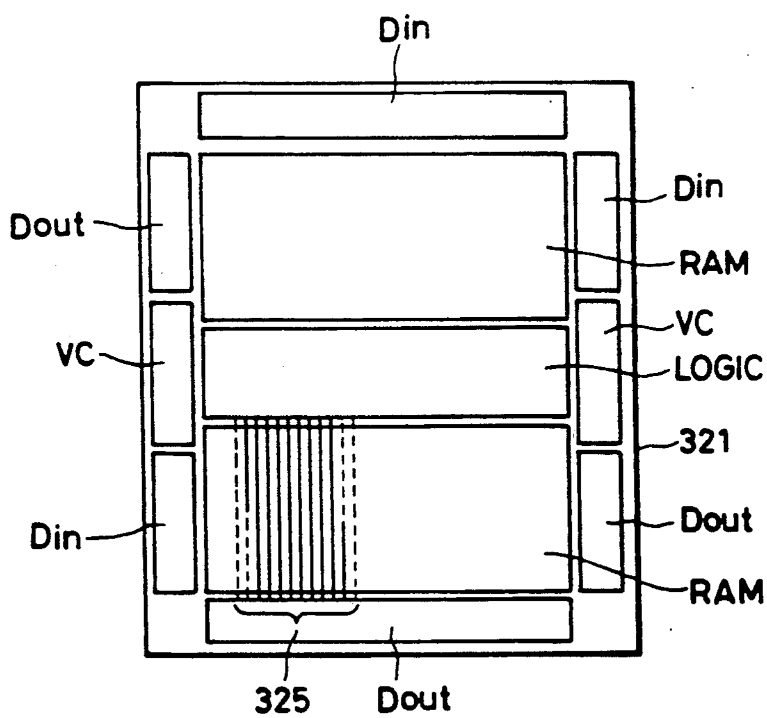
FIG. 3U shows the layout on the semiconductor chip of a semiconductor device according to the embodiment 3 of the present invention produced by a wafer process which is different from the above-described process.

FIG. 3U shows the arrangement (layout) of the semiconductor chip of a semiconductor device according to the embodiment 3 of the present invention.

As shown in FIG. 3U, a hybrid semiconductor chip 321 has a logic circuit section Logic disposed in the central portion and memory circuit sections RAM disposed at the upper and lower sides (as viewed in FIG. 3U), respectively, of the logic circuit section Logic. In each of the right and left peripheral portions of the semiconductor chip 321 are disposed on input circuit Din, an output circuit Dout and a power supply circuit VC.

Figure 3V:
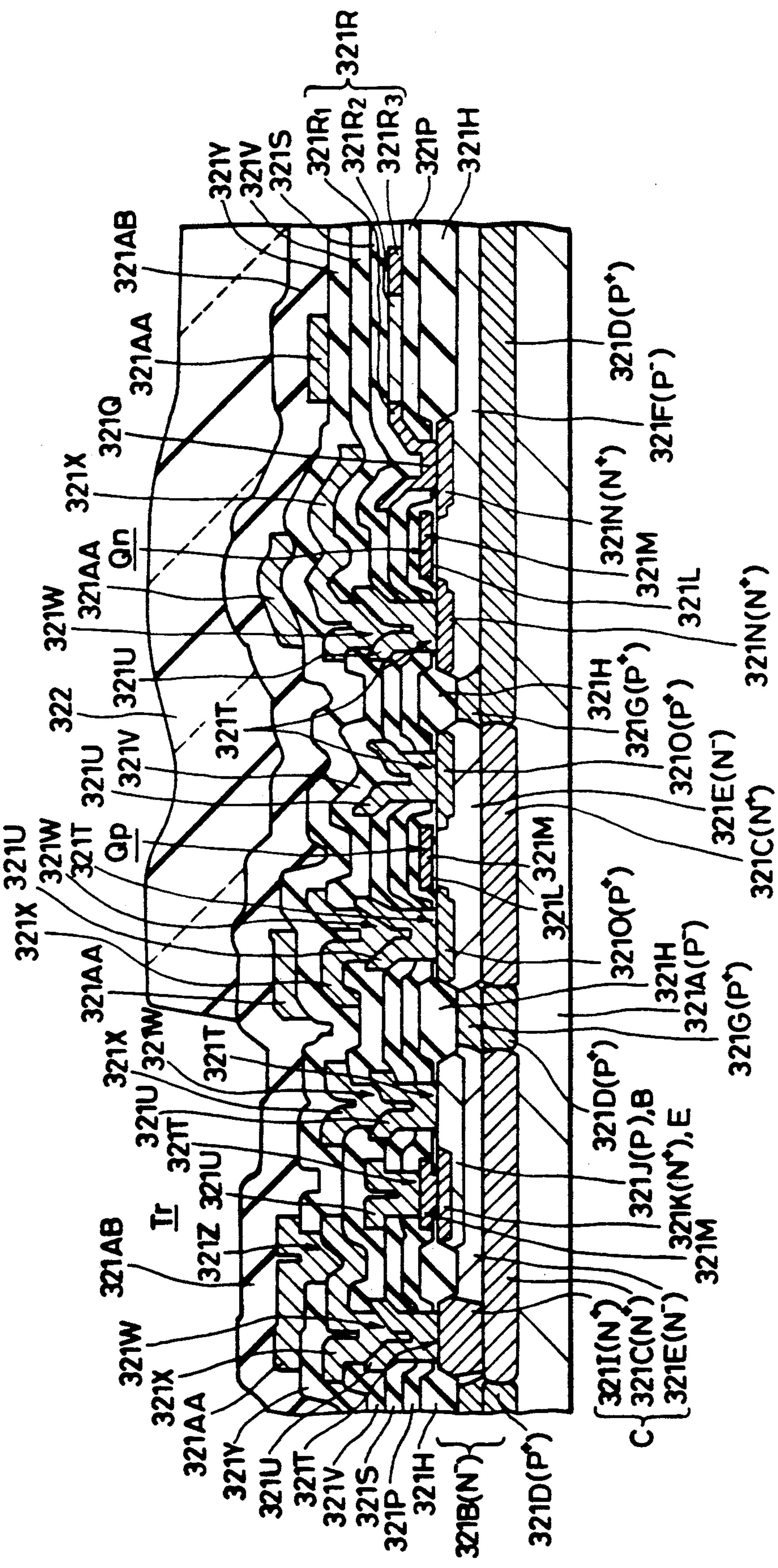
FIG. 3V is a cross-sectional view showing the structure of each of the semiconductor elements constituting the semiconductor chip shown in FIG. 3V.

The logic circuit section Logic of the semiconductor chip 321 comprises semiconductor elements, mainly complementary MISFET's. Each memory circuit section RAM is defined by an SRAM which comprises semiconductor elements, mainly MISFET's. Each peripheral circuit comprises semiconductor elements, mainly bipolar transistors. The peripheral circuits may be arranged such that the output cirucits Dout which particularly need driving power are formed using bipolar transistors, while the input circuits Din are formed using complementary MISFET's. FIG. 3V (cross-sectional view) shows specific structures of the semiconductor elements constituting the semiconductor chip 321. A bipolar transistor, p-channel MISFET and n-channel MISFET are respectively shown in the left-hand side, center and right-hand side of FIG. 3V.

As shown in FIG. 3V, the semiconductor chip 321 has an $n^-$-type epitaxial layer 321B grown on the principal surface of a $p^-$-type semiconductor substrate 321A made of single crystal silicon.

The bipolar transistor Tr is electrically isolated from the surrounding regions by an isolation region which is defined by the semiconductor substrate 321A, a $p^+$-type buried semiconductor region 321D, a $p^+$-type semiconductor region 321G and an element isolation insulating film 321H. The semiconductor region 321D is formed between the semiconductor substrate 321A and the epitaxial layer 321B. The bipolar transistor Tr is an npn transistor comprising an n-type collector region, a p-type base region and an n-type emitter region.

The collector region C includes an $n^+$-type buried semiconductor region 321C, an $n^-$-type well region 321E and an $n^+$-type semiconductor region 321I for pulling up potential. A first-level interconnection 321U is connected to the semiconductor region 321I of the collector region C through a contact hole 321T provided in a stack of interlayer insulating films 321P and 321S. The interconnection 321U is formed from an aluminum film having Cu or Si added thereto.

The base region B is defined by a p-type semiconductor region 321J provided in the principal surface region of the well region 321E. An interconnection 321U is connected to the semiconductor region 321J defining the base region B.

The emitter region E is defined by an $n^+$-type semiconductor region 321K provided in the principal surface region of the semiconductor region 321J constituting the base region B. An emitter electrode 321M is connected to the semiconductor region 321K defining the emitter region E. The emitter electrode 321M is formed from a first-level polycrystalline silicon film having an n-type impurity introduced thereinto. The semiconductor region 321K is formed by diffusion into the semiconductor region 321J of the n-type impurity introduced into the emitter electrode 321M. An interconnection 321U is connected to the emitter electrode 321M.

The p-channel MISFET Qp constituting one of a pair of complementary MISFET's is formed on the principal surface of a well region 321E within a region surrounded by the element isolation insulating film 321H. The MISFET Qp comprises the well region 321E, a gate insulating film 321L, a gate electrode 321M and a pair of $p^+$-type semiconductor regions 321O defining source and drain regions.

The gate insulating film 321L is defined by a silicon oxide film formed by oxidizing the principal surface of the well region 321E.

The gate electrode 321M is defined by a polycrystalline silicon film having an n-type impurity introduced thereinto.

The semiconductor regions 321O are formed by ion implantation of a p-type impurity (e.g., B). The portion of each semiconductor region 321O on the side thereof which is closer to the channel forming region is lightly doped. Thus, the MISFET Qp is formed with an LDD (Lightly-Doped Drain) structure. Interconnections 321U are connected to the semiconductor regions 321O, respectively.

The n-channel MISFET Qn constituting the other of a pair of complementary MISFET's is formed on the principal surface of a $p^-$-type well region 321F within a region surrounded by the element isolation insulating film 321H. The MISFET Qn comprises the well region 321F, a gate insulating film 321L, a gate electrode 321M and a pair of $n^+$-type semiconductor regions 321N constituting source and drain regions. The MISFET Qn is formed with an LDD structure in the same way as in the case of the MISFET Qp.

An interconnection 321U is connected to one semiconductor region 321N of the MISFET Qn. To the other semiconductor region 321N are successively connected an interconnection $321R_1$, a high-resistance load element $321R_2$ and an interconnection $321R_3$ through a contact hole 321Q which is provided in an interlayer insulating film 321P. The interconnections $321R_1$ and $321R_3$ are formed by introducing an n-type impurity into a second-level polycrystalline silicon film. In the memory circuit sections RAM, the interconnection $321R_3$ is used as a power supply interconnection for supplying a power supply voltage (e.g., the circuit operating voltage, i.e., 5 [V]) Vcc. The high-resistance load element $321R_2$ is formed by introducing no impurity into the polycrystalline silicon film or slightly introducing an n- or p-type impurity thereinto.

A second-level interconnection layer 321X is provided on the interconnection layer 321U through pan interlayer insulating film 321V. The interconnection layer 321X is connected to the interconnection layer 321U through contact holes 321W which are provided in the interlayer insulating film 321V. A third-lever interconnection layer 321AA is provided on the interconnection layer 321X through an interlayer insulating film 321Y. The interconnection layer 321AA is connected to the interconnection layer 321X through contact holes 321Z which are provided in the interlayer insulating film 321Y. The second- and third-level interconnection layers 321X and 321AA are made of the same material as that of the first-level interconnection layer 321U by way of example. Thus, the semiconductor chip 321 is formed with a three-layer interconnection structure.

A passivation film 321B is provided on the third-level interconnection layer 321AA. The passivation film 321AB is defined by a silicon nitride film which is deposited by, for example, sputtering.

An α-particle shielding film 322 is provided on the passivation film 321AB in the regions of the semiconductor chip 321 for forming the memory circuit sections RAM or/and the regions thereof for forming the circuits comprising complementary MISFET's (e.g., the logic circuit section Logic or the input circuits Din). The α-particle shielding film 322 is arranged to shield mainly α-particles emanating from radioactive elements (U, Th, etc.) contained in the projecting electrodes 308 (not shown in FIG. 3V) in a trace amount. The α-particle shielding film 322 is made of a polyimide resin, e.g., a polyimideisoindoloquinazolinedione. The α-particle shielding film 322 has a thickness of about 10 to 30 [μm].

Figure 3W:
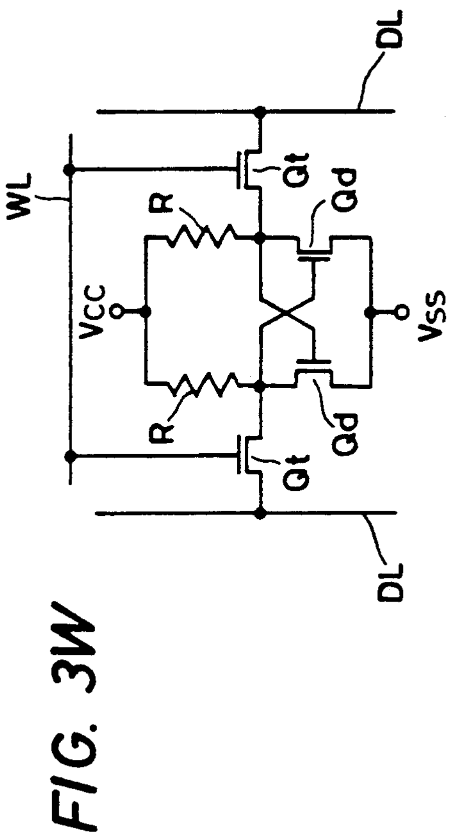
FIG. 3W is an equivalent circuit diagram of a memory cell of an SRAM incorporated in the semiconductor chip shown in FIG. 3U.

Each memory circuit section RAM of the semiconductor chip 321 is defined by an SRAM, as described above, and each memory cell of the SRAM is arranged as shown in FIG. 3W (an equivalent circuit diagram of the memory cell).

As will be clear from FIG. 3W, each memory cell of the SRAM is disposed at the intersection of a pair of complementary data lines DL, $\overline{DL}$ extending in the row direction and a word line WL extending in the column direction. The memory cell is a high-resistance load type cell.

The memory cell comprises a flip-flop circuit used as an information storing section and two transfer MISFET's Qt each having one semiconductor region thereof connected to one or the other of a pair of input- /output terminals of the flip-flop circuit. The other semiconductor regions of the transfer MISFET's Qt are connected to the respective complementary data line Dl, $\overline{DL}$. The gate electrodes of the transfer MISFET's are connected to the word line WL. Each transfer MISFET Qt is defined by the n-channel MISFET Qn shown in FIG. 3V.

The above-described flip-flop circuit comprises two high-resistance load elements R and two driving MISFET's Qd. Each high-resistance load element R is defined by the high-resistance load element $321R_2$ (polycrystalline silicon film) shown in FIG. 3V. Each driving MISFET Qd is defined by the n-channel MISFET Qn shown in FIG. 3V. A power supply voltage Vcc is applied to one end of each high-resistance load element R (i.e., the interconnection $321R_3$ is connected thereto). A reference voltage (e.g., the circuit reference potential. i.e., 0 [V]) Vss is applied to the semiconductor region 321N which is used as the source region of each driving MISFET Qd.

Figure 3X:
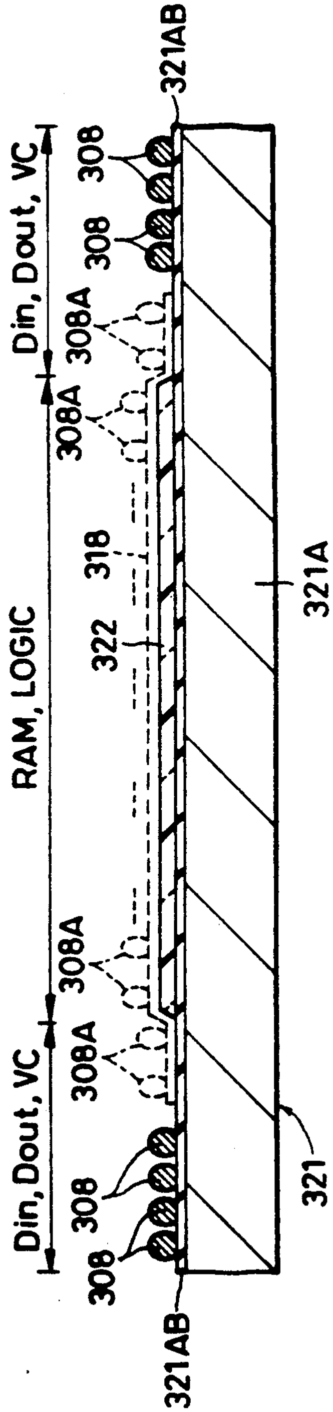
FIG. 3X is a schematic sectional view of the semiconductor chip shown in FIG. 3U.

The hybrid semiconductor chip 321 arranged as described above has projecting electrodes 308 provided on the external terminals BP, as shown in FIG. 3X (a schematic sectional view of the chip 321). In other words, the projecting electrodes 308 are disposed in the regions which extend above the peripheral circuits comprising bipolar transistors Tr. In this embodiment, the projecting electrodes 308 are not formed on the chip carrier for mounting the semiconductor chip 321 but on the external terminals BP of the semiconductor chip 321.

When α-particles emanating from the projecting electrodes 308 enter the semiconductor substrate 321A, minority carriers are generated, and these minority carriers may cause a change in the potential of the information charge storing section (node) if a memory cell in the SRAM, thus inducing a soft error. Therefore, no projecting electrodes 308 are provided on at least the memory circuit sections RAM. The minority carriers are readily trapped at the interface between the gate insulating film 321L and the well region 321E or 321F of each of the MISFET's Qn and Qp and the trapped minority carriers cause a fluctuation in the threshold voltage. Therefore, no projecting electrodes 308 are provide on the circuits comprising complementary MISFET's as principal elements. In other words, no projecting electrodes 308 are provided on the memory circuit sections RAM, the logic circuit section Logic comprising complementary MISFET's and those of the peripheral circuits which comprise complementary MISFET's. In the regions where no projecting electrodes 308 are formed, the above-described α-particle shielding film 322 is provided on the passivation film 321AB. Since bipolar transistors Tr are resistant to soft errors due to α-particles as compared with MISFET's Qn and Qp, no α-particle shielding film 322 is provided on the regions for forming peripheral circuits comprising bipolar transistors Tr.

The above-described α-particle shielding film 322 is provided on the regions except for those which are provided with projecting electrodes 308. Since the α-particle shielding film 322 has a different thermal expansion coefficient from that of the semiconductor substrate 321A of the semiconductor chip 321, if the α-particle shielding film 322 is on contact with a projecting electrode 308, this projecting electrode 308 may be damaged or destroyed by a thermal stress resulting from the operation of the semiconductor chip 321. For this reason, the α-particle shielding film 322 is kept out of contact with the projecting electrodes 308.

The projecting electrodes 308 are formed byg substantially the same lift-off method as in the case of those shown, for example, in FIG. 3C. Since the α-particle shielding film 322 is provided on the passivation film 321AB, a first resist film 318 according to the lift-off method is formed over the α-particles shielding film 322 as shown by the chain line in FIG. 3X. The first resist film 318 is formed on the regions where no projecting electrodes 308 are to be formed, that is, the regions for forming the memory circuit sections RAM, the region for forming logic circuit section Logic and the regions for forming the peripheral circuits comprising complementary MISFET's. A seocnd resist film 319 (not shown) is formed on the regions where projecting electrodes 308 are to be formed and on the first resist film 318. First openings 320A are formed in regions of the second resist film 319 where projecting electrodes 308 are to be formed, respectively, while second openings 320B are formed in the second resist film 319 extending over the first resist film 318. Projecting electrodes 308 are formed in the first openings 320A, respectively, while dummy projecting electrodes 308A are formed in the second openings 320B, respectively. The projecting electrodes 308 in the first opening 320A are left, while the second and first resist films 319, 318 and the dummy projecting electrodes 308A in the second openings 320B are removed, and the semiconductor device according to this embodiment is thus completed.

The third-level Al interconnections 321AA shown in FIG. 3V define by-pass interconnections 325 (see FIG. 3U) for the logic circuit section Logic above the memory circuit sections RAM, the interconnections 321AA being laid out so as to intersect the data lines in the memory circuit sections RAM at right angles.

Thus, according to the present invention, there is provided a process for producing a semiconductor device wherein projecting electrodes 308 are formed on the surface of a bipolar transistor forming region of a hybrid semiconductor chip having bipolar transistors Tr and complementary MISFET's by the lift-off technique, the process comprising the steps of: forming an α-particle shielding film 322 on the surface of a complementary MISFET forming region of the semiconductor chip 321; forming a first resist film 318 on the α-particle shielding film 322; forming a second resist film on the whole surface of the semiconductor chip 321 including the surface of the first resist film and the surface of the bipolar transistor forming region; forming first openings 320A for forming projecting electrodes 308 in the bipolar transistor forming region of the second resist film 319, and also forming second openings 320B for forming dummy projecting electrodes 308A in the complementary MISFET forming region of the second resist film 319; depositing a metal film 308B for forming projecting electrodes 308 on the whole surface of the semiconductor chip 321 including the portions of the surface of the semiconductor chip 321 which are exposed through the first opening 320A, the portions of the surface of the first resist film 318 which are exposed through the second openings 320B and the surface of the second resist film 319; and removing the second and first resist films 319 and 318, thereby leaving the metal film 308B within the first openings 320A to define projecting electrodes 308 and removing the metal film 308B on the second resist film 319 and the metal film 308B (dummy projecting electrodes 308A) on the first resist film 318. Thus, according to the present invention, the second openings 320B for forming dummy projections electrodes 308A are formed in the complementary MISFET forming region, and a remover, or a stripping liquid, is positively permeated into the second resist film 319 through the second openings 320B. Therefore, it is possible to separate effectively and efficiently the second resist film 319 in the complementary MISFET forming region where no projecting electrodes 308 are formed.

The α-particle shielding film 322 that is formed over the complementary MISFET forming region of the semiconductor chip 321 enables shielding of α-particles emanating from the projecting electrodes 308 and hence permits suppression of a fluctuation in the threshold voltage of the complementary MISFET's. It is therefore possible to minimize the deterioration with time of characteristics of the complementary MISFET's.

Since the α-particle shielding film 322 and the projecting electrodes 308 are separated from each other, it is possible to prevent damage or destruction of the projecting electrodes 308 due to the thermal expansion coefficient difference between the α-particle shielding film 322 and the semiconductor chip 321 and therefore it is possible to improve the electrical reliability of the semiconductor device.

Since the α-particle shielding film 322 which is defined by a polymide resin material is not formed on the regions where the projecting electrodes 308 are formed, it is possible to form and process the projecting electrodes 308 independently of the inferior processing characteristics of the α-particle shielding film 322. Accordingly, it is possible to achieve an increase in the density of projecting electrodes 308.

The present invention also provides a process for producing a semiconductor device wherein projecting electrodes 308 are formed on the surface of a peripheral circuit forming region of a semiconductor chip 321 including a memory circuit section RAM and a peripheral circuit and having a memory function by the lift-off technique, the process comprising the steps of: forming an α-particle shielding film 322 on the surface of a memory circuit section forming region of the semiconductor chip 321; forming a first resist film 318 on the α-particle shielding film 322; forming a second resist film 319 on the whole surface of the semiconductor chip 321 including the surface of the first resist film 318 and the surface of the peripheral circuit forming region; forming first openings 320A for forming projecting electrodes 308 in the peripheral circuit forming region of the second resist film 319, and also forming second openings 320B for forming dummy projecting electrodes 308A in the memory circuit section forming region of the second resist film 319; depositing a metal film 308B for forming projecting electrodes 308 on the whole surface of the semiconductor chip 321 including the portions of the surface of the semiconductor chip 321 which are exposed through the first openings 320A, the portions of the surface of the first resist film 318 which are exposed through the second openings 320B and the surface of the second resist film 319; and removing the second and first resist films 319 and 318, thereby leaving the metal film 308B within the first opening 320A to define projecting electrodes 308 and removing the metal film 308B on the second resist film 319 and the metal film 308B (dummy projecting electrodes 308A) on the first resist film 318. Thus, according to the present invention, the second openings 320B for forming dummy projecting electrodes 308A are formed in the memory circuit section forming region, and a remover, or a stripping liquid, is positively permeated into the second resist film 319 through the second openings 320B. Therefore, it is possible to separate effectively and efficiently the second resist film 319 in the memory circuit section forming region where no projecting electrodes 308 are formed.

The α-particle shielding film 322 that is formed over the memory circuit section forming region of the semiconductor chip 321 enables shielding of α-particles emanating from the projecting electrodes 308 and hence permits suppression of a fluctuation in the threshold voltage of the complementary MISFET's. It is therefore possible to reduce soft errors due to α-particles.

(4) Embodiment 4

Figure 4A:
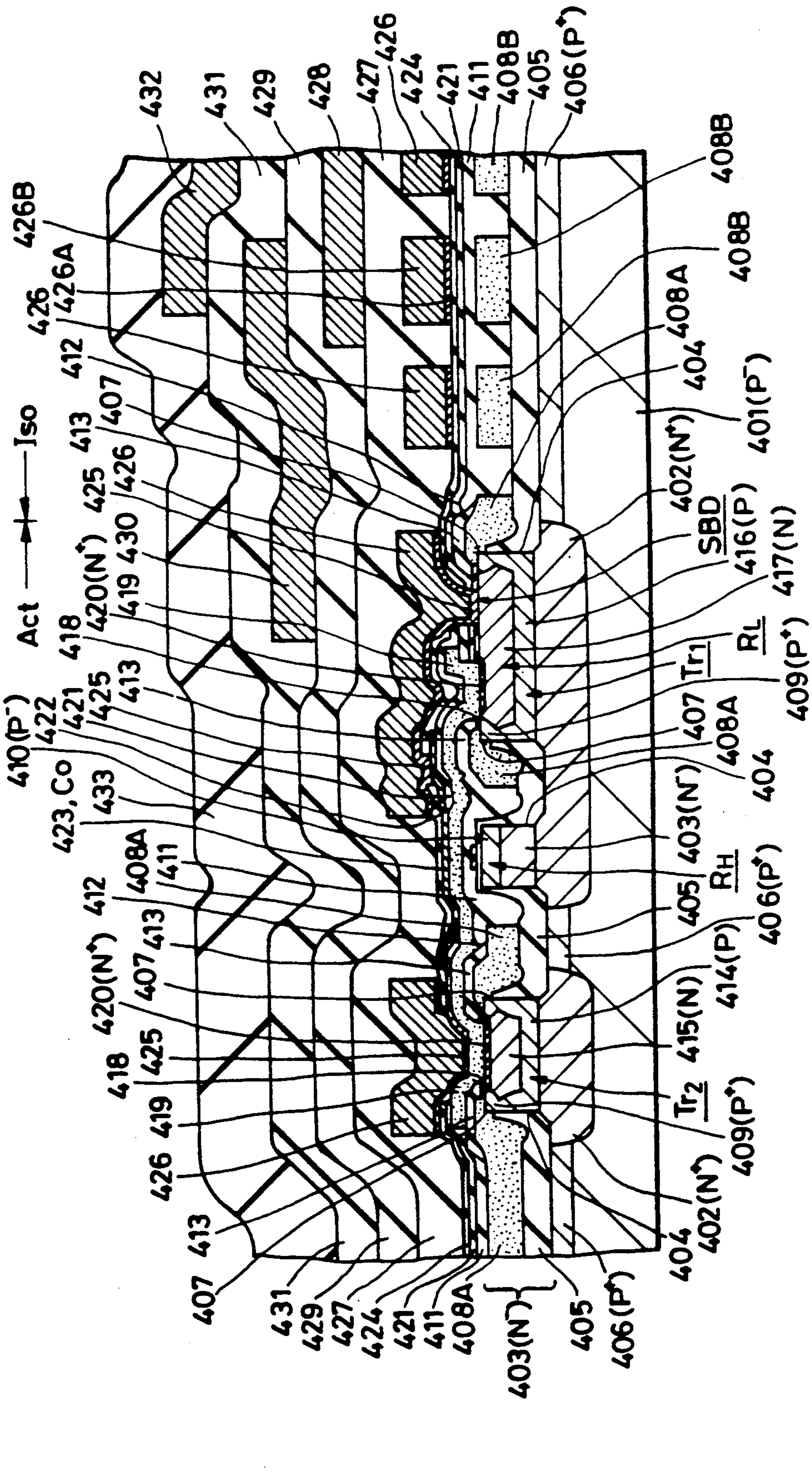
FIG. 4A is a cross-sectional view of a bipolar transistor having an SICOS structure according to the embodiment 4 of the present invention.
Figure 4B:
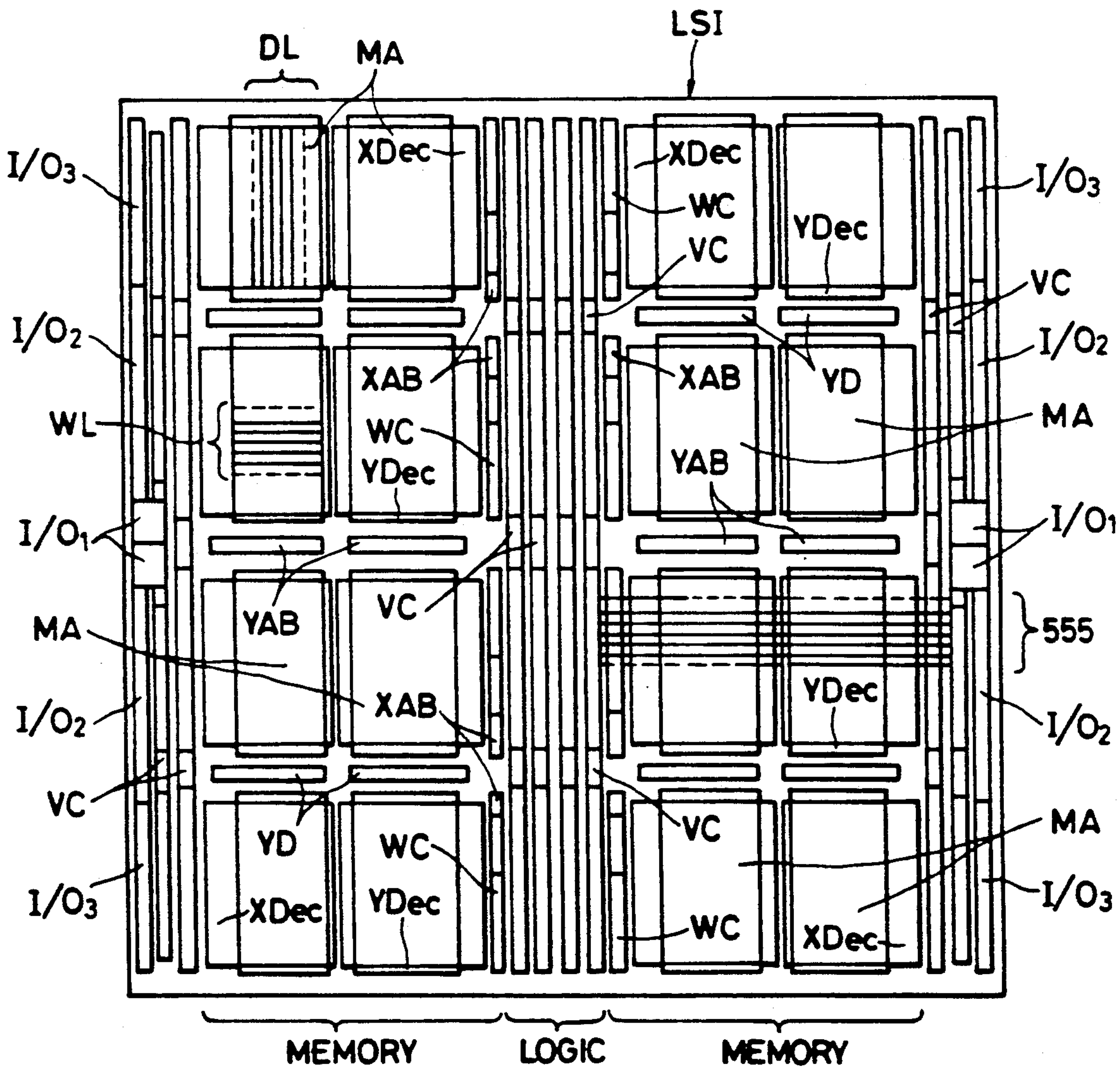
FIG. 4B shows the layout on the chip of a semiconductor integrated circuit device having the bipolar transistor shown in FIG. 4A.

FIG 4B (a chip layout chart) shows a semiconductor integrated circuit device according to a fourth embodiment of the present invention which includes bipolar transistors having the SICOS (Side Wall Base Contact Structure).

As shown in FIG. 4B, a semiconductor integrated circuit device LSI comprises a chip which is about 10 by 10 [mm] square. Input/output circuits $I/O_1$, $I/O_2$, $I/O_3$ and power supply circuits VC are disposed at each of the right and left peripheral portions of the semiconductor integrated circuit device LSI. A logic section Logic is disposed in the central portion of the semiconductor integrated circuit device LSI. Memory sections Memory are disposed at the right- and left-hand sides, respectively, of the logic section Logic.

Each of the memory section Memory comprises 8 memory cell arrays MA, that is, the right- and left-hand side memory sections Memory comprise a total of 16 memory cell arrays MA. An X-decoder circuit XDec, an X-address buffer circuit XAB and a write circuit WC are disposed at a peripheral portion of each memory cell array MA. Further, a Y-decoder circuit YDec, a Y-address buffer circuit YAB and a Y-driver circuit YD are disposed at other peripheral portions of each memory cell array MA.

Each memory cell array MA has, although not shown, memory cells which are disposed at the intersections, respectively, of digit lines and information hold lines on the one hand and word lines on the other. A memory cell which is under development by the present inventors comprises a flip-flop having a Schottky barrier diode (SBD), a forward bipolar transistor, a backward bipolar transistor, a high-resistance element and a low-resistance element. In other words, the memory cell is defined by a resistance changeover type memory cell with an SBD.

Figure 4C:
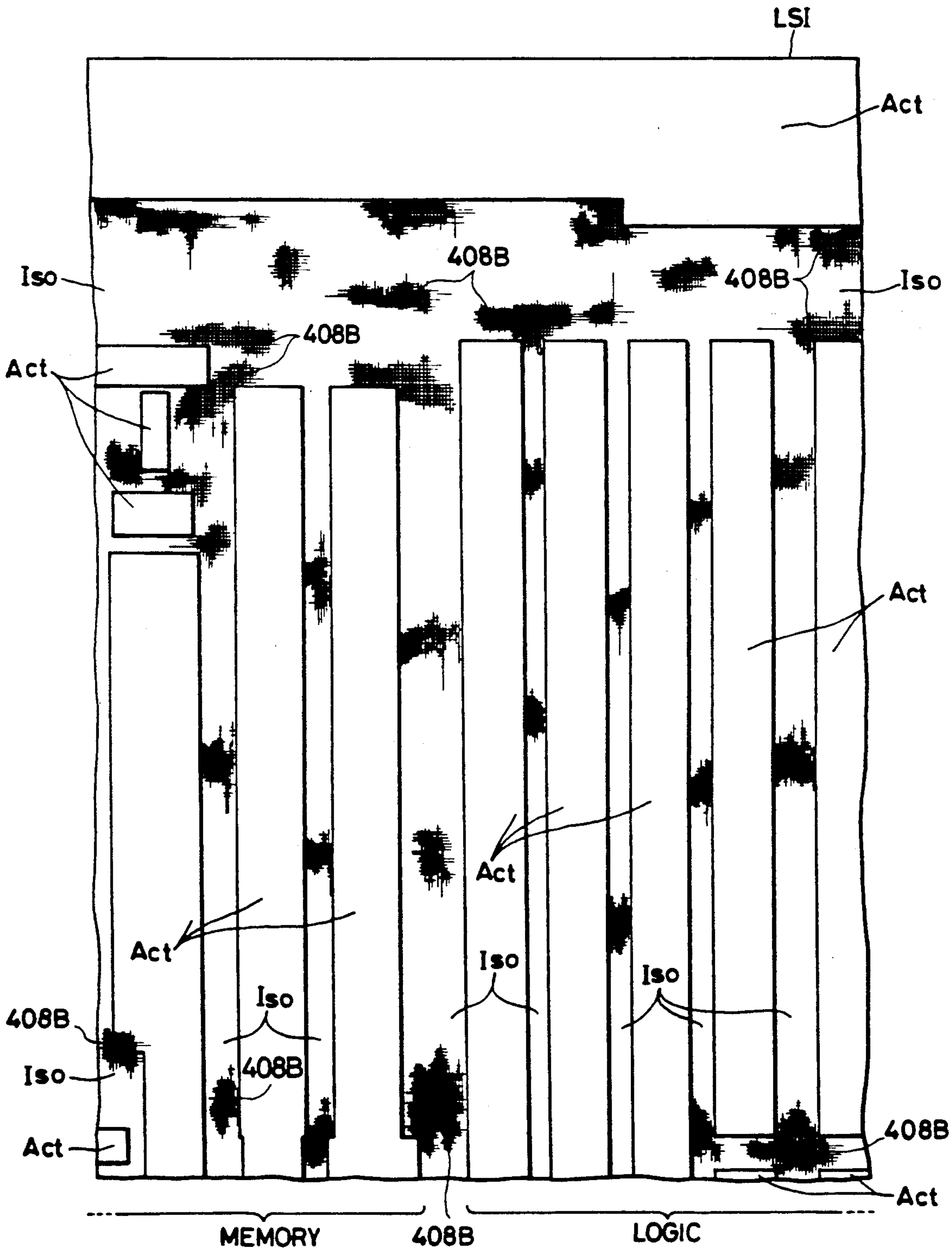
FIG. 4C is a schematic enlarged plan view of the semiconductor integrated circuit device shown in FIG. 4B.
Figure 4D:
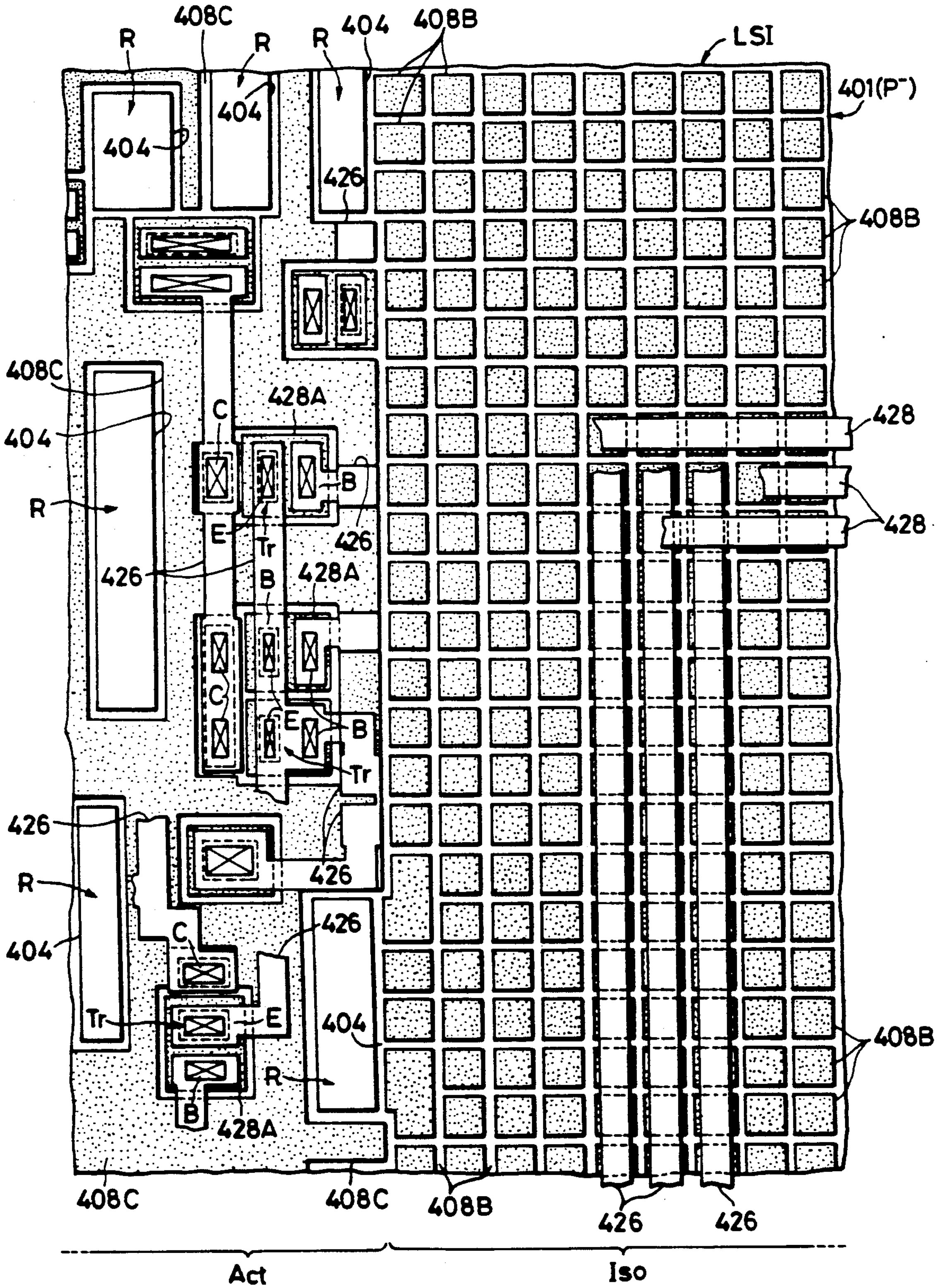
FIG. 4D is a schematic enlarged plan view of the semiconductor integrated circuit device shown in FIG. 4C.

A specific arrangement of an essential part of the semiconductor integrated circuit device LSI having the above-described arrangement is shown in FIG. 4C (an enlarged plan view of an essential part of the arrangement shown in FIG. 4B) and FIG. 4D (an enlarged plan view of an essential part of the arrangement shown in FIG. 4C).

As shown in FIG. 4C, each of the logic and memory sections Logic and Memory is provided with a plurality of active regions Act. As shown in FIG. 4D, bipolar transistors Tr, resistance elements R and so on which constitute various circuits are disposed in each active region Ac. Each bipolar transistor Tr comprises essentially a collector region C, a base region B and an emitter region E.

An isolation region Iso is provided between each pair of adjacent active regions Act, as shown in FIG. 4C. Each isolation region Iso is used as an interconnection forming region (i.e., an interconnection channel region), as shown in FIG. 4D. In other words, the isolation region Iso is arranged such that interconnections (426, 428, etc) for connection between circuits formed in the same active region Act or between circuits which are respectively formed in different active regions Act can be extended over the isolation region Iso.

The semiconductor integrated circuit device LSI which is under developement by the present inventors is formed with a four-layer interconnection structure, although not necessarily limitative thereto. As shown in FIG. 4D, bipolar transistors Tr in the active region Act are connected together by a first-level interconnection 426. Connection between circuits formed in the same active region Act and connection between circuits which are respectively formed in differenct active regions Act are effected using both the first- and second-level interconnections 426 and 428. The interconnections 426 and 428 are arranged so as to extend over the isolation region Iso. The first-level interconnections 426 which extend over the isolation region Iso are formed so as to extend vertically as viewed in FIG. 4D. The second-level interconnections 428 are arranged so as to extend horizontally as viewed in FIG. 4D. Interconnections other than the above, that is, third- and fourth-level interconnections 430 and 432, are arranged so as to be used mainly as signal interconnections and power supply interconnections, respectively.

A specific arrangement of the memory cells disposed in each active region Act, particularly in each memory cell array MA of the memory sections Memory will next be briefly explained with reference to FIG. 4A (a fragmentary sectional view).

As shown in FIG. 4A, the semiconductor integrated circuit device LSI comprises mainly a $p^-$-type semiconductor substrate 401 made of single crystal silicon. An $n^-$-type epitaxial layer 403 is deposed on the principal surface of the semiconductor substrate 401. In an active region Act, a forward bipolar transistor $Tr_1$, a backward bipolar transistor $Tr_2$, a Schottky barrier diode SBD, a high-resistance element $R_H$ and a low-resistance element $R_L$ are formed on the principal surface of the semiconductor substrate 401. These semiconductor elements constitute in combination a flip-flop which defines a resistance changeover type memory cell with an SBD used to constitute a static RAM.

Between the semiconductor elements, particularly between the forward bipolar transistor $Tr_1$, the backward bipolar transistor $Tr_2$ and the high-resistance element $R_H$, electrical isolation is effected by means of an element isolation region. The element isolation region comprises mainly the semiconductor substrate 401, an element isolation isolating film 405 and a $p^+$-type semiconductor region 406. The element isolation insulating film 405 is defined by a silicon oxide film which is formed by subjecting the principle surface of the semiconductor substrate 401 (or/and the epitaxial layer 403) to local thermal oxidation. The element isolation insulating film 405 is formed with a thickness of about 3000 to 5000 [Å] with a view to preventing generation of crystal defects in the semiconductor substrate 401 and the epitaxial layer 403 at the angular portions of projecting insular regions 404. Thus, the element isolation insulating film 405 is formed so as to be relatively thin as being an element isolation insulating film. The $p^+$-type semiconductor region 406 is provided in the principal surface region of the semiconductor substrate 401 under the element isolation insulating film 405.

The forward bipolar transistor $Tr_1$ comprises an n-type collector region, a p-type base region and an n-type emitter region. In other words, the forward bipolar transistor $Tr_1$ is an npn transistor.

The collector region comprises an $n^+$-type buried semiconductor region 402 and an $n^+$-type semiconductor region (not shown) for pulling up the collector potenial. The $n^+$-type semiconductor region 402 is provided between the semiconductor substrate 1 and the epitaxial layer 403. The $n^+$-type semiconductor region 402 is provided in order to lower the collector resistance.

The base region comprises a $p^+$-type semiconductor region 409 and a p-type semiconductor region 416. The p-type semiconductor region 416 is provided in the principal surface of the epitaxial layer 403 in a projecting (convex) insular region 404 which is defined by the epitaxial layer 403 in the active region Act. The $p^+$-type semiconductor region 409 is provided in the principal surface region of the epitaxial layer 403 at the side wall, more specifically the shoulder portion, of the projecting insular region 404.

The emitter region comprises an n-type semiconductor region 417 and an $n^+$-type semiconductor region 420. The n-type semiconductor region 417 is provided in the principal surface region of the p-type semiconductor region 416 constituting the base region which is formed in the projecting insular region 404. The $n^+$-type semiconductor region 420 is provided in the principal surface region of the n-type semiconductor region 417.

One end of a base lead-out electrode 408A is connected to the $p^+$-type semiconductor region 409 constituting the base region through a contact hole 407 which is provided in the element isolation insulating film 405 at the side wall of the projecting insular region 404. The other end of the base lead-out electrode 408A is lead out on the element isolation insulating film 405 in the element isolation region. In other words, the forward bipolar transistor $Tr_1$ has the SICOS structure. The base lead-out electrode 408A is formed from a first-level polycrystalline silicon film which has a p-type impurity introduced thereinto. The $p^+$-type smiconductor region 409 constituting the base region is formed by diffusing the p-type impurity introduced in the base lead-out electrode 408A inot the principal surface region of the epitaxial layer 403 at the contact hole 407. In other words, the $p^+$-type semiconductor region 409 is formed in self-alignment with the base lead-out electorde 408A. The forward bipolar transistor $Tr_1$ having the SICOS structure enables a reduction in the area occupied by the region and hence an increase in the integration density because it is possible to eliminate the need to provide an area in the planar direction for connection between the base lead-out electrode 408A and the $p^+$-type semiconductor region 409 constituting the base region.

A first-level interconnection 426 is connected to the base lead-out electrode 408A through a contact hole 425 which is provided in the interlayer insulating film 424 and other associated films, as shown in FIG. 4D. The interconnection 426 is formed from a composite film comprising a platinum silicide film 426A and an aluminum film 426B which is deposited thereon. The platinum silicide film 426A is mainly used to constitute the Schottky barrier diode SBD. The aluminum film 426B has Si or/and Cu added thereto for preventing alloy spiking or/and stress migration.

An emitter lead-out electrode 419 is connected to the $n^-$-type semiconductor region 420 constituting the emitter region through a contact hole (emitter opening) 418 which is provided in an interlayer insulating film 413. The emitter lead-out electrode 419 is formed from a second-level polycrystalline silicon film having an n-type impurity introduced thereinto. The interlayer insulating film 413 is defined by a silicon oxide film which is formed by subjecting the surface of the base lead-out electrode 408A to thermal oxidation. The contact hole 418 whose opening dimension is determined by the interlayer insulating film 413 is formed in self-alignment with the base lead-out electrode 408A. More specifically, the emitter lead-out electrode 419 is consequently connected to the $n^+$-type semiconductor region 420 constituting the emitter region in self-alignment with the base lead-out electrode 408A. The $n^+$-type semiconductor region 420 is formed by introducing an n-type impurity into the principal surface region of the n-type semiconductor region 417 through the emitter lead-out electrode 419 within the region which is defined by the contact hole 418. In other words, the $n^+$-type semiconductor region 420 is formed in self-alignment with the emitter lead-out electrode 419.

An interconnection 426 is connected to the emitter lead-out electrode 419 in the same way as in the case of the base lead-out electrode 408A.

The $n^-$-type semiconductor region for pulling up the collector potential which constitutes the collector region is, although not shown, provided in the principal surface region of the epitaxial layer 403 in the projecting insular region 404. An interconnection 426 is connected to the $n^+$-type semiconductor region for pulling up the collector potential through the collector lead-out electrode 419 in the same way as in the case of the base and emitter regions.

The backward bipolar transistor $Tr_2$ comprises an n-type collector region, a p-type base region and an n-type emitter region. In other words, the backward bipolar transistor $Tr_2$ is an npn transistor.

The emitter region comprises an $n^+$-type buried semiconductor region 402 and an $n^-$-type semiconductor region (not shown) for pulling up the emitter potential.

The base region comprises a $p^+$-type semiconductor region 409 and a p-type semiconductor region 414. The p-type semiconductor region 414 is provided in the principal surface region of the epitaxial layer 403 within the projecting insular region 404. The $p^+$-type semiconductor region 409 is provided in the principal surface region of the epitaxial layer 403 at the shoulder portion of the projecting insular region 404.

The collector region comprises an n-type semiconductor region 415 and an $n^+$-type semiconductor region 420. The n-type semiconductor region 415 is provided in the principal surface region of the base region (the p-type semiconductor region 414) formed in the projecting insular region 404. The $n^+$-type semiconductor region 420 is provided in the principal surface region of the n-type semiconductor region 415.

An interconnection 426 is connected to the $p^+$-type semiconductor region 409 constituting the base region through a base lead-out electrode 408A in the same way as in the case of the forward bipolar transistor $Tr_1$. In other words, the backward bipolar transistor $Tr_2$ has the SICOS structure. To the $n^+$-type semiconductor region (not shown ) for pulling up the emitter potential that constitutes the emitter region is connected an interconnection 426 through a emitter lead-out electrode 419. To the $n^+$-type semiconductor region 420 of the collector region is connected an interconnection 426 through a collector lead-out electrode 419.

In the backward bipolar transistor $Tr_2$, a collector terminal which serves as the information storing section (accumulation node section) is formed on the surface side of the epitaxial layer 403. More specifically, since in the backward bipolar transistor $Tr_2$ minority carriers generated due to α-particles entering the semiconductor substrate 401 can be shielded by the base region (the p-type semiconductor region 414), it is possible to prevent occurrence of soft errors.

The Schottky barrier diode SBD comprises an n-type semiconductor region 417 which is formed integral with the emitter region of the forward bipolar transistor $Tr_1$ and the platimum silicide film 426A constituting the interconnection 426. The Schottky barrier diode SBD has a shielded structure. More specifically, the n-type semiconductor region 417 of the Schottky barrier diode SBD is shielded by the p-type semiconductor region 416 and the $p^+$-type semiconductor region 409 which constitute the base region of the forward bipolar transistor $Tr_1$. The Schottky barrier diode SBD is connected to the collector terminal (the information storing section) of the backward bipolar transistor $Tr_2$ through the low-resistance element $R_L$. In other words, the shielded structure is arranged such as to shield minority carriers generated due to α-particles entering the semiconductor substrate 401 as described above.

The low-resistance element $R_L$ as a memory cell resistor is defined by the n-type semiconducotor region 417 which is the emitter region of the forward bipolar transistor $Tr_1$.

The high-resistance element $R_H$ as a memory cell resistor is defined by a $p^-$-type semiconductor region 410. The $p^-$-type semiconductor region 410 is provided in the principal surface region of the epitaxial layer 403 in a projecting insular region 404.

Further, a capacitor element Ca is formed in the memory cell. The capacitor element Ca has a stacked structure in which a lower electrode 419, a dielectric film 423 and an upper electrode 423 are successively stacked. The lower electrode 419 is formed from the same polycrystalline silicon film as that for the emitter lead-out electrode 419. The dielectric film 423 is defined by for example, a tantalum oxide ($Ta_2O_5$) film. The upper electrode 423 is defined by, for example, a refractory metal ($MoSi_2$) film. The dielectric film 423 is formed in the same pattern as that of the upper-layer electrode 423.

A second-level interconnection layer 428 extends above the first-levl interconnection layer 426 through an interlayer insulating film 427. A third-level interconnection layer 430 extends above the second-level interconnection layer 428 through an interlayer insulating film 429. A fourth-level interconnection layer 432 extends above the third-level interconnection layer 430 through an interlayer insulating film 431. Each of the second-, third- and fourth-level interconnection layers 428, 430 and 432 is defined by an aluminum film or an aluminum film having Si or/and Cu added thereto. A passivation film 433 is provided over the fourth-level interconnection layer 432.

As shown in FIG. 4D, dummy projections 408C are provided between the projecting insular regions 404, that is, on the element isolation insulating film 405 defining the element isolation region, in the active region Act. The dummy projections 308C are formed from the same conductive layer as that for the base lead-out electrodes 408A of the forward bipolar transistors $Tr_1$ and $Tr_2$. The dummy projections 408C are separated from the base lead-out electrodes 408A at a predetermined spacing so as to be electrically isolated thereform. If the minimum processable dimension is, for example, 1 [μm], the dimension of separation between the dummy projections 408 and the base lead-out electrodes 408A is about 1 [μm]. In regions where no base lead-out electrodes 408A are present, the dummy projections 408C are separated from each other at the same dimension as that of the projecting insular regions 404.

The dummy projections 408C are arranged so as to ease the step configuration which is mainly attributable to the projecting configurations of the projecting insular regions 404, the base lead-out electrodes 408A, the emitter lead-out electrodes 419 and the collector lead-out electrodes 419. In other words, the dummy projections 408C are provided mainly for the purpose of flattening the surface of the interlayer insulating film 424 serving as the ground of the first-level interconnection layer 426.

Since the first-level interconnections 426 extending in the active region Act are formed with a relatively short length which is adequate to connect neighboring semiconductor elements, the parasitic capacitance that is added to the interconnections 426 can be substantially ignored. Since the active region Act includes a plurality of projecting insular regions 404 and a plurality of base lead-out electrodes 408A, there are a considerably large number of steps in the active region Act. Accordingly, the dummy projections 408C are spread substantially all over the surface of the active region Act to ease the step configuration.

Thus, in the semiconductor integrated circuit device LSI wherein the electrodes (408A and 419) are connected to the semiconductor elements (Tr and the like) provided in the active region Act and the interconnections 426 extend above the electrodes through the stack of interlayer insulating films (411, 421 and 424), the dummy projections 408C are spread substantially all over the surface of the element isolation regions between the above-described semiconductor elements in the area between the semiconductor substrate 401 and the above-described stack of interlayer insulating films within the active region Act, thereby reducing and easing the step configurations resulting from the presence of the semiconductor elements and the electrodes, and thus enabling the surface of the interlayer insulating film 424 to be flattened. Therefore, it is possible to improve the step coverage relative to the interconnections 426 and hence enhance the electrical reliability of the interconnections 426. In particular, the bipolar transistors having the SICOS structure include the projecting insular regions 404 formed in the active region Act and therefore have relatively steep step configurations; therefore, the present invention is particularly effective.

As shown in FIGS. 4A and 4D, dummy projections 408B are disposed on the element isolation insulating film 405 in the isolation region Iso. The dummy projections 408B are formed from the same conductive layer as that for the base lead-out electrodes 408A of the forward and backward bipolar transistors $Tr_1$ and $Tr_2$ in the same way as in the case of the dummy projections 408C. The disposition pattern of the dummy projections 408B is made coincident (aligned) with that of the first-level interconnections 426 provided thereabove. More specifically, the dummy projections 408B are formed with substantially the same width as that of the first-level interconnections 426 and also spaced apart from each other at substantially the same spacing as that of the interconnections 426. For example, if the minimum processable dimension is 1 [μm], the dimension of the dummy projections 408B in the direction of the width of the interconnections 426 is set at 4 [μm], and the spacing between the dummy projections 408B is set at 1[μm]. In the direction in which the interconnections 426 extend, the dummy projections 408B are arranged with the same dimension and spacing as those in the direction of the width of the interconnections 426. In other words, the dummy projections 408B have a square planar configuration and are arranged such that a plurality of dummy projections 408B are regularly disposed in both the row and column directions. More specifically, the dummy projections 408B are arranged in a mesh-shaped configuration. It should be noted that the planar shape of the dummy projections 408B is not necessarily limitative to the square shape but may be any of the rectangular, circular, oval and polygonal shapes.

Figure 4E:
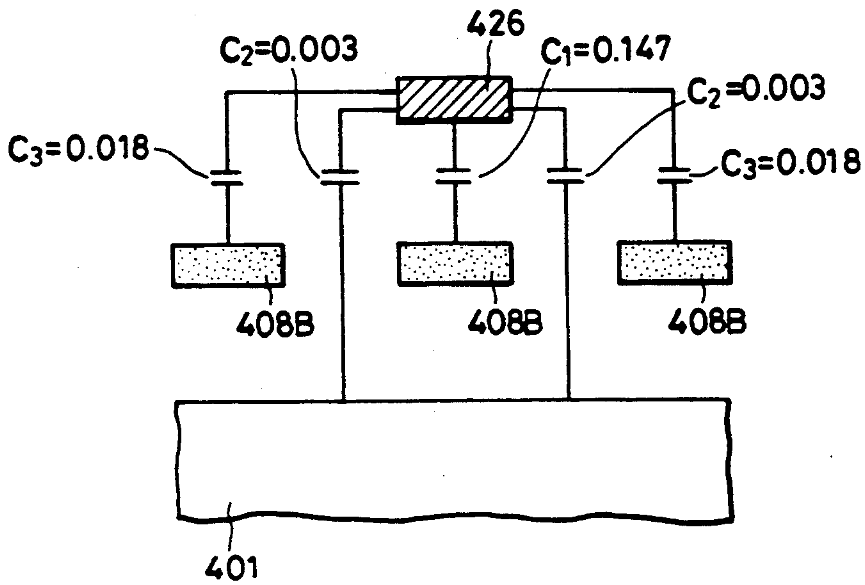
FIGS. 4E and 4F schematically show in the form of models the interconnection portions extending in the semiconductor integrated circuit device shown in FIG. 4B.
Figure 4F:
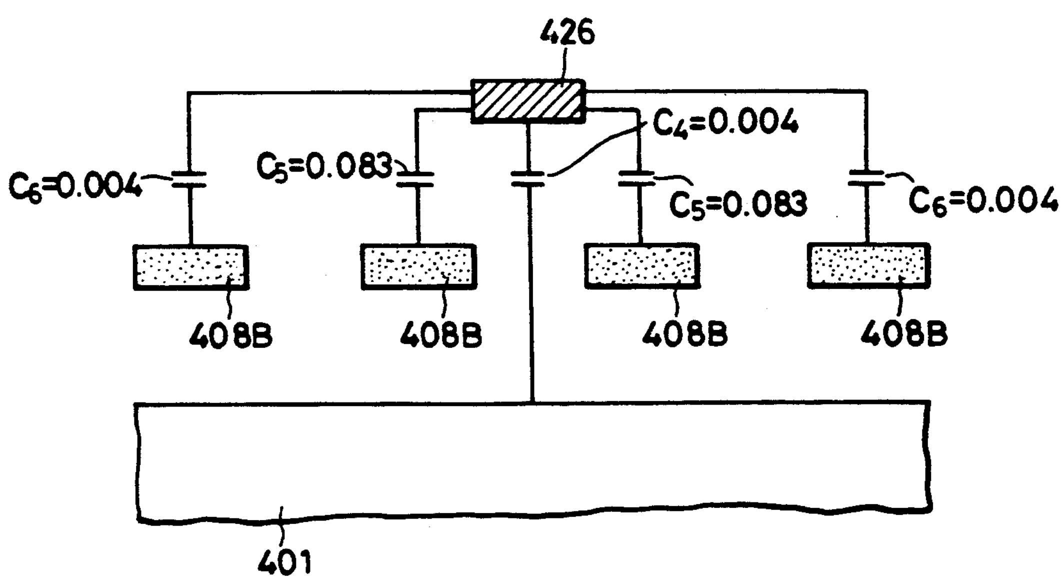

Further, the dummy projections 408B are arranged such that the center position of each dummy projection 408B is substantially coincident with that of the first-interconnection 426 provided directly above it. FIGS. 4E and 4F (views schematically showing the substrate and an interconnection in the form of models) respectively show models representing the results of simulation concerning parasitic capacitances conducted by the present inventors. If dummy projections 408B are, although not shown, continuously spread all over the surface of the isolation region Iso in the same way as in the case of the dummy projections 408C in the active region Act, the parasitic capacitance formed below the dummy projections 408B spread all over the surface is electromagnetically hidden from the interconnections 426 (i.e., the parasitic capacitance formed between the dummy projections 408 and the semiconductor substrate 401 becomes infinite). Accordingly, the total parasitic capacitance that is added to the interconnections 426 is considerably large because the parasitic capacitance formed between the interconnections 426 and the dummy projections 408B spread all over the surface is dominant. Since the isolation region Iso is basically arranged such that the interconnections 426 are extended thereover for connection between circuits formed in the active region Act and between circuits which are respectively formed in different active regions Act, the length of the interconnections 426 is relatively long; therefore, if the parasitic capacitance that is added to the interconnections 426 is large as described above, the signal transmission speed is considerably lowered. Accordingly, in the present invention, the dummy projections 408B in at least the isolation region Iso are arranged in a mesh-like configuration on the basis of the results of the simulation, thereby positively forming relatively small parasitic capacitances between the interconnections 426 and the semiconductor substrate 401.

FIG. 4E shows parasitic capacitances added to an interconnection 426 in the case where the arranging pattern of the first-level interconnections 426 and the mesh-like arranging pattern of the dummy projections 408B are made coincident with each other and the center positions of these two patterns are also made coincident with each other. In FIG. 4E, $C_1$ is a parasitic capacitance formed between the interconnection 426 and a dummy projection 408B which is located directly below it; $C_2$ is a parasitic capacitance formed between the interconnection 426 and the semiconductor substrate 401 (actually, the $p^-$-type semiconductor region 406); and $C_3$ is a parasitic capacitance formed between the interconnection 426 and a dummy projection 408B which is located in the vicinity of the dummy projection 408B directly below the interconnection 426. The illustrated value of each of the parasitic capacitances $C_1$, $C_2$ and $C_3$ is one example thereof and the unit is [PF/mm]. As will be clear from FIG. 4E, although a relatively large parasitic capacitance $C_1$ is formed between the interconnection 426 and the dummy projection 408 directly below it, since the semiconductor substrate 401 is electromagnetically seen from the interconnection 426 through the space provided between the dummy projections 408B, considerably small parasitic capacitances $C_2$ are formed between the interconnection 426 and the semiconductor substrate 401. Further, since the interconnection 426 and the dummy projection 408B which is located in the vicinity of the dummy projection 408B directly below the interconnection 426 are spaced apart from each other at a maximum dimension corresponding to the pitch of the dummy projections 408B, the parasitic capacitance $C_3$ is exceedingly small. Accordingly, in the parasitic capacitances added to the interconnection 426, the parasitic capacitance $C_2$ formed between the interconnection 426 and the semiconductor substrate 401 is dominant, and therefore, a minimized parasitic capacitance is added to the interconnection 426. According to the simulation conducted by the present inventors, the total parasitic capacitance added to the interconnection 426 in the case where the arranging pattern of the first-level interconnections 426 and the mesh-like arranging pattern of the dummy projections 408B are made coincident with each other and the center positions of these two patterns are also made coincident with each other was about 20 [%] smaller than that in the case where the dummy projections 408B are continuously spread all over the surface, as described above.

On the other hand, FIG. 4F shows parasitic capacitances which are added to the interconnection 426 in the case where the arranging pattern of the first-level interconnections 426 and the mesh-like arranging pattern of the dummy projections 408B are offset from each other by a half of the pitch (it should be noted that both ends of the interconnection 426 and the corresponding ends of the dummy projections 408B which are below and close to the interconnection 426 are made coincident with each other). In FIG. 4F, $C_4$ is a parasitic capacitance formed between the interconnection 426 and the semiconductor substrate 401; $C_5$ is a parasitic capacitance formed between the interconnection 426 and a dummy projection 408B which is located in the vicinity of it; and $C_6$ is a parasitic capacitance formed between the interconnection 426 and a dummy projection 408B located at a position which is the remotest from the interconnection 426. As will be clear from FIG. 4F, although an exceedingly small parasitic capacitance $C_4$ is formed between the interconnection 426 and the semiconductor substrate 401 through the space between two dummy projections 408B located in the vicinity of the interconnection 426, the parasitic capacitances $C_5$ formed between the interconnection 426 and said two dummy projections 408B are added to the parasitic capacitance $C_4$, resulting in an increase in the value of the total parasitic capacitance. On the other hand, a relatively small parasitic capacitance $C_6$ is formed between the interconnection 426 and a dummy projection 408B located at a position which is the remotest from the interconnection 426. Accordingly, in the parasitic capacitances added to the interconnection 426, the parasitic capacitances $C_5$ formed between the interconnection 426 and its neighboring dummy projections 408B are dominant, and therefore, a larger parasitic capacitance than in the case of the model shown in FIG. 4E is added to the interconnection 426. It should be noted that the parasitic capacitance added to the interconnection 426 in the case of the model shown in FIG. 4F is smaller than in the case where the dummy projections 408B are continuously spread all over the surface.

Thus, according to the present invention, there is provided a semiconductor integrated circuit device LSI arranged such that electrodes (408 and 419) are connected to semiconductor elements (Tr and the like) provided in an active region Act on the principal surface of a semiconductor substrate 401 and interconnections 426 extend above the electrodes through a stack of interlayer insulating films (419, 421 and 424), wherein dummy projections 408B are disposed in a mesh-like configuration over an isolation region Iso between the semiconductor elements within the area defined between the semiconductor substrate 401 and the above-described stack of interlayer insulating films, thereby reducing and easing step configurations resulting from the presence of the above-described semiconductor elements and electrodes, and thus enabling the surface of the interlayer insulating film (424) to be flattened. Accordingly, it is possible to improve the step coverage of the interconnections 426 and hence enhance the electrical reliability of the interconnections 426. In addition, since it is possible to reduce the parasitic capacitance added to the interconnections 426 by positively forming small parasitic capacitances between the interconnections 426 and the semiconductor substrate 401 which are smaller in terms of the capacitance value than the parasitic capacitances formed between the interconnections 426 and the dummy projections 408B, it is possible to increase the speed of transmission of signals through the interconnections 426 and hence achieve an increase in the operating speed of the semiconductor integrated circuit device LSI. Since in the case of bipolar transistors having the SICOS structure it is impossible to form a thick element isolation insulating film 405 in the isolation region Iso due to the fact that crystal defects are readily generated at the angular portions of the projecting insular regions 404 in the active region Act, the present invention which enables a reduction in the parasitic capacitance added to the first-level interconnections 426 is particularly effective. It should be noted that parasitic capacitances which are added to the second-, third-and fourth-level interconnections 428, 430 and 432 are satisfactorily small because each of the interlayer insulating films 427, 429 and 431 is relatively thick, i.e., for example, about 8000 to 12000 [Å].

Further, according to the present invention, the first-level interconnections 426 are disposed above the dummy projections 408B in the above-described semiconductor integrated circuit device LSI in such a manner that the pitch of the interconnections 426 is substantially coincident with that of the dummy projections 408B arranged in a mesh-like configuration and the center position of each interconnection 426 is substantially coincident with that of the corresponding dummy projection 408B. Thus, the parasitic capacitances formed between the interconnections 426 and the semiconductor substrate 401 are made dominant as shown in FIG. 4E, and it is therefore possible to minimize the parasitic capacitances formed between the interconnections 426 and the dummy projections 408B. Accordingly, it is possible to increase the speed of transmission of signals through the interconnections 426 and hence achieve an increase in the operating speed of the semiconductor integrated circuit device LSI. Thus, the present invention provides various advantages in addition to the above-described advantageous effects.

The stack of interlayer insulating films (411, 421 and 424) formed between the dummy projections 408 and the first-level interconnections 426 is formed with a thickness which is equal to or more than a half of the pitch of the dummy projections 408B disposed in a mesh-like configuration. For example, if the pitch of the dummy projections 408B is 1 [μm], the thickness of the stack of interlayer insulating films (basically, the thickness of the interlayer insulating film 411) is set at at least about 5000 [Å]. The stack of interlayer insulating films having the above-described thickness fills satisfactorily and reliably the recesses defined between the dummy projections 408B disposed in a mesh-like configuration, thus enabling the surface of the interlayer insulating film (424) to be flattened. As to the stack of interlayer insulating films, one interlayer insulating film (411) basically suffices for electrical isolation between the dummy projections 408B and the interconnection 426 and between the dummy projections 408B which are adjacent to each other. It should be noted that, in the arrangement wherein dummy projections 408C having a square planar configuration are disposed in a mesh-like configuration, the spacing between dummy projections 408C which face each other in a direction which is at 45 [degree] with respect to each of the lateral and longitudinal directions of the interconnections 426 is the largest, as will be understood from FIG. 4D. Accordingly, it is preferable to form the interlayer insulating film(s) with a thickness which is equal to or more than $\sqrt{\frac{1}{2}}$ of the pitch of the dummy projections 408B in each of the lateral and longitudinal directions of the interconnections 426 with a view to effectively flattening the surface of the interlayer insulating film (424).

Thus, according to the present invention, the above-described stack of interlayer insulating films (basically, the interlayer insulating film 411) is formed with a thickness which is equal to or more than a half of the pitch of the dummy projections 408B in the above-described semiconductor integrated circuit device LSI, whereby it is possible to bury satisfactorily the interlayer insulating film (411) in the recesses defined between the dummy projections 408B and hence flatten the surface of the interlayer insulating film (424), as shown in FIG. 4A. Accordingly, it is possible to improve the step coverage relative to the interconnections 426 and hence further enhance the electrical reliabililty of the interconnections 426. In addition, the apparent thickness of the interlayer insulating film (411) is increased by an amount corresponding to the film thickness of the dummy projections 408B, thereby further reducing the parasitic capacitance formed between the interconnections 426 and the semiconductor substrate 1, and thus enabling a reduction in the parasitic capacitance which is added to the interconnection 426. Accordingly, it is possible to increase the speed of transmission of signals through the interconnections 426 and further increase the operating speed of the semiconductor integrated circuit device LSI.

A specific process for producing the above-described semiconductor integrated circuit device LSI will next be briefly explained with reference to FIGS. 4G to 4V (fragmentary sectional views respective showing steps in the manufacturing process).

First, a $p^{-}$-type semiconductor substrate 401 made of single crystal silicon is prepared.

Next, a mask 435 for introduction of an impurity is formed on the principal surface of the semiconductor substrate 401 so as to cover the surface of the area between semiconductor element forming regions in an active region Act and the surface of an isolation region Iso. The mask 435 is defined by a silicon oxide film which is formed by subjecting the principal surface of the semiconductor substrate 401 to local thermal oxidation.

Figure 4G:
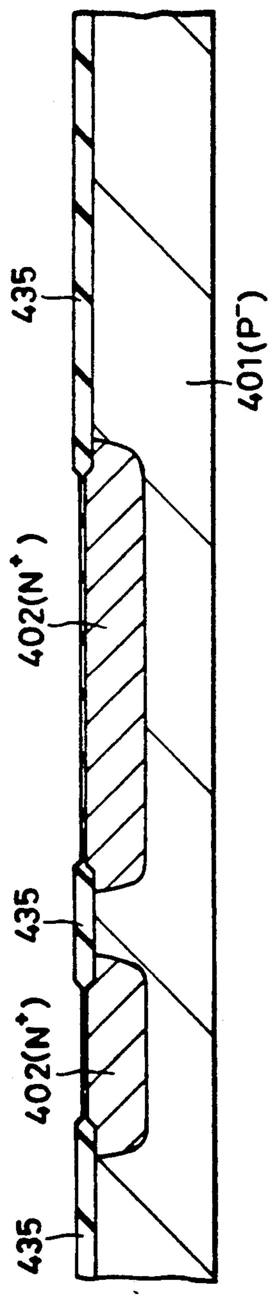
FIGS. 4G to 4V are cross-sectional views respectively showing steps in the process of producing the semiconductor integrated circuit device shown in FIG. 4B.

Next, an n-type impurity, e.g., Sb (or P or As) is introduced into the principal surface region of the semiconductor substrate 401 using the impurity introduction mask 435, thereby forming $n^{+}$-type buried semiconductor regions 402 as shown in FIG. 4G. The n-type impurity is introduced by, for example, thermal diffusion.

Figure 4H:
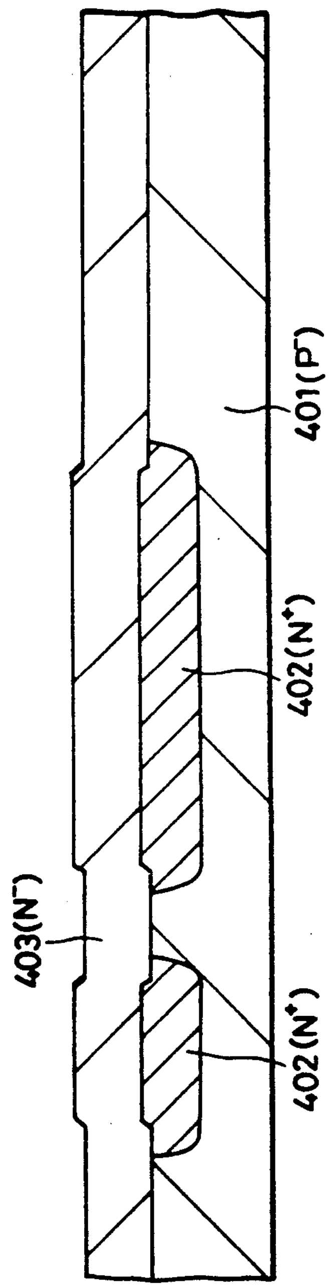

Next, the mask 435 and other silicon oxide films remaining on the principal surface of the semiconductor substrate 401 are removed. Then, as shown in FIG. 4H, an $n^{-}$-type epitaxial layer 403 is grown all over the principal surface of the semiconductor substrate 401. The epitaxial layer 403 has a thickness of about 0.6 to 0.8 [μm].

Next, masks 436, 437 and 438 are successively deposited on the principal surface of the epitaxial layer 403 in the semiconductor element forming regions of the active region Act. The mask 436 is defined by a silicon oxide film which is formed by subjecting the surface of the epitaxial layer 403 to thermal oxidation by way of example. The mask 437 is formed on the mask 436 and mainly used as an oxidation-resistant mask. The mask 437 is defined by a silicon nitride film with a thickness of about 800 to 1200 [Å] which is deposited by CVD or sputtering by way of example. The mask 436 is formed for the purpose of reducing the stress generated between the semiconductor substrate 401 and the mask 437, the mask 436 having a thickness of, for example, about 400 to 600 [Å]. The mask 438 is formed on the mask 437 and mainly used as an etching mask. the mask 438 is defined by a silicon oxide film with a thickness of about 7000 to 8000 [Å]. These masks 436, 437 and 438 are formed in the same pattern by subjecting them to successive patterning (multiple patterning).

Figure 4I:
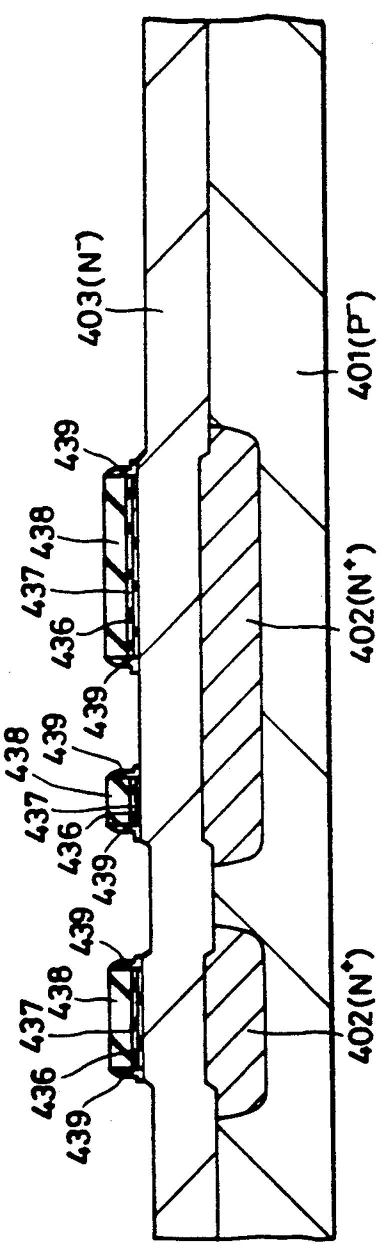

Next, as shown in FIG. 4I, a mask 439 is formed on the side wall of each of the masks 436, 437 and 438. The mask 439 is mainly used as an etching and oxidation-resistant mask. The mask 439 may be formed, for example, by successively depositing a silicon nitride film and a polycrystalline silicon film and subjecting this stack of films to an anisotropic etching such as RIE. The silicon nitride film is mainly used as an anti-thermal oxidation film, while the polycrystalline silicon film is used for the purpose of improving the step coverage of the silicon nitride film.

Next, those portions of the surface of the epitaxial layer 403 which extend between the semiconductor element forming regions of the active region Act and over the isolation region Iso are removed mainly using the masks 438 and 439, thereby forming projecting insular regions 404 defined by the resulting projecting portions of the epitaxial layer 403. For this etching process, an anisotropic etching is mainly carried out with a view to increasing the degree of processing accuracy. In the final stage of the etching, an isotropic etching is carried out in order to ease the steep configuration of the angular portion of each projecting insular region 404.

Figure 4J:
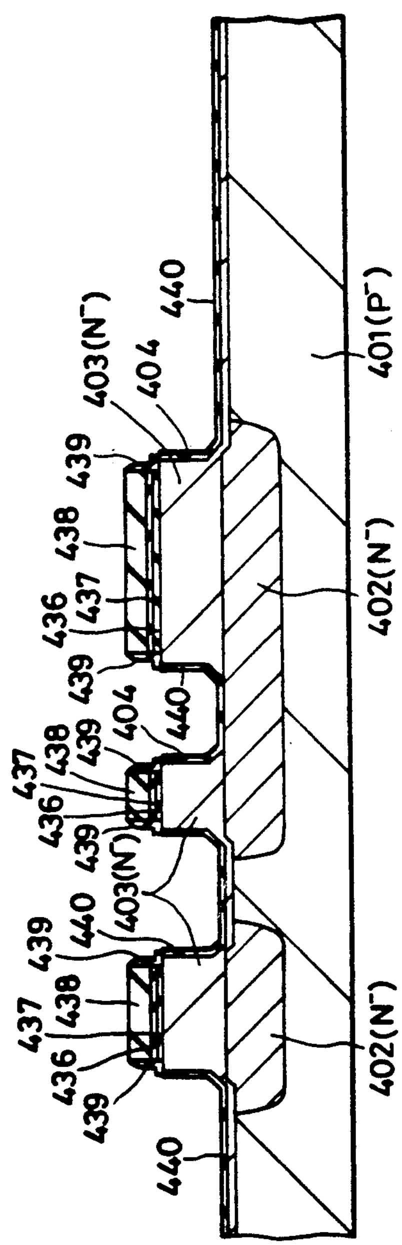

Next, as shown in FIG. 4J, a silicon oxide film 440 is formed on the exposed surface of the epitaxial layer 403 mainly using the mask 439. The silicon oxide film 440 is formed by subjecting the surface of the epitaxial layer 403 to thermal oxidation. The silicon oxide film 440 is formed in order to repair damages on the surface of the epitaxial layer 403 which may possibly be given by the etching carried out to form the projecting insular regions 404.

Next, the silicon oxide film 440 and the mask 439 are successively removed.

Next, a mask 441 is formed on the side wall of each of the masks 436, 437 and 438 and the side wall of each projecting insular region 404 (i.e., the surface of the epitaxial layer 403). The mask 441 is mainly used as an anti-thermal oxidation mask. The mask 441 may be formed, for example, by successively depositing a silicon nitride film and a polycrystalline silicon film and subjecting this stack of films to an anisotropic etching such as RIE in the same way as in the case of the above-described mask 439.

Next, a p-type impurity is introduced into the principal surface of the semiconductor substrate 401 at the area between the semiconductor element forming regions of the active region Act and at the isolation region Iso. As the p-type impurity, B is introduced by ion implantation with an energy of about 60 to 80 [KeV] and at a dose of about $10^{13}$ [atoms/cm$^2$] by way of example. Then, the introducted p-type impurity is subjected to extension diffusion to thereby from $p^+$-type semiconductor regions 406. The $p^+$-type semiconductor regions 406 define element isolation regions.

Figure 4K:
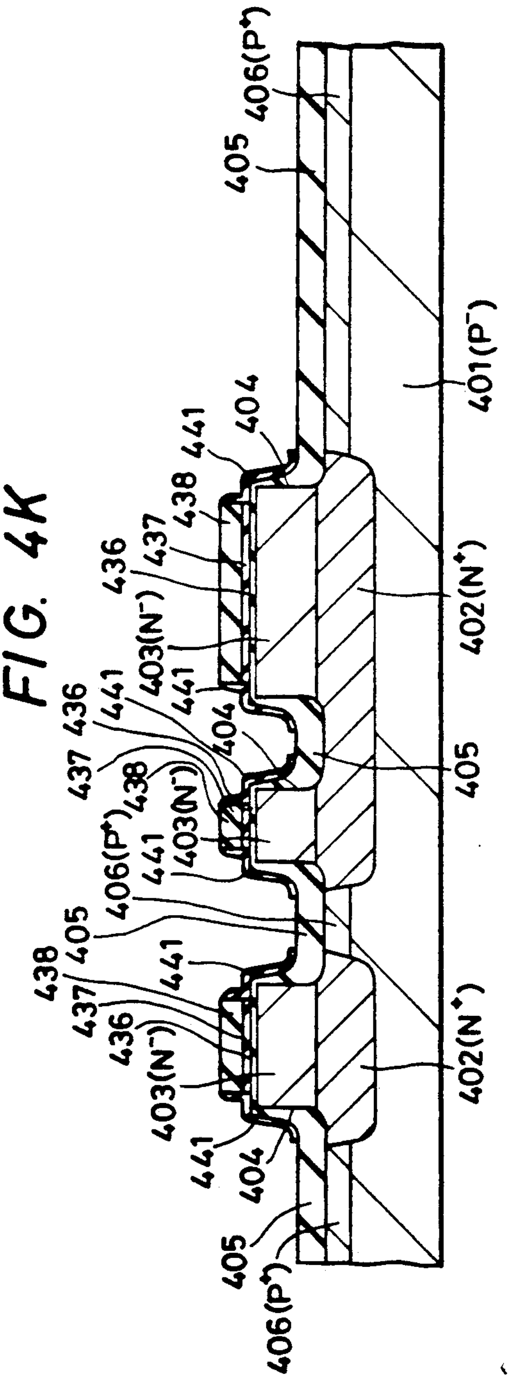

Next, as shown in FIG. 4K, an element isolation insulating film 405 is formed on the surface of the epitaxial layer 403 provided on the side wall of each projecting insular region 404 and on the surface of the other portion of the epitaxial layer 403 (or the semiconductor substrate 401). The element isolation insulating film 405 may be formed by subjecting the surface of the epitaxial layer 403 (or the semiconductor substrate 401) to thermal oxidation using the mask 441. The element isolation insulating film 405 is consequently provided in the form of a silicon oxide film. The insulating film 405 is formed so as to be relatively thin as being an element isolation insulating film, i.e., about 3000 to 5000 [Å], with a view to preventing generation of crystal defects at the angular portions of the projecting insular regions 404. After the formation of the element isolation insulating film 405, the mask 441 is selectively removed.

Figure 4L:
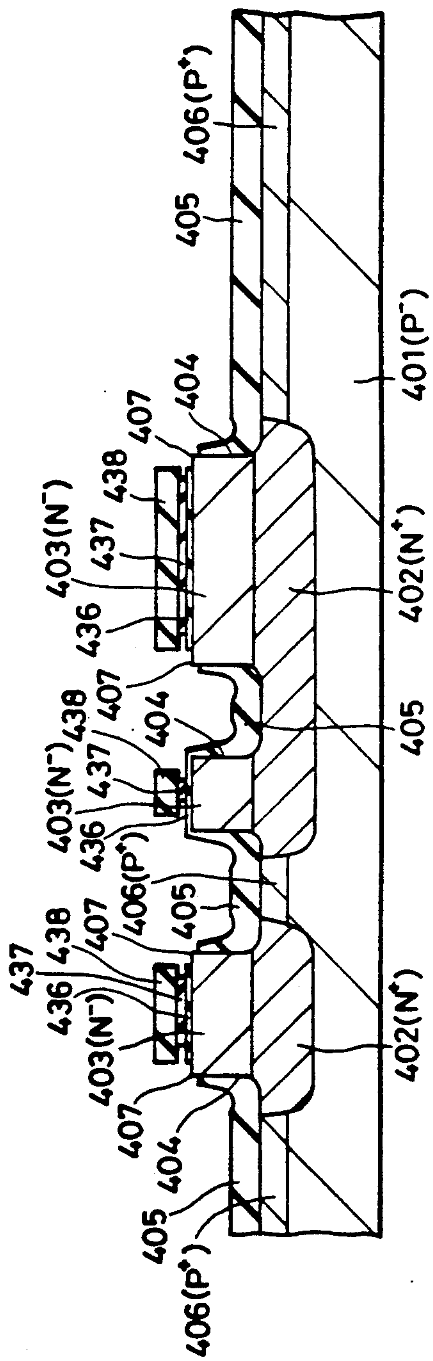

Next, as shown in FIG. 4L, the mask 436 or the element isolation insulating film 405 is removed from the angular portion, that is, the shoulder portion, of the side wall of each projecting insular region 404 in the base region forming region of each bipolar transistor Tr to form a contact hole 407. This contact hole 407 is used to connect together a base region (409) and a base lead-out electrode (408).

Next, a first-level electrode forming layer is deposited on the whole substrate surface including the surfaces of the element isolation insulating film 405 and the mask 438. This electrode forming layer is defined by a polycrystalline silicon film with a thickness of about 6000 to 8000 [Å] which is deposited by, for example, CVD. A part of the electrode forming layer is brought into contact with the surface of the epitaxial layer 403 on the shoulder portion of each projecting insular region 404 through the contact hole 407.

Next, a relatively high silicon oxide film is formed on the surface of the electrode forming layer, and thereafter, a p-type impurity is introduced into the electrode forming layer through the silicon oxide film. This silicon oxide film is formed for the purpose of preventing contamination with a heavy metal which is attributable to the introduction of an impurity and of reducing the damage of the surface of the electrode forming layer. As the p-type impurity, B is introduced by ion implantation with an energy of about 30 to 50 [KeV] and at a dope of about $10^{16}$[atoms/cm$^2$]. Introduction of the p-type impurity is conducted in order to lower the resistance of the electrode forming layer. The p-type impurity introduced into the electrode forming layer is diffused into the principal surface regions of the epitaxial layer 403 from the electrode forming layer at the contact holes 407 to form $p^+$-type semiconductor regions 409. The $p^+$-type semiconductor regions 409 are formed in self-alignment with the respective contact holes 407. Each $p^{30}$ -type semiconductor region 409 defines a part of the base region of the corresponding bipolar transistor.

Next, a silicon oxide film and a photoresist film are, although not shown, successively deposited on the whole surface of the electrode forming layer. Then, the uppermost layer, i.e., the photoresist film, the silicon oxide film and the electrode forming layer are successively subjected to etching (back-etching) by the use of an anisotropic etching, thereby flattening the substrate surface. More specifically, the electrode forming layer buried in the recesses defined between the projecting insular regions 404 is removed and the electrode forming layer deposited on the surfaces of the projecting insular regions 404 is also removed, thereby flattening the surface. Thereafter, the uppermost layer, i.e., the mask 438, on each projecting insular region 404 is removed by an isotropic etching.

Figure 4M:
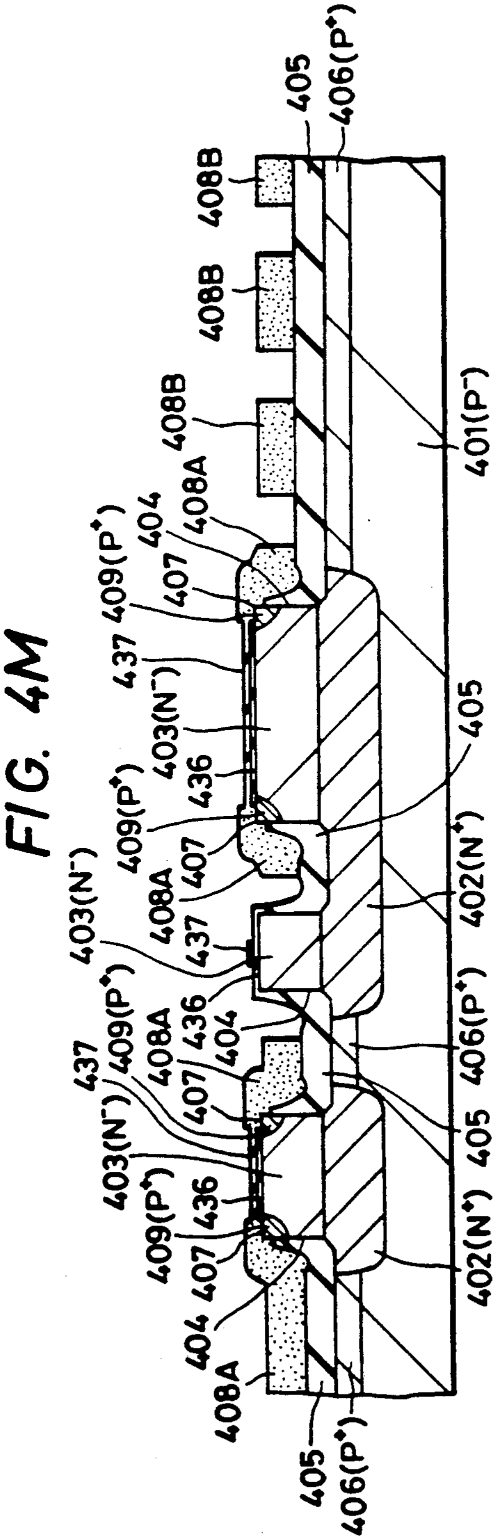

Next, as shown in FIG. 4M, the electrode forming layers in the active region Act and the isolation region Iso are processed in predetermined patterns to thereby form base lead-out electrodes 408A and dummy projections 408C in the active region Act and dummy projections 408B in the isolation region Iso. Thus, the base lead-out electrodes 408A and the dummy projections 408C, 408B are formed in the same manufacturing step. The electrode forming layer is patterned by, for example, an anisotropic etching.

Thus, the present invention provides a process for producing a semiconductor integrated circuit device LSI arranged such that electrodes (408A) are connected to semiconductor elements (Tr and the like) provided in an active region Act on the principal surface of a semiconductor substrate 401 and first-level interconnections 426 extend above the electrodes (408A) through a stack of interlayer insulating films (411, 421 and 424), wherein the step of forming the electrodes (408A) connected to the semiconductor elements and the step of forming dummy projections 408B disposed in a mesh-like configuration are carried out in the same manufacturing step. Thus, since the dummy projections 408B can be formed in the step of forming the electrodes 408A connected to the semiconductor elements, it is unnecessary to carry out the step of forming exclusively the dummy projections 408B and therefore possible to reduce correspondingly the number of steps in the process for producing the semiconductor integrated circuit device LSI.

Figure 4N:
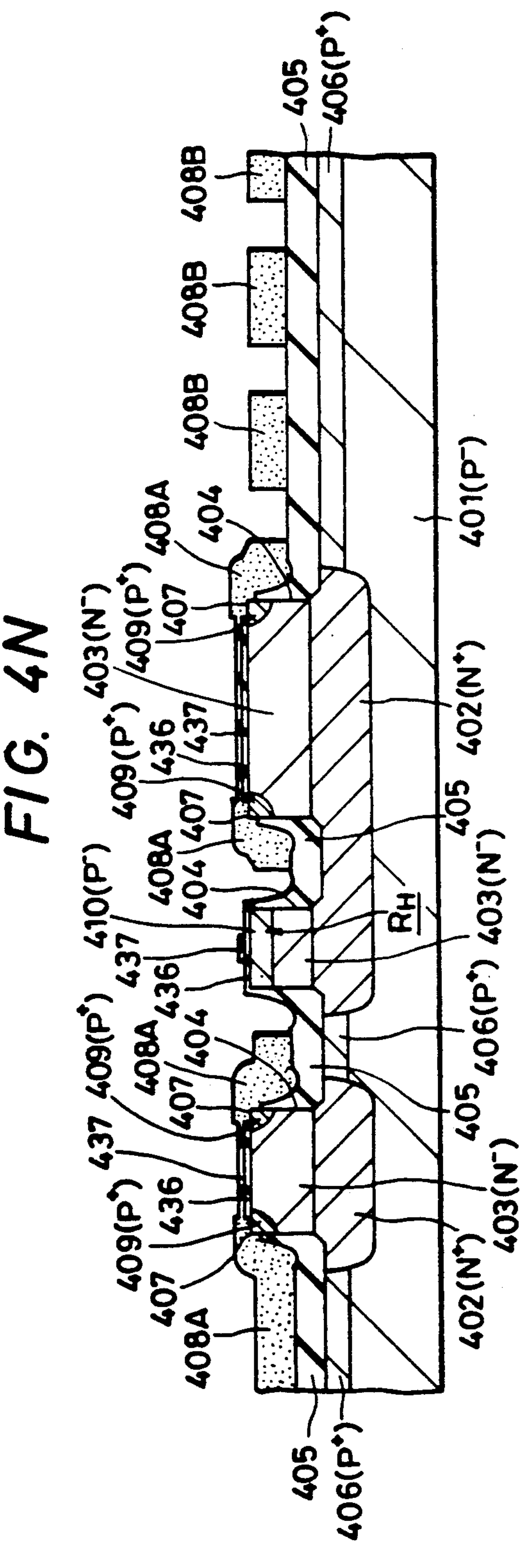

Next, as shown in FIG. 4N, a $p^-$-type semiconductor region 410 is formed in the principal surface region of the epitaxial layer 403 in the projecting insular region 404 at the region for forming a high-resistance element $R_H$ of a memory cell. The $p^-$-type semiconductor region 410 may be formed, for example, by introducing B by ion implantation with an energy of about 30 to 50 [KeV] and at a dose of about $10^{13}$ [atoms/cm$^2$]. By forming the $p^-$-type semiconductor region 410, the high-resistance element $R_H$ is completed. It should be noted that the high-resistance element $R_H$ may be formed before the step of patterning the electrode forming layer, that is, before the step of forming the base lead-out electrodes 408A.

Figure 4O:
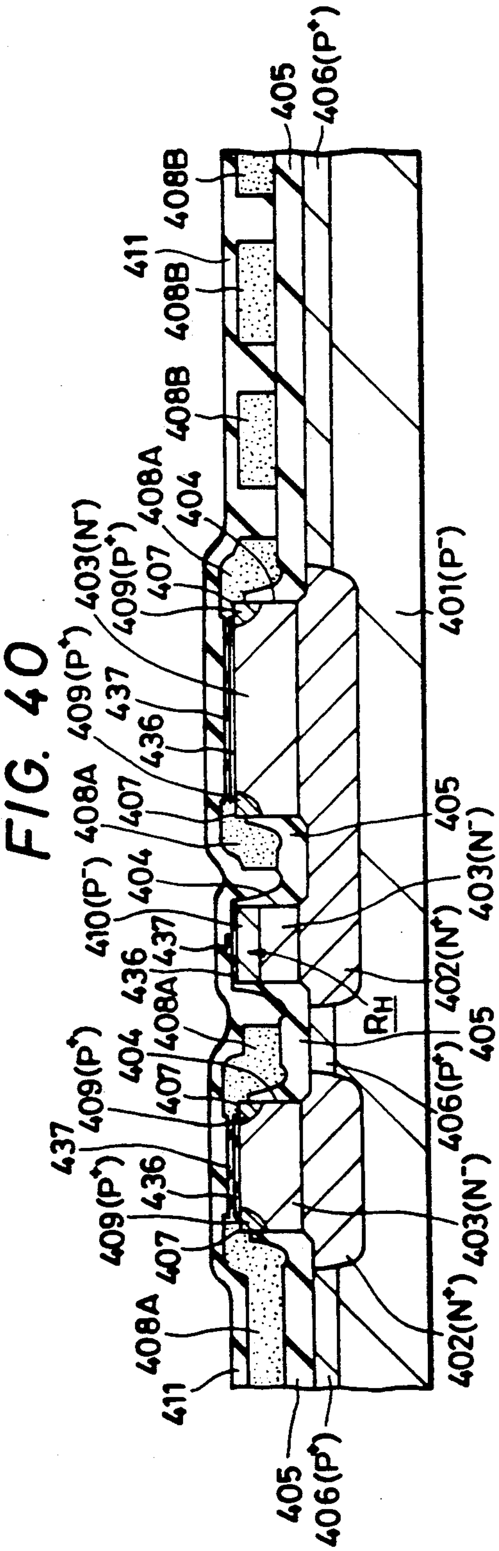

Next, as shown in FIG. 4O, an interlayer insulating film 411 is formed on the whole substrate surface including the surfaces of the base lead-out electrodes 408A and the dummy projections 408B, 408C. The interlayer insulating film 411 is defined by a composite film comprising, for example, a silicon oxide film deposited by CVD and a silicon oxide film coated thereon by SOG. Since the interlayer insulating film 411 in the isolation region Iso needs to have a thickness which is equal to or more than a half of the pitch of the dummy projections 408B, the lower silicon oxide film is formed with a thickness of, for example, about 7000 to 8000 [Å], while the upper silicon oxide film is formed with a thickness of, for example, about 1000 to 1500 [Å]. The upper silicon oxide film coated by SOG may be densified after being coated and then subjected to an anisotropic etching at the whole surface thereof, thereby further increasing the degree of flatness of the surface of the interlayer insulating film 411.

Next, a mask 442 is formed on the whole surface of the interlayer insulating film 411. The mask 442 is used as a mask for etching the interlayer insulating film 411 and also as an anti-thermal oxidation mask. The mask 442 is defined by a composite film comprising, for example, a silicon oxide film deposited by CVD and a silicon nitride film deposited thereon by CVD.

Next, the mask 442 is selectively removed at the regions for forming the base and emitter regions of bipolar transistors Tr and also a Schottky barrier diode SBD. Then, with the remaining mask 442 employed, the interlayer insulating film 411 is removed to form openings 412. The openings 412 are formed in such a manner that the surfaces of the base lead-out electrodes 408A are partially exposed at the sides thereof which are connected to the corresponding base regions in the active region Act.

Figure 4P:
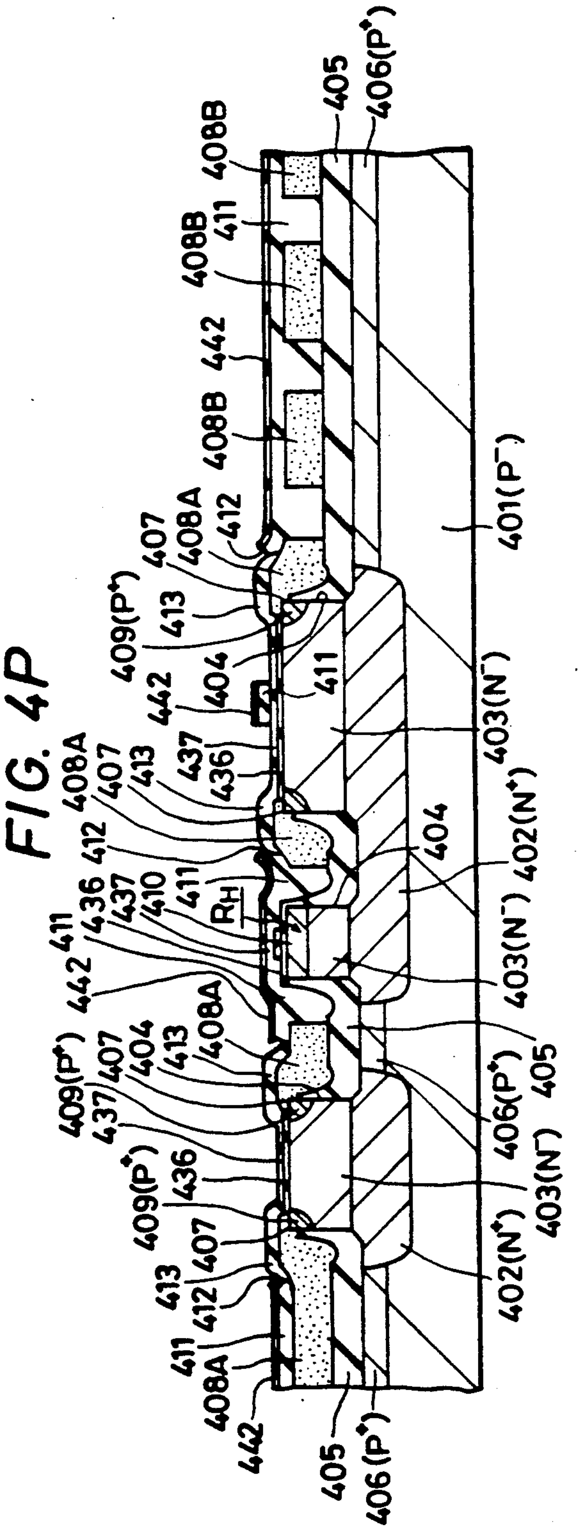

Next, as shown in FIG. 4P, an interlayer insulating film 413 is formed on the exposed portion of each base lead-out electrode 408A by the use of the mask 442 and the mask 437 on each projecting insular region 404. The interlayer insulating film 413 is defined by a silicon oxide film which is formed by subjecting the surface of the corresponding base lead-out electrode 403A to thermal oxidation. The interlayer insulating film 413 has a thickness of, for example, about 3000 to 4000 [Å]. The interlayer insulating films 413 are formed so as to provide electrical isolation between the base lead-out electrodes 408A on the one hand and an emitter and collector lead-out electrodes 419 on the other hand. The mask 442 is formed so that the base lead-out electrodes 408A are only partially subjected to thermal oxidation and the other portions of the base lead-out electrodes 408A, that is, the other longitudinal end portions of the electrodes 408A, and the element isolation insulating film 405 are not subjected to thermal oxidation. This is because it is necessary to prevent oxygen from being supplied to the inside of the semiconductor substrate 401 through those portions of the element isolation insulating film 405 which are directly below and near the end portions of the base lead-out electrodes 408A. If oxygen is supplied to the semiconductor substrate 401, the surface of the substrate 401 is oxidized and crystal defectds are readily generated in the substrate 401.

Figure 4Q:
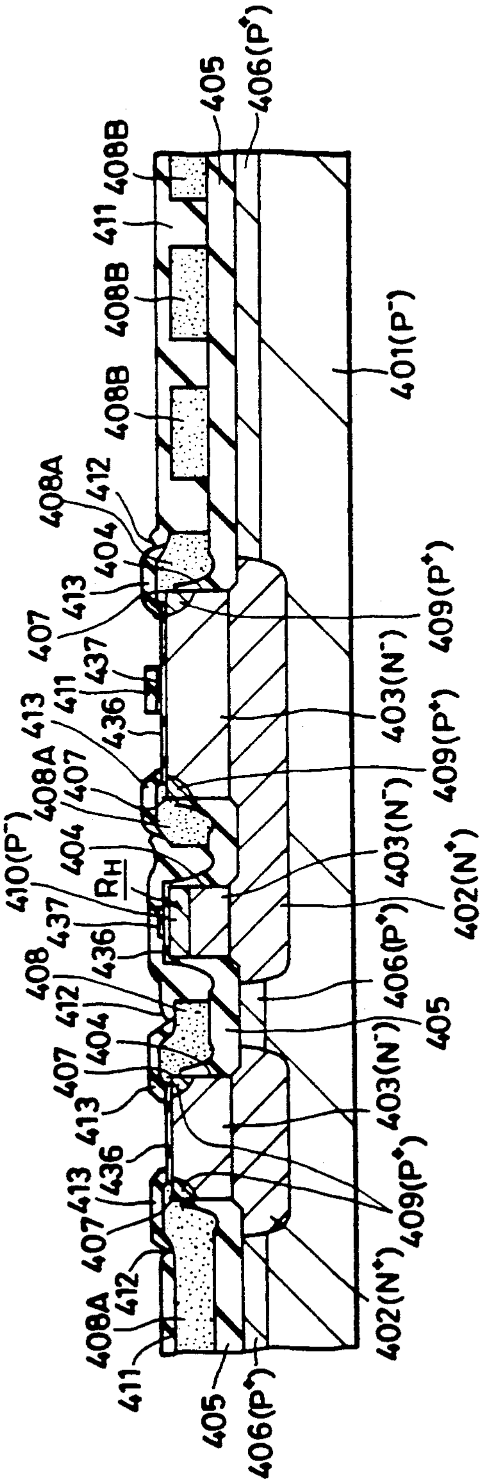

Next, as shown in FIG. 4Q, the mask 442 is removed. At the same time as the mask 442 is removed, the mask 437 remaining on each projecting insular region 404 is removed.

Next, an intrinsic base region of an npn bipolar transistor (having the SICOS structure) used to constitute the logic section Logic and the peripheral circuits (decoder circuits and the like) of the memory sections Memory, which is a bipolar transistor other than the forward and backward bipolar transistors $Tr_1$ and $Tr_2$, is formed, although not shown. The intrinsic base region of the bipolar transistor is formed in the principal surface region of the epitaxial layer 403 in a projecting insular region 404 in the same way as in the case of the forward and backward bipolar transistors $Tr_1$ and $Tr_2$. The intrinsic base region may be formed, for example, by introducing B by ion implantation with an energy of about 15 to 30 [KeV] and at a dose of about $10^{13}$ [atoms/cm$^2$].

Figure 4R:
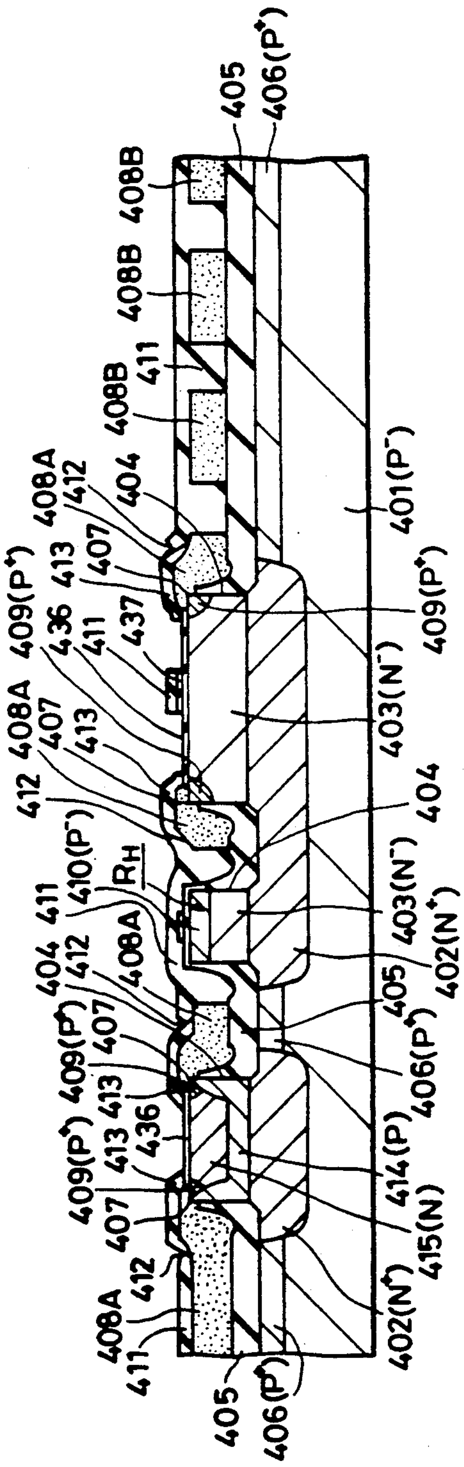

Next, as shown in FIG. 4R, a p-type semiconductor region 414 and an n-type semiconductor region 415 are successively formed in the principal surface region of the epitaxial layer 403 within the projecting insular region 404 at the region for forming the backward bipolar transistor $Tr_2$. The p-type semiconductor region 414 is used as a base region and also a potential barrier layer against minority carriers generated in the semiconductor substrate 401 due to α-particles. The p-type semiconductor region 414 may be formed by introducing B by ion implantation with an energy of about 140 to 160 [Kev] and at a dose of about $10^{13}$ [atoms/cm$^2$]. The n-type semiconductor region 415 is used as a part of the collector region. The n-type semiconductor region 415 may be formed by introducing P by ion implantation with an energy of about 140 to 160 [KeV] and at a dose of about $10^{13}$ [atoms/cm$^2$]. The p- and n-type impurities for forming the p- and n-type semiconductor regions 414 and 415, respectively, are introduced within a region which is defined by the interlayer insulating film 413 formed on the base lead-out electrode 408A.

Figure 4S:
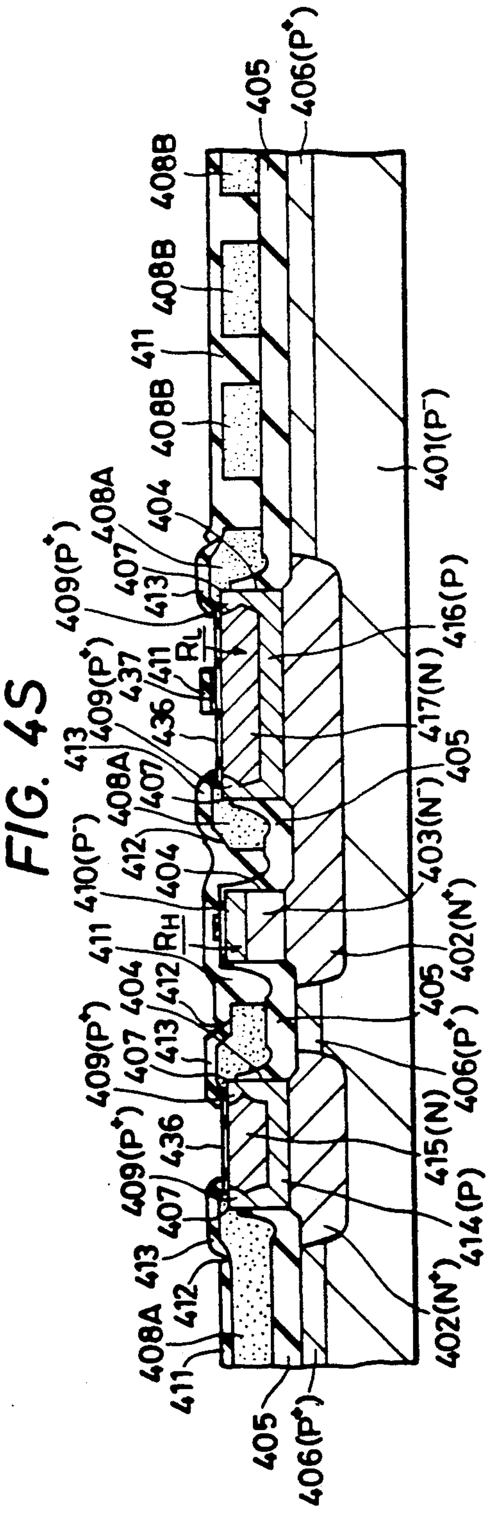

Next, as shown in FIG. 4S, a p-type semiconductor region 416 and an n-type semiconductor region 417 are successively formed in the principal surface region of the epitaxial layer 403 in the projecting insular region 404 at each of the regions for forming the forward bipolar transistor $Tr_1$, a low-resistance element $R_L$ and the Schottky barrier diode SBD. The p-type semiconductor region 416 is used as a base region and also a potential barrier layer against minority carriers generated in the semiconductor substrate 401 due to α-particles. The p-type semiconductor region 416 may be formed by introducing $B^{++}$ by ion implantation with an energy of about 80 to 100 [KeV] and at a dose of about 10—[atoms/$cm^2$]. The n-type semiconductor region 417 is used as a part of the emitter region, the low-resistance element $R_L$ and a part of the Schottky barrier diode SBD. The n-type semiconductor region 417 may be formed by introducing P by ion implantation with an energy of about 170 to 190 [KeV] and at a dose of about $10^{13}$ [atoms/$cm^2$].

Next, the mask 436 on the projecting insular region 404 is removed at each of the regions for forming the forward and backward bipolar transistors $Tr_1$ and $Tr_2$ to form a contact hole (an emitter or collector opening) 418. The mask 436 is removed within the region which is defined by the interlayer insulating film 413 formed on the surface of each of the base lead-out electrodes 408A.

Next, a second-level electrode forming layer is deposited on the whole substrate surface. This electrode forming layer is defined by a polycrystalline silicon film with a thickness of about 2000 to 3000 [Å] which is deposited by, for example, CVD. A part of the electrode forming layer is brought into contact with each of the n-type semiconductor regions 415 and 417 in the projecting insular regions 404 through the corresponding contact hole 418.

Next, a relatively thin silicon oxide film is formed on the surface of the electrode forming layer, and an n-type impurity is introduced into the electrode forming layer through this silicon oxide film. As the n-type impurity, for example, As is introduced by ion implantation with an energy of about 70 to 90 [KeV] and at a does of about $10^{16}$ [atoms/$cm^2$].

Next, the n-type impurity introduced into the electrode forming layer is subjected to activation (a heat treatment). The activation causes the n-type impurity introduced into the electrode forming layer to be diffused into the respective principal surface regions of the n-type semiconductor regions 415 and 417. The n-type impurity diffused into the principal surface region of the n-type semiconductor region 415 forms an $n^+$-type semiconductor region 420 which constitutes a part of the collector region of the backward bipolar transistor $Tr_2$. The n-type impurity diffused into the principal surface region of the n-type semiconductor region 417 forms an $n^+$- type semiconductor region 420 which constitutes a part of the emitter region of the forward bipolar transistor $Tr_1$. By carrying out the step of forming the $n^+$-type semiconductor regions 420, the forward and backward bipolar transistors $Tr_1$ to $Tr_2$ are completed. As, which is an n-type impurity, has a lower diffusion rate than that of other n-type impurities, such as P or the like, and therefore enables formation of a relatively shallow emitter junction.

Figure 4T:
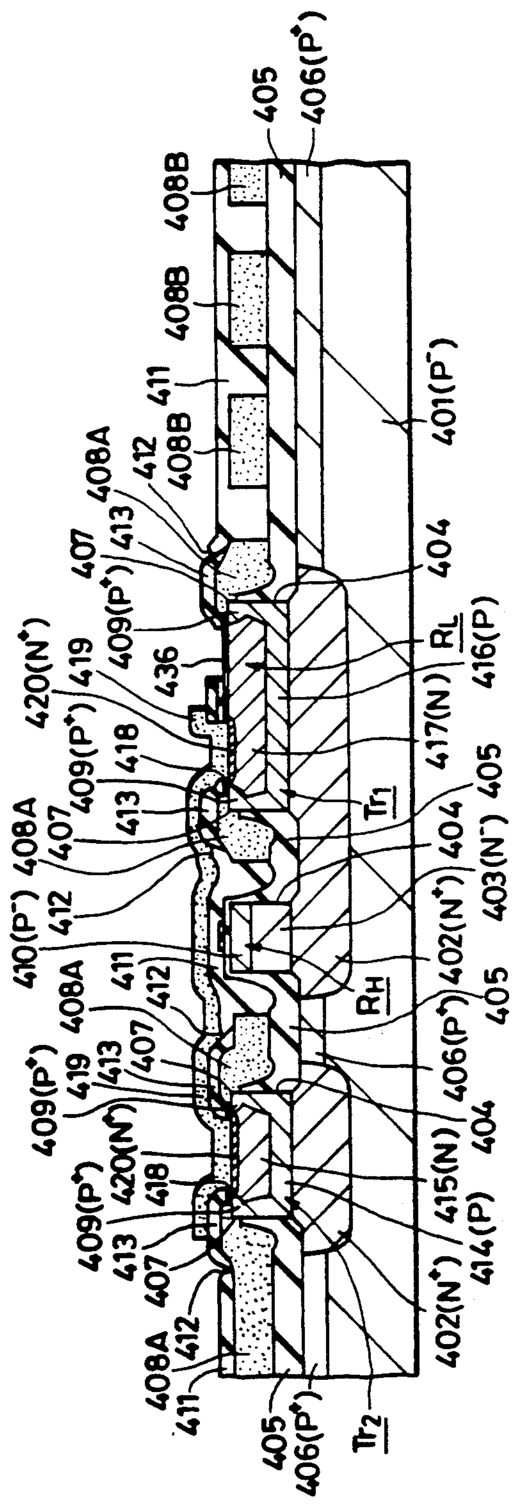

Next, as shown in FIG. 4T, the second-level electrode forming layer is patterned into a predetermined shape to thereby form an emitter lead-out electrode 419 and a collector lead-out electrodes 419. The emitter lead-out electrode 419 is connected to the emitter region (the $n^+$-type semiconductor region 420) of the forward bipolar transistor $Tr_1$. The collector lead-out electrode 419 is connected to the collector region (the $n^+$-type semiconductor region 420) of the backward bipolar transistor $Tr_2$.

Next, an interlayer insulating film 421 is formed on the whole substrate surface including the respective surfaces of the emitter and collector lead-out electrodes 419. The interlayer insulating film 421 is defined by a composite film comprising, for example, a PSG film deposited by CVD and a silicon oxide film coated thereon by SOG. The interlayer insulating film 421 has a thickness of, for example, about 3000 to 5000 [Å].

Next, the interlayer insulating film 421 is selectively removed in the region for forming the capacitance element Ca to thereby form an opening 422 through which the surface of the lower electrode 419 is exposed.

Figure 4U:
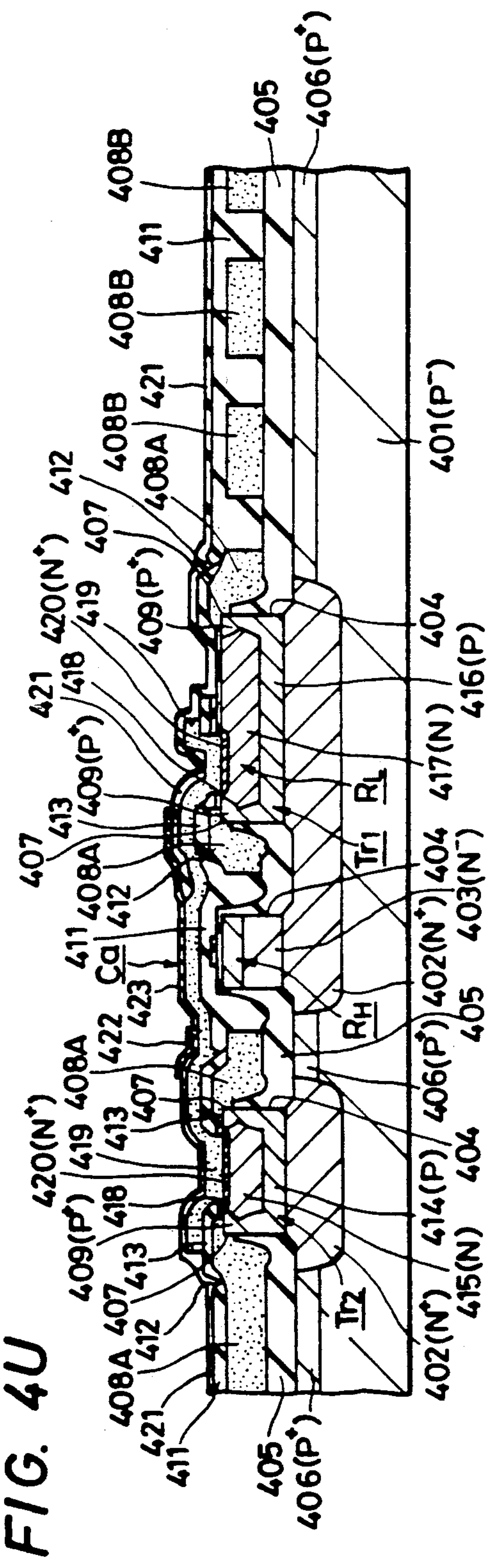

Next, a dielectric film 423 and an upper electrode 423 are successively formed on the lower electrode 419 through the opening 422 is such a manner that the dielectric film 423 is in contact with the surface of the lower electrode 419. By carrying out the step of forming the dielectric film 423 and the upper electrode 423, the capacitance element Ca is completed, as shown in FIG. 4U. The dielectric film 423 is defined by a $Ta_2O_5$ film with a thickness of about 70 to 100 [Å] which is deposited by, for example, sputtering. The upper layer 423 is defined by an $MoSi_2$ film with a thickness of about 1500 to 2500 [Å] which is deposited by, for example, sputtering. The dielectric film 423 and the upper electrode 423 are formed in the same pattern.

Next, an interlayer insulating film 424 is formed on the whole substrate surface including the surface of the capacitance element Ca. The interlayer insulating film 424 is defined by a PSG film with a thickness of about 2500 to 3500 [Å] which is deposited by, for example, CVD.

Next, the interlayer insulating film 424 and the like above the emitter lead-out electrode 419, the collector lead-out electrode 419, the base lead-out electrode 408, the n-type semiconductor region 417 and so on are removed to form contact holes 425.

Figure 4V:
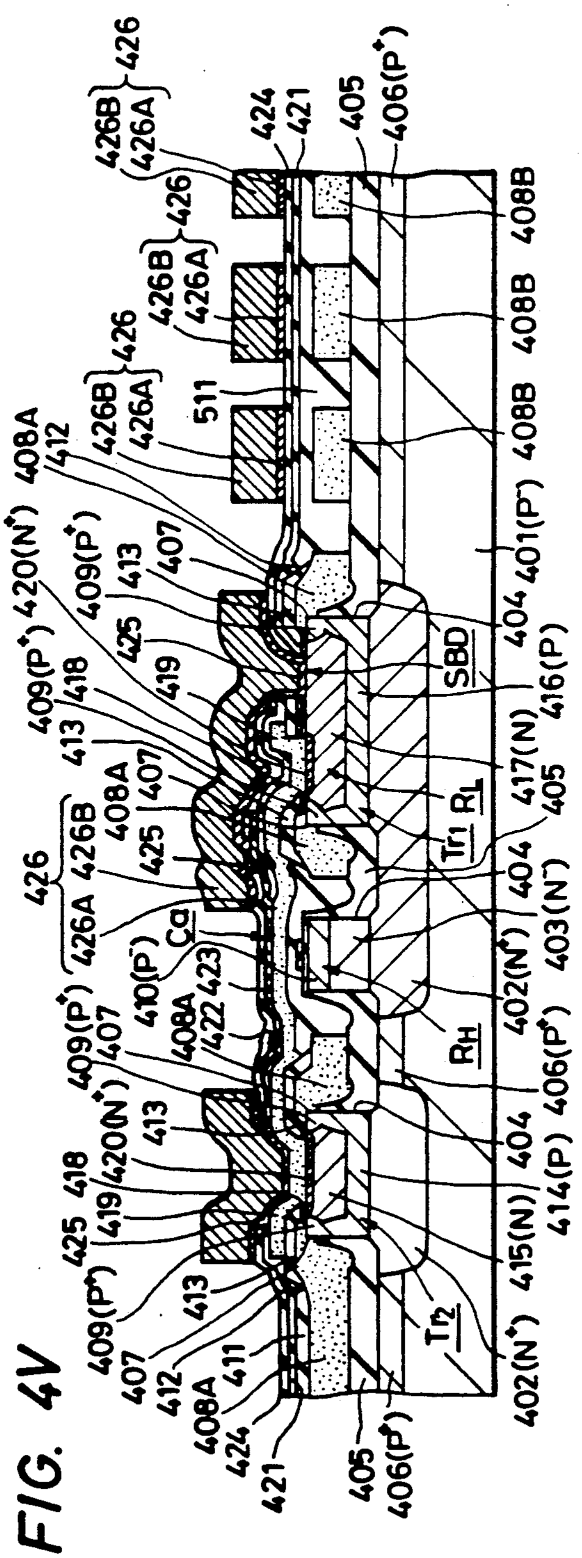

Next, as shown in FIG. 4V, first-level interconnections 426 are formed in such a manner that the interconnections 426 are respectively brought into contact with the emitter lead-out electrode 419 and the like through the respective contact holes 425. The interconnections 426 are defined by a composite film comprising, for example, a platinum silicide film 426A deposited by sputtering and an aluminum film 426B deposited thereon by sputtering. In the Schottky barrier diode forming region, the platinum silicide film 426A is brought into direct contact with the surface of the n-type semiconductor region 417 to form a Schottky barrier diode SBD.

Next, an interlayer insulating film 427, a second-level interconnection layer 428, an interlayer insulating film 429, a third-level interconnection layer 430, an interlayer insulating film 431, a fourth-level interconnection layer 432 and a passivation film 433 are successively formed. Thus, the semiconductor integrated circuit device LSI is completed, as shown in FIG. 4A.

As has been described above, in this embodiment the present invention is applied to a memory logic LSI which may be employed in the CPU of a mainframe computer shown in the foregoing third embodiment, as specifically shown in FIG. 4B. A gate array block which is formed from Al (1) to Al (4) is provided in the central portion of the semiconductor integrated circuit device LSI. A memory section which is disposed at each side of the gate array block is formed from Al (1) to Al (3). In particular, complementary data lines DL which are formed from Al (3) are arranged so as to intersect at right angles signal lines 555 formed from Al (4) which extends above the complementary data lines DL to connect together the gate array section and the I/O cells, thereby reducing the mutual coupling.

On the other hand, word liens WL which are formed from a lower Al interconnection layer and which are less affected by the coupling as in the case of this arrangement are disposed parallel with the signal lines 555. It should be noted that, although in FIG. 4B, the signal line 555, the word lines WL and the data lines DL are dispersedly shown at various memory mats for reasons of illustration, these lines are, needless to say, provided for each memory mat or each set of memory mats.

(5) Embodiment 5

Because the process for producing the films or layers above Al (2), i.e., the passivation film and Al (3), and the general layout of the final passivation and the memory gate array have been shown in the foregoing first to fourth embodiments, description thereof is omitted in the following.

The embodiment 5-I of the present invention will be description hereinunder with reference to the accompanying drawings.

Figure 5A:
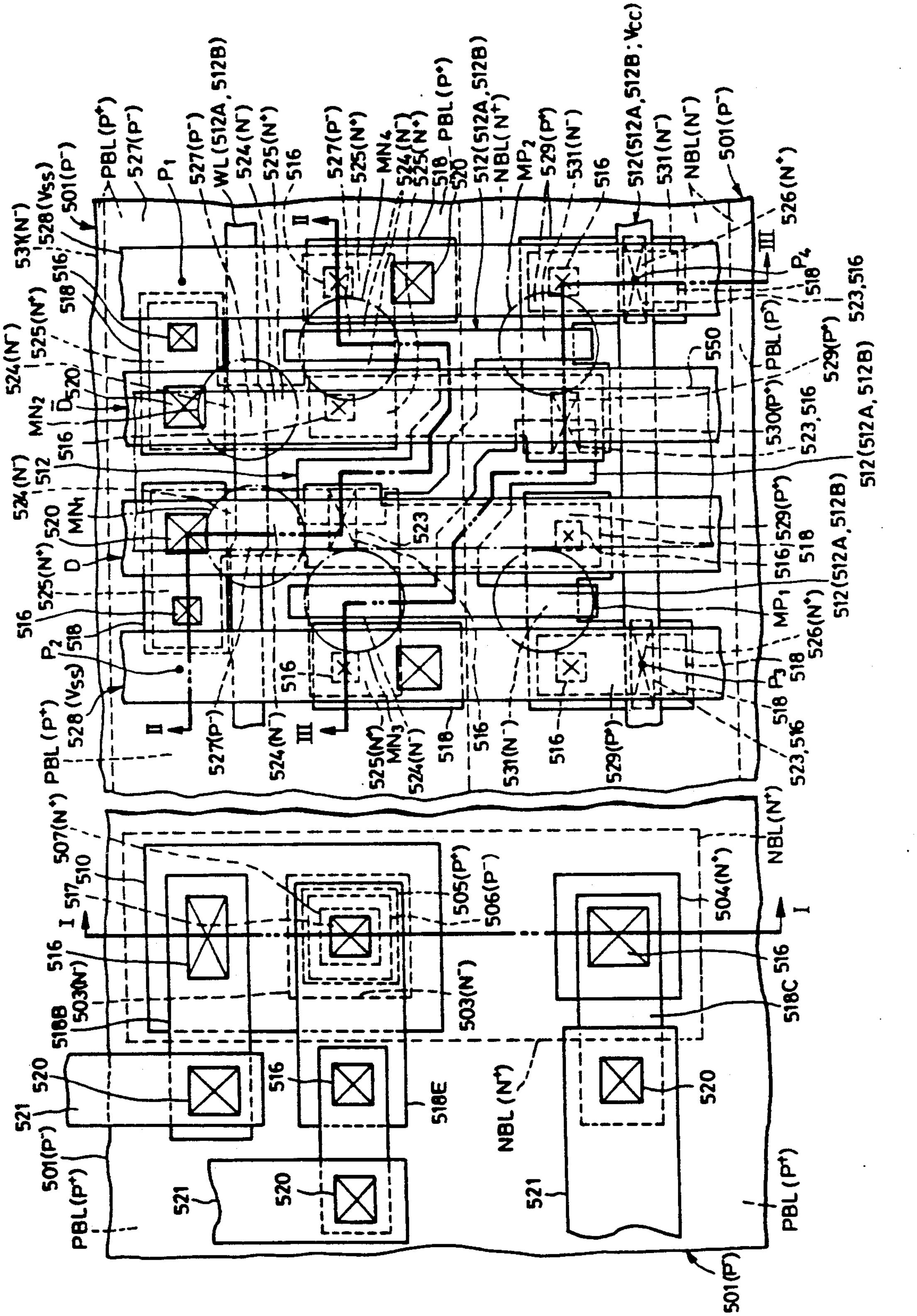
FIG. 5A is a plan view showing a bipolar transistor constituting a peripheral circuit of an SRAM and MISFET's constituting a memory cell of the SRAM according to the embodiment 5—I.

FIG. 5A is a plan view of a part of a static type random access memory (hereinafter referred to as "SRAM") to which the present invention is applied, in which: the left-hand part is a plan view of a bipolar transistor consituting a peripheral circuit (e.g., an I/O circuit, a memory peripheral circuit or the like); and the right-hand part is a plan view of two P-channel MISFETs and four N-channel MISFETs, which constitute in combination one memory cell. It should be noted that, since the gate array section that comprises CMOS circuits has already been described in the foregoing emobitments, illustration and description thereof are omitted.

Figure 5B:
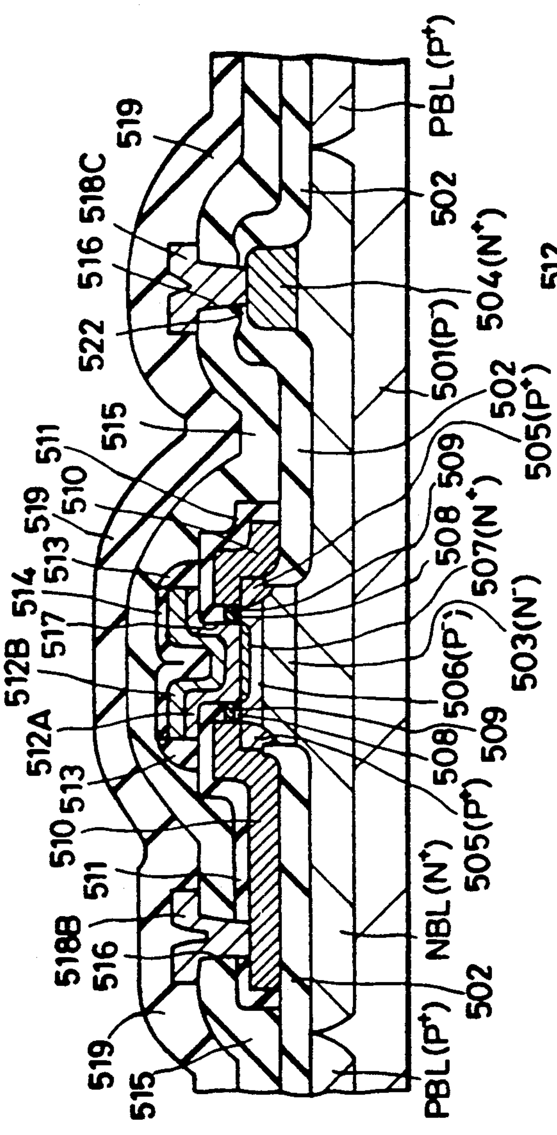
FIG. 5B is a sectional view taken along the line I—I of FIG. 5A.
Figure 5C:
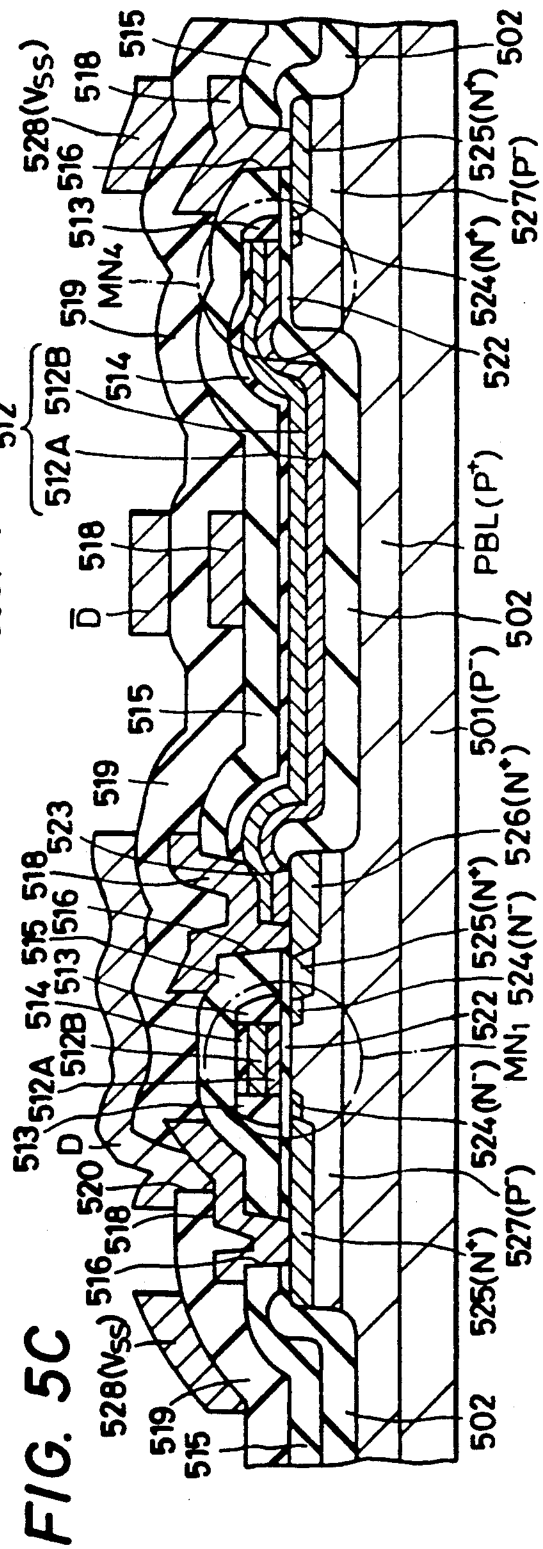
FIG. 5C is a sectional view taken along the line II—II of FIG. 5A.
Figure 5D:
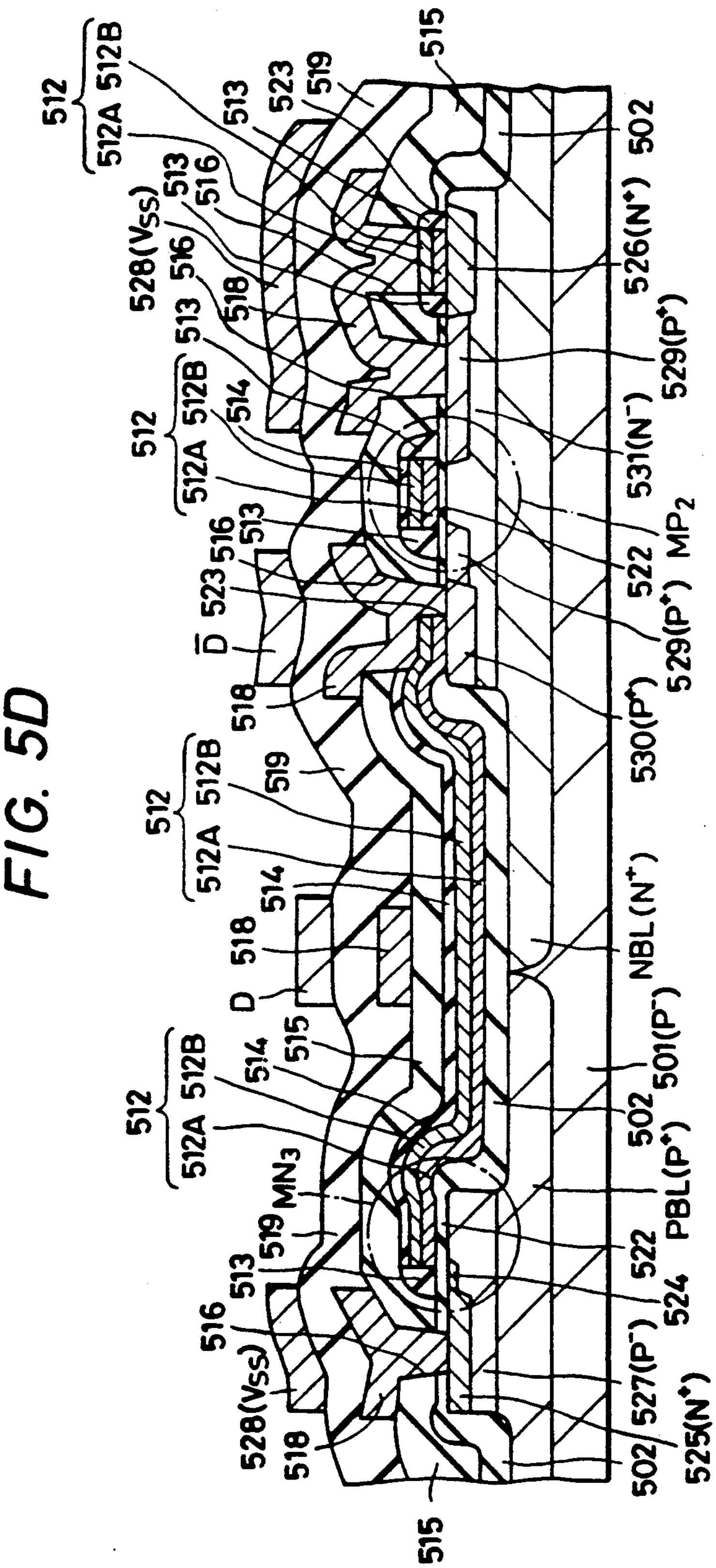
FIG. 5D is a sectional view taken along the line III—III of FIG. 5A.

FIG. 5B is a sectional view taken along the line I—I in the left-hand part of FIG. 5A;

FIG. 5C is a sectional view taken along the line II—II in the right-hand part of FIG. 5A; and FIG. 5D is a sectional view taken along the line III—III in the right-hand part of FIG. 5A.

It should be noted that no insulating films such as a field insulating film, interlayer insulating films and the like are shown in FIG. 5A with a view to facilitating understanding of the arrangement of the elements.

The arrangement of the bipolar transistor will first be explained.

Referring to the left-hand part of FIG. 5A and FIG. 5B, the reference numeral 501 denotes a substrate of $P^-$-type single crystal silicon, and an $N^+$-type buried layer NBL and a $P^+$-type buried layer PBL are formed on the surface of the substrate 501. The bipolar transistor comprises the buried layer NBL, and $N^-$-type collector region 503, an $N^+$-type collector lead-out region 504, a $P^-$-type intrinsic base region 506, a $P^+$-type semiconductor region 505 serving as a region for leading out the intrinsic base region 506, and an $N^+$-type emitter region 507. Each of the collector region 503, the intrinsic base region 506, the $P^+$-type semiconductor region 505, the emitter region 507 and the collector lead-out region 504 is formed in an epitaxial layer grown on the substrate 501. The periphery of the $N^+$-type buried layer NBL is surrounded by the $P^+$-type buried layer PBL, thereby isolating this bipolar transistor from other bipolar transistors (not shown).

As shown in FIG. 5B, the $N^-$-collector region q03, the $P^+$-type semiconductor region 505, the $P^-$-type intrinsic base region 506 and the $N^+$-type emitter region 507 are formed within the same projecting region on the buried layer NBL, that is, the substrate 501, while the $N^+$-type collector lead-out region 504 is formed in a projecting region which is different from the first projecting region. These two projecting regions are isolated from each other by a field insulating film 502 defined by a silicon oxide film which covers the surface of the substrate 501, that is, the respective surface of the buried layers NBL, PBL, a part of the side surface of the first projecting region in which are provided the collector region 503, the $P^+$-type semiconductor region 505, the intrinsic base region 6 and the emitter region 507, and the whole of the side surface of the second projecting region in which the collector lead-out region 504 is provided. A part of the $P^+$-type semiconductor region 505 is not covered with the field insulating film 502, and a base electrode 510 defined by a polycrystalline silicon film is self-alignedly connected to the exposed portion of the $P^+$-type semiconductor region 505. The exposed surface of the base electrode 510 is covered with an insulating film 511 defined by a silicon oxide film obtained by thermal oxidation of the surface of the base electrode (polycrystalline silicon film) 510. It should be noted that a silicon oxide film 508 and a silicon nitride film 509 which are formed on a part of the upper surface of the intrinsic base region 506 are the remainders of the masks employed to form the field insulating film 502 and the insulating film 511. The reference numeral 512 denotes an emitter electrode which is defined by a two-layer film comprising a polycrystalline silicon film 512A and a film 512B of a refractory metal, for example, W, Mo, Ta, Ti, Pt or the like, or a film 512B of a silicide of such a refractory metal, which is stacked on the film 512A. The upper surface of the emitter electrode 512 is covered with an insulating film 514 which is defined by a silicon oxide film formed by CVD. The emitter electrode 512 is connected to the emitter region 507 through a contact hole 517 defined by the insulating films 508, 509 and 511. A side wall 513 is deposited on the side surface of the emitter electrode 512. The side wall 513 is formed in the same manufacturing step as that for forming a side wall 513 provided on the side wall of a gate electrode of each of the MISFETs (described later). The whole surface of the substrate 501 is covered with an insulating film 515 formed by stacking a phosphor-silicate glass (PSG) film on a silicon oxide film by way of example. Interconnections 518B, 518E and 518C which are defined by a first-level aluminum film are connected to the base electrode 510, the emitter electrode 512 and the $N^+$- collector lead-out region 504 through contact holes 516, respectively. An insulating film 519 formed, for example, by stacking a spin-on-glass (SOG) film on a silicon oxide film and further stacking a PSG film thereon is provided on the insulating film 515. Predetermined portions of the insulating film 519 are removed to define contact holes 520, through which interconnections 521 defined by a second-level aluminum film are connected to the interconnections 518B, 518E and 518C, respectively.

The following is a description of the arrangement of the memory cell shown in the right-hand part of FIG. 5A and FIGS. 5C, 5D.

Each of the memory cells in this embodiment comprises complementary MISFETs, that is, P-channel MISFETs and N-channel MISFETs. An equivalent circuit of the memory cell is shown in FIG. 5R.

Referring to FIGS. 5A, 5C and 5D, one memory cell region is defined by the region within the four points $P_1$, $P_2$, $P_3$ and $P_4$.The P-channel MISFETs $MP_1$, $MP_2$ and N-channel MISFETs $MN_1$, $MN_2$, $MN_3MN_4$, which constitute in combination one memory cell, are shown by the respective one-dot chain line circles.

Each of N-channel MISFETs $MN_1$, $Mn_2$, $MN_3$, $MN_4$ is formed on the principal surface of a $P^-$-well region 527 provided on the $P^+$-type buried layer PBL. On the other hand, each of the P-channel MISFETs $MP_1$, $MP_2$ is formed on the principal surface of an $N^-$- well region 531 provided on the $N^+$-type buried layer NBL. Each of the N-channel MISFETs $MN_1$, $MN_2$, $MN_3$, $MN_4$ comprises a gate insulating film 522 defined by a silicon oxide film formed by thermal oxidation of the surface of the $P^-$-well region 527, a gate electrode 512 formed by stacking on a polycrystalline silicon film 512A a film 512B of a refractory metal, for example, W, Mo, Ta, Ti, Pt or the like, or a film 512B of a silicide of such a refractory metal, and $N^-$-and $N^+$-type semiconductor regions 524, 525 constituting in combination source and drain regions. The gate electrode 512 is defined by the same alyer as that for the emitter electrode 512 of the bipolar transistor. The distance between the gate electrode 512 and the $N^+$-type semiconductor region 525 is determined by a side wall 513 defined by a silicon oxide film. The polycrystalline silicon film 512A of the gate electrode 512 of each of N-channel MISFETs $MN_1$, $Mn_2$, $Mn_3$, $Mn_4$ has an N-type impurity, e.g., phosphorus or arsenic, introduced thereinto so as to be of the N type. The gate electrodes 512 of the N-channel MISFETs $MN_1$, $MN_2$ are formed integral with a word line WL extending on the field insulating film 502. An $N^+$-type semiconductor region 526 is provided in the vicinity of the MISFET $MN_1$. The $N^+$-type semiconductor region 526 is formed by diffusing into the wall region 527 the N-type impurity introduced in the polycrystalline silicon film 512A of the gate electrode 512 of the MISFET $MN_4$ which is extended on the field insulating film 502. An opening 523 is provided in the gate insulating film 522 above the $N^+$-type semiconductor region 526, and the gate electrode 512 is electrically connected to the region 526 thorugh this opening 523. The upper surface of the gate electrode 512 is covered with an insulating film 514 defined by a silicon oxide film.

The $P^-$-well region 527 in which is provided each of the N-channel MISFETs $MN_1$, $Mn_2$, $MN_3$, $MN^4$ projects from the surface of teh $P^+$-type buried layer PBL, (that is, the surface of the substrate 501), in the same way as in the case of the collector region 503. the $P^+$-type semiconductor region 505, the intrinsic base region 506, the emitter region 507 and the collector lead-out region 504 of the bipolar transistor.

Each of the P-channel MISFETs $MP_1$, $MP_2$ is formed on the principal surface of an $N^-$-well region 531 provided on the surface of the $N^-$-type buried layer NBL, that is, the surface of the substrate 501, and comprises a gate insulating film 522 defined by a silicon oxide film formed by thermal oxidation of the surface of the $N^-$-well region 531, a gate electrode 512 formed by stacking on a polycrystalline silicon film 512A a film 512B of a refractory metal or a refractory metal silicide, and $P^+$-type semiconductor regions 529 constituting source and drain regions. The gate electrode 512 of each of the P-channel MISFETs $MP_1$, $MP_2$ has a P-type impurity, e.g., boron, introduced thereinto so as to be of the P-type. An opening 523 is provided in the vicinity of the P-channel MISFET $MP_2$, and the gate electrode 512 extending from the N-channel MISFET $MN_3$ is connected to the well region 531 through this opening 523. That portion of the surface of the well region 531 which is connected with the gate electrode 512 is formed into a $P^+$-type semiconductor region 530 by diffusion of a P-type impurity, e.g., boron, introduced in the polycrystalline silicon film 512A.

The $N^-$- well region 531 in which each P-channel MISFET is formed projects from the surface of the $N^+$-type buried layer NBL, that is, the surface of the substrate 501, in the same way as in the case of the $P^-$-well region 527 in which is formed each of the N-channel MISFETs $MN_1$, $MN_2$, $MN_3$, $Mn_4$.

As shown in FIG. 5A, the $N^+$-buried layer NBL and the $P^+$-buried layer PBL in the memory cell region extend in the direction in which word lines Wl extend, that is, in the direction which intersect date lines D and $\overline{D}$. Further, the $N^+$-buried layer NBL and the $P^+$-buried layer PBL are alternately disposed in the direction in which the data liens D and $\overline{D}$ extend. The N-channel MISFETs $MN_1$ and $MN_3$ are formed in the same $P^-$-well region 527, while the N-channel MISFETs $MN_2$ and $MN_4$ are formed in the same $P^-$-well region 527. On the other hand, The P-channel MISFETs $MP_1$, $MP_2$ are formed in the respective $N^-$-well regions 531. These four well regions 527 and 531 are isolated from each other by the field insulating film 502, the $N^+$-buried layer NBL and the $P^+$-buried layer PBL. In other words, the MISFETs are isolated from each other in the same way as in the isolation between the bipolar transistors. An interconnection 512 which is defined by the same layer as that for the word line WL, the gate electrode 512 and the emitter electrode 512 is connected to each $N^-$-well region 531 through the opening 523, and a power supply voltage Vcc, e.g., 5 V, is applied thereto through this interconnection 512. In other words, the power supply voltage Vcc is applied within the memory cell. The polycrystalline silicon film 512A constituting the interconnection 512 has an N-type inpurity, e.g., phosphorus or arsenic, introduced thereinto so as to be of the N-type. An $N^+$-type semiconductor region 526 is formed in that portion of the surface of the well region 531 which is connected with the interconnection 512 by diffusion of the N-type impurity introduced in the polycrystalline silicon film 512A. The $P^-$-well region 527 is fed by applying a ground potential Vss, e.g., 0 V, of the circuit to the $P^+$-buried layer PBL from a second-level aluminum interconnection (not shown) which is provided every predetermined number of memory cells, e.g., 4, 8 or 16 cells, so as to extend in the same direction as the data lines D and $\overline{D}$. The second-level interconnections for applying the ground potential Vss are connected together between memory cells. A $P^-$-well region 527 which is isoalted from other $P^-$-well regions 527 is provided on that portion of the $P^+$-buried layer PBL to which is connected the interconnection for the ground potential Vss, so that the ground potential Vss is fed to the $P^+$-buried layer PBL through this $P^-$-well region 527 and further fed to the $P^-$-well regions 527 in which the P-channel MISFETs $MP_1$ and $MP_2$ are formed, respectively. A $P_-$-type semiconductor region is formed in that portion of the surface of the $P^-$-well region 527 to which is connected the aluminum interconnection for feeding the ground potential Vss, in the same manufacturing step as that for the source and drain regions 529 of the P-channel MISFETs $MP_1$ and $MP_2$.

The reference numerals 518 denote first-level aluminum interconnections which are respectively connected through contact holes 516 to the upper surfaces of the gate electrodes 512 and the upper surfaces of the $N^{+}$-and $P^{+}$-type semiconductor regions 525, 529 which define the source and drain regions. The data lines D and $\overline{D}$are defined by a second-level aluminum film and connected to the interconnections 518 provided on the respective first $N^{+}$- semiconductor regions 525 of the N-channel MISFETs $MN_1$ and $MN_2$ through respective contact holes 520 formed by partially removing the insulating film 519. The $N^{+}$-type semiconductor region 525 which constitutes a part of the source region of each of the N-channel MISFETs $MN_3$ and $Mn_4$ is connected with a ground potential interconnection 528 defined by the second-level aluminum film through the corresponding contact hole 520, aluminum wiring 518 and contact hole 516.

As described above, according to this embodiment, the $N^{-}$-well region 531 in which is formed each of the N-channel MISFETs $MN_1$, $Mn_2$, $Mn_3$ , $MN^4$ and the $p^{-}$-well region 527 in which is formed each of the P-channel MISFETs $MP_1$, $MP_2$ are designed to have a structure which is similar to that of the projecting region in which are formed the collector region 503, intrinsic base region 506, $P^{+}$-type semiconductor region 505 and emitter region 507 fo each bipolar transistor and the structure of the projecting region in which the collector lead-out region 504 is formed. Thus, it is possible to inolate the MISFETs from each other by means of the field insulating film 502 and the P-N junction between the $N^{+}$- buried layer NBL and $P^{+}$-buried layer PBL in the same way as in the isolation between the bipolar transistors.

The manufacturing process according to this embodiment will next be described.

Figure 5E:
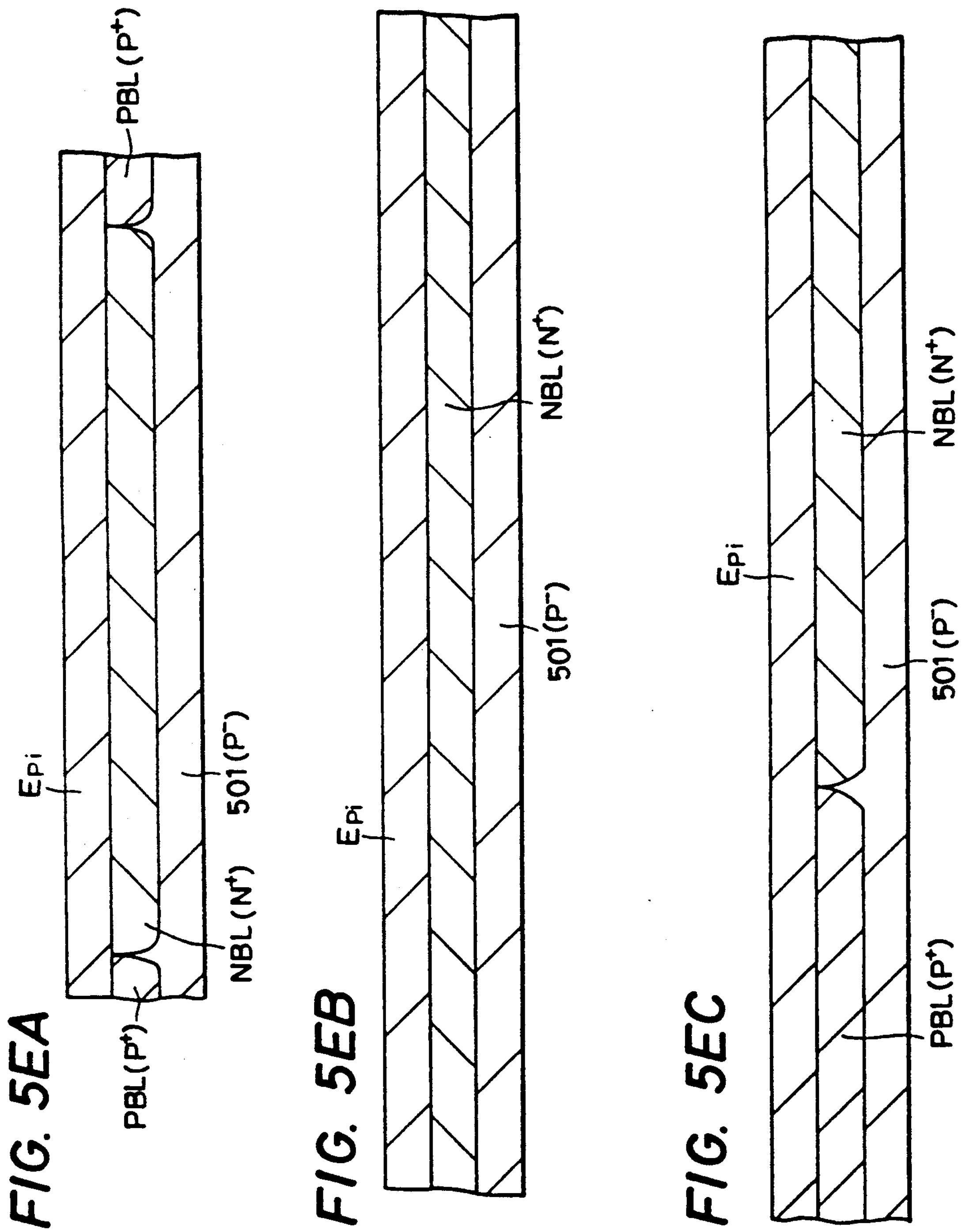
FIGS. 5EA to 5PC are plan or sectional views showing the process for producing the embodiment 5—I.

FIGS. 5EA to 5PC are plan or sectional views showing the steps in the process for producing a semiconductor integrated circuit device according to this embodiment. It should be noted that each of the numbers of these figures consists of an Arabic numeral and letters in the alphabet, e.g., FIGS. 5EA, 5EB and 5EC, and the first alphabet letter denotes the same section or sectional views in the same step, while the second alphabet letter A denotes the section of the same portion as that shown in FIG. 5B, B the section of the same portion as that shown in FIG. 5C, and C the section of the same portion as that shown in FIG. 5D.

As shown in FIGS. 5EA, 5EB and 5EC, an $N^{+}$- buried layer NBL and a $P^{+}$-type buried layer PBL are formed on the surface of a $P^{-}$-type single crystal silicon substrate 501 by introducing an N-type impurity, e.g., antimony or phosphorus, and a P-type impurity, e.g., boron, respectively, by means, for example, of ion implantation. Thereafter, an epitaxial layer Epi is grown.

Figure 5F:
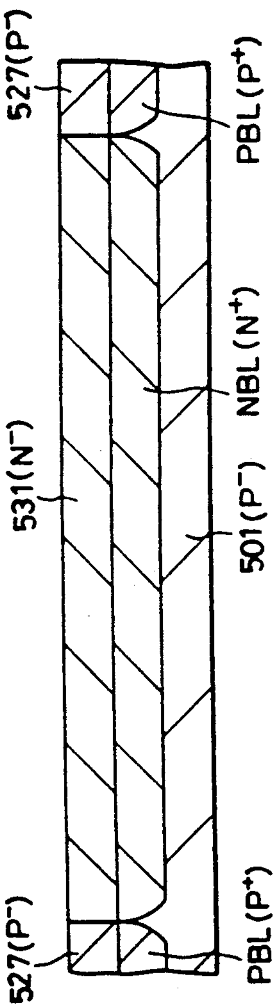
Figure 5F:
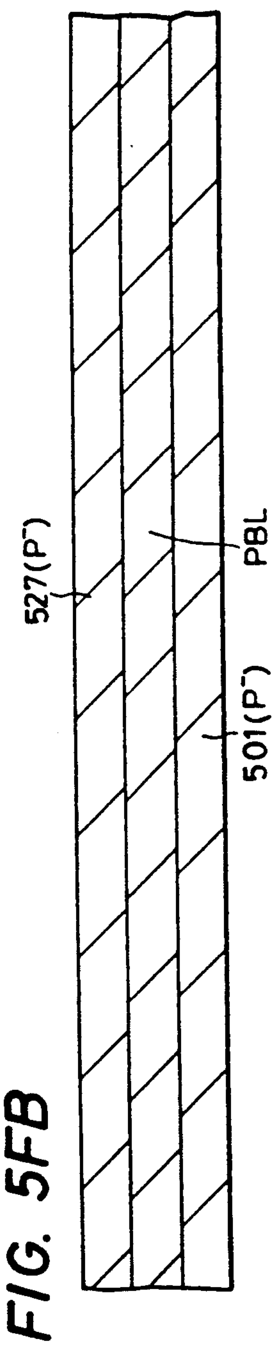
Figure 5F:
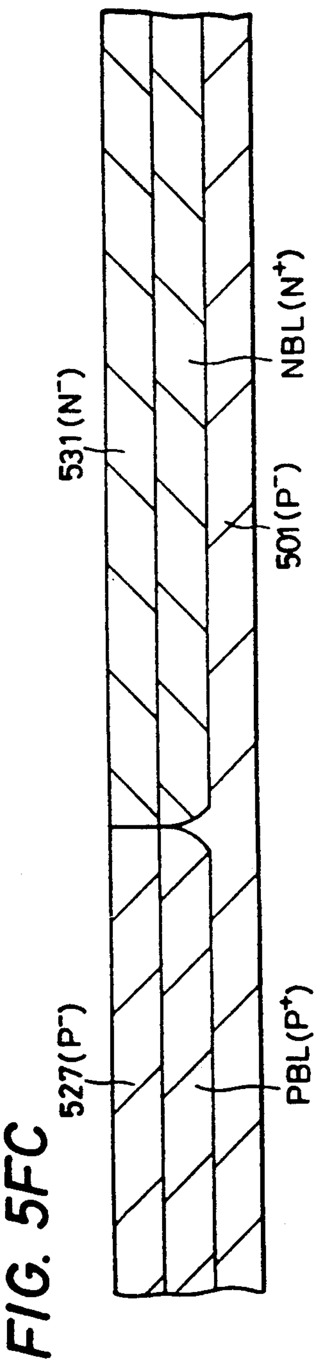

Next, as shown in FIGS. 5FA, 5FB and 5FC, $N^{-}$-well regions 531 and $P^{-}$-well regions 527 are formed in the epitaxial layer Epi bu introducing an N-type impurity, e.g., antimony or phosphorus,l and a P-type impurity, e.g., boron, respectively, by means, for example, of ion implantation employing a mask defined by a resist film by way of example.

Figure 5G:
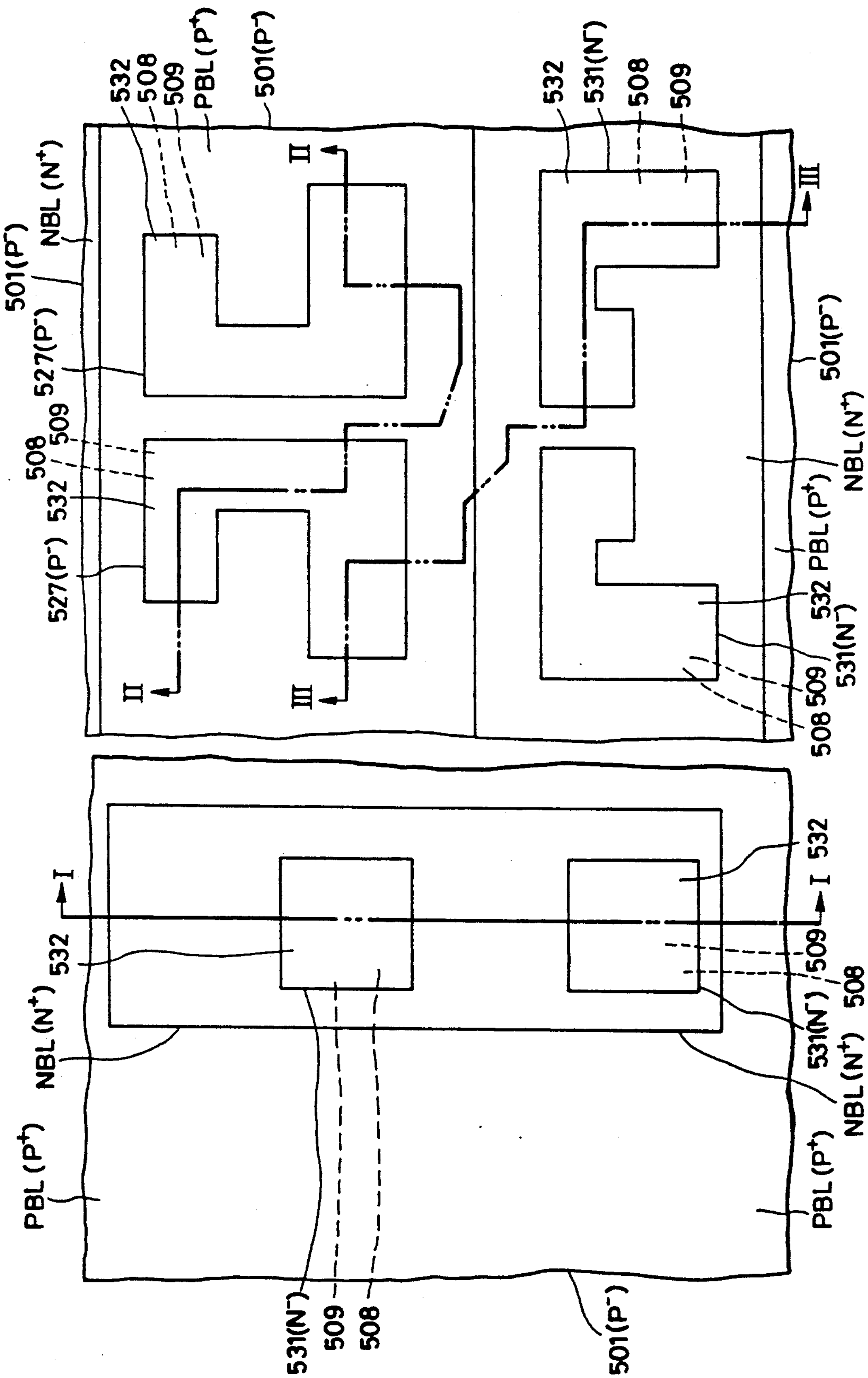
Figure 5H:
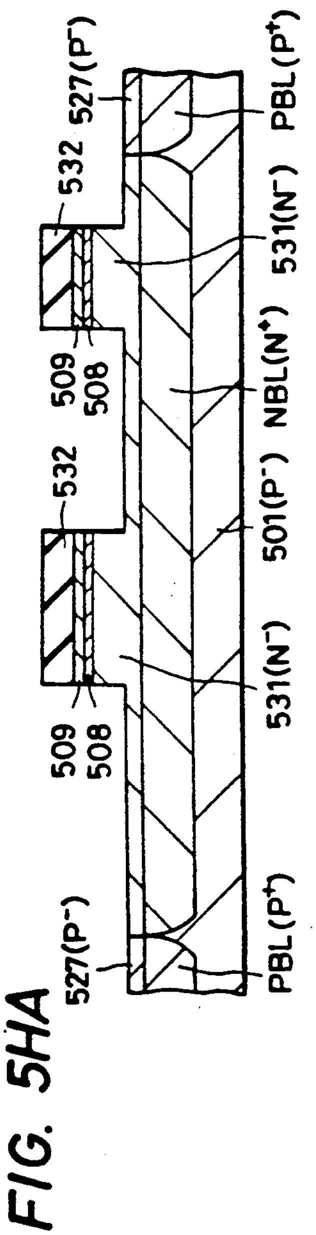
Figure 5H:
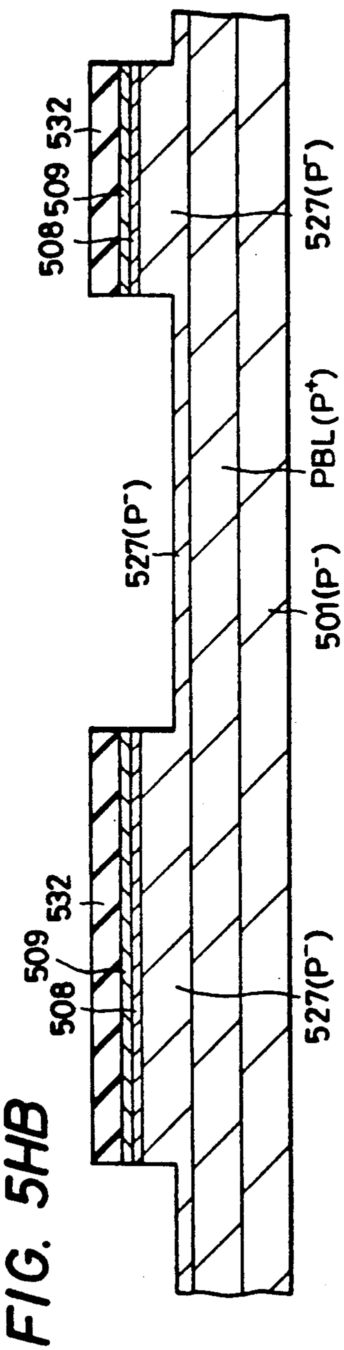
Figure 5H:
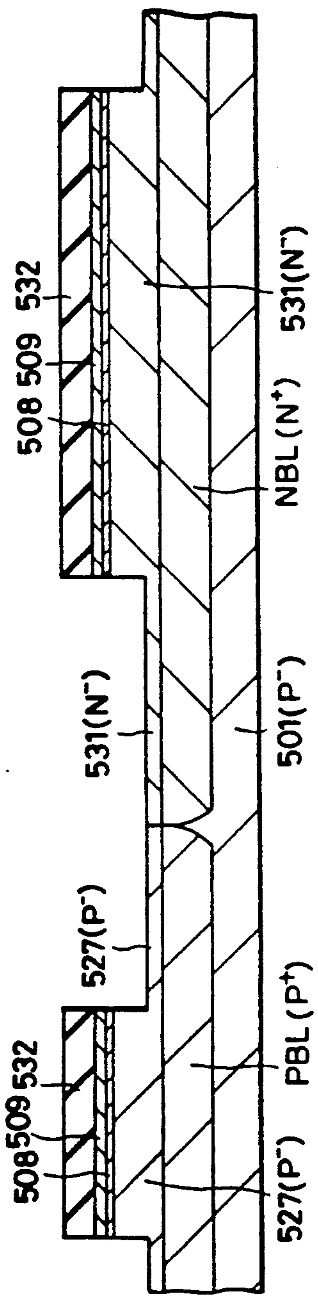
Figure 51A:
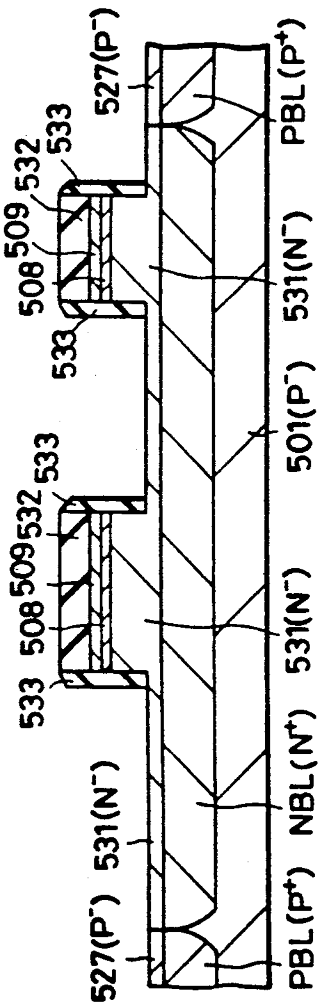
Figure 51B:
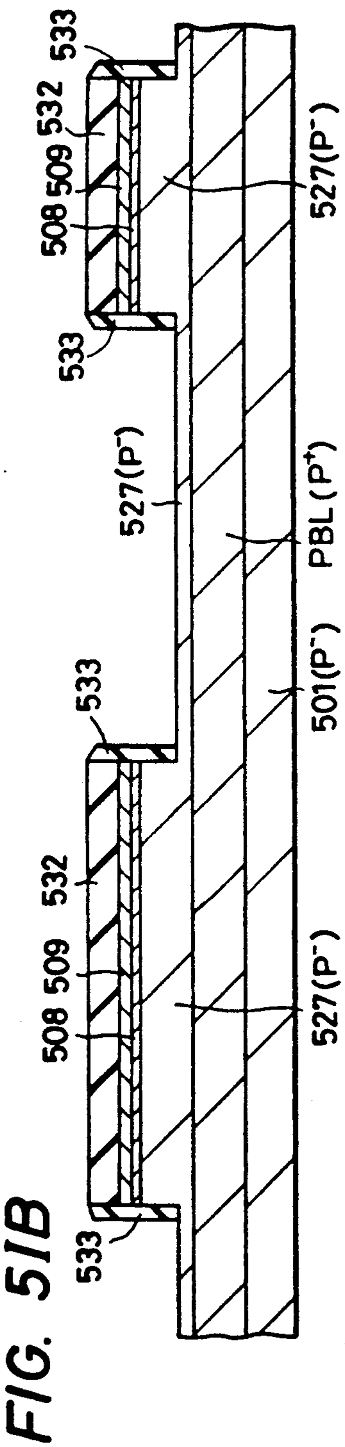
Figure 51C:
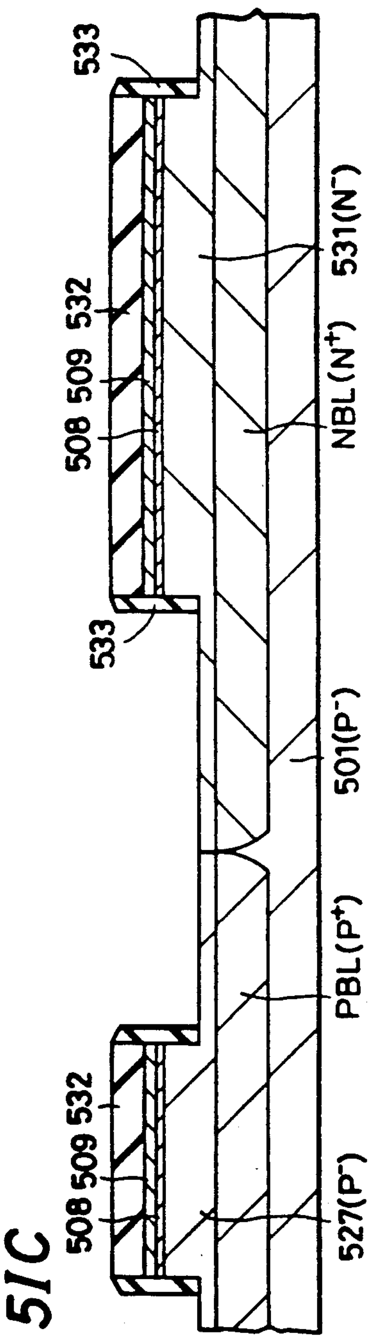

Next, as shown in FIGS. 5G, 5HA, 5HB and 5HC, the whole surfaces of the well regions 527 and 531 are subjected to thermal oxidation to form a silicon oxide film 508, and a silicon nitride film 509 and a silicon oxide film 532 are successively formed on the film 508 by , for example, CVD. The silicon oxide film 532, the silicon nitride film 509 and the silicon oxide film 508 are etched by, for example, reactive ion etching (RIE) employing a mask defined by a resist film so that the stack of said films is left in predetermined patterns, that is, patterns of the following three regions: a projecting region (first region) in which are provided the collector region 503, $P^{+}$-semiconductor region 505, intrinsic base region 506 and emittr region 507 of each bipolar transistor; a projecting region (second region) in which is provided the collector lead-out region 504 of each bipolar transistor; and a projecting region (third region) in which is provided each of the N- and P-channel MISFETs $MN_1$, $MN_2$, $MN_3$, $MN_4$, $MP_1$ and $MP_2$. The projecting regions may also be formed by employing a wet etching in place of RIE. After this etching, the mask defined by a resist film is removed. Next, that portion of the surface of each of the $P^{-}$-and $N^{-}$-well regions 527 and 531 which is not covered with the corresponding stack of the silicon oxide film 532, the silicon nitride film 509 and the silicon oxide film 508 is etched to a predetermined depth by RIE so that that portion of said surface which is covered with the stack of the films 532, 509 and 508 projects from the surface Said predetermined depth is such a depth that, when the field insulating film 502 is formed later, the bottom of the film 502 reaches the buried layers WBL and PBL.

Next, as shown in FIGS. 5IA, 5IB and 5IC, a silicon nitride film 533 is formed by, for example, CVD, so that the whole surfaces of the well regions 527 and 531 are covered with the film 533, and then this silicon nitride film 533 is etched by RIE until the upper surfaces of the well regions 527 and 531 are exposed, thereby forming a side wall defined by the silicon nitride film 533 (hereinafter referred to as the "side wall 533") on the side surface of the stack of the silicon oxide film 508, the silicon nitride film 509 and the silicon oxide film 532 in each of the projecting well regions 527 and 531.

Figure 5J:
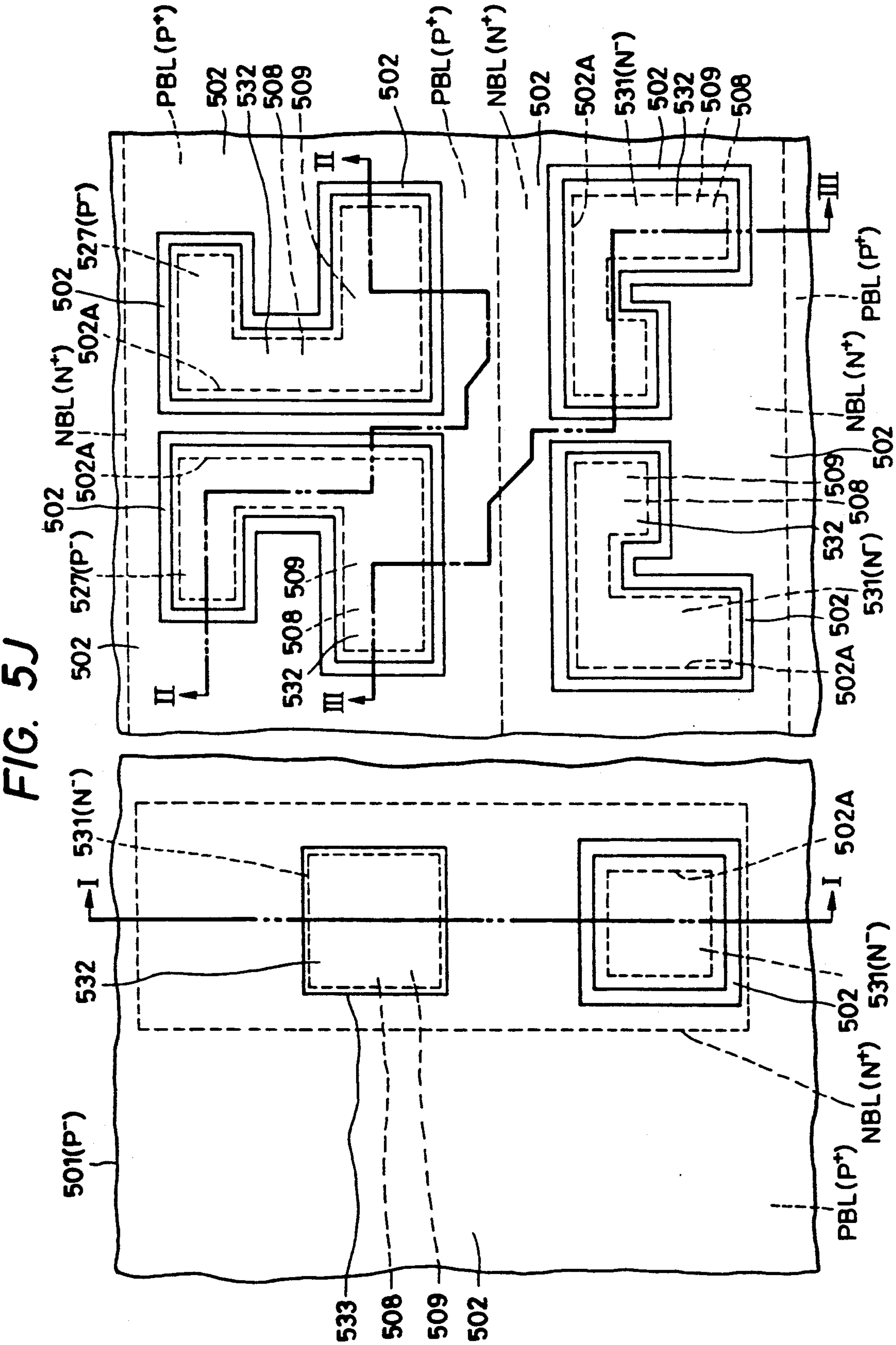
Figure 5K:
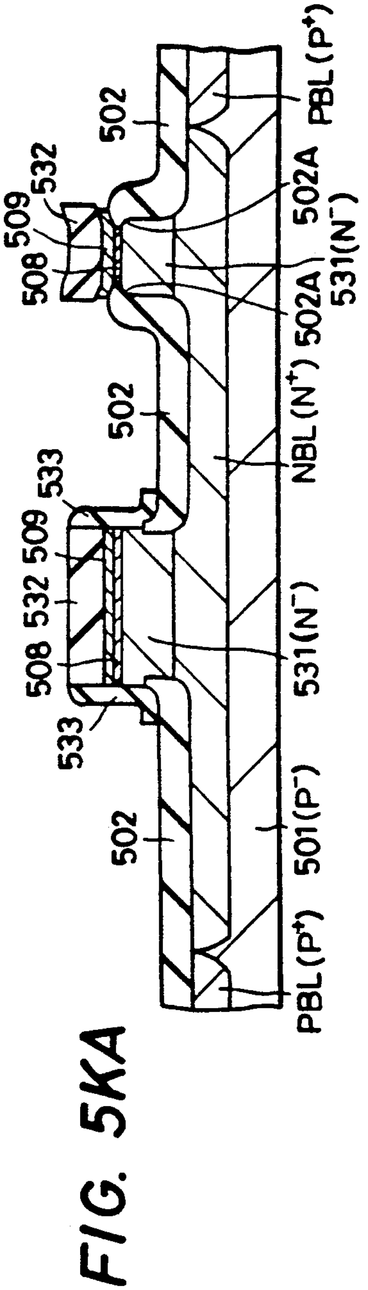
Figure 5K:
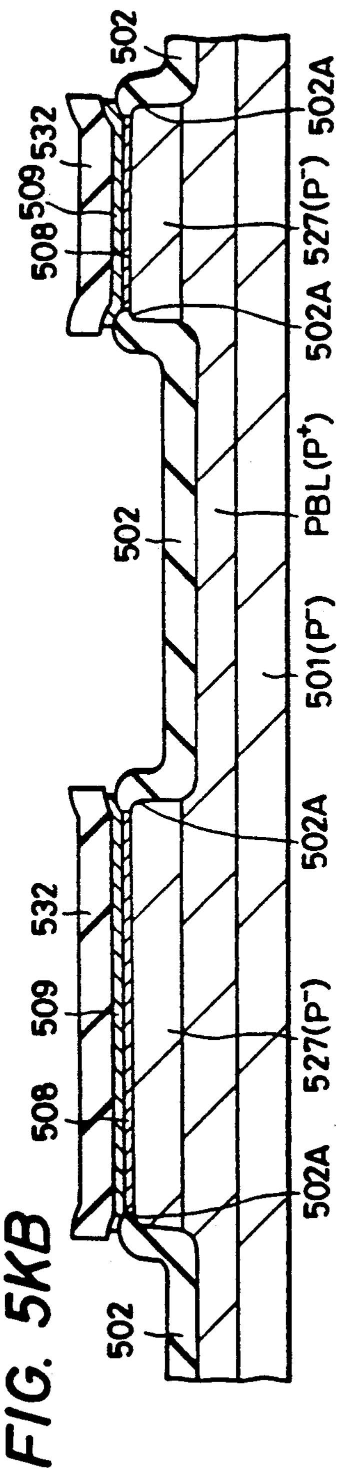
Figure 5K:
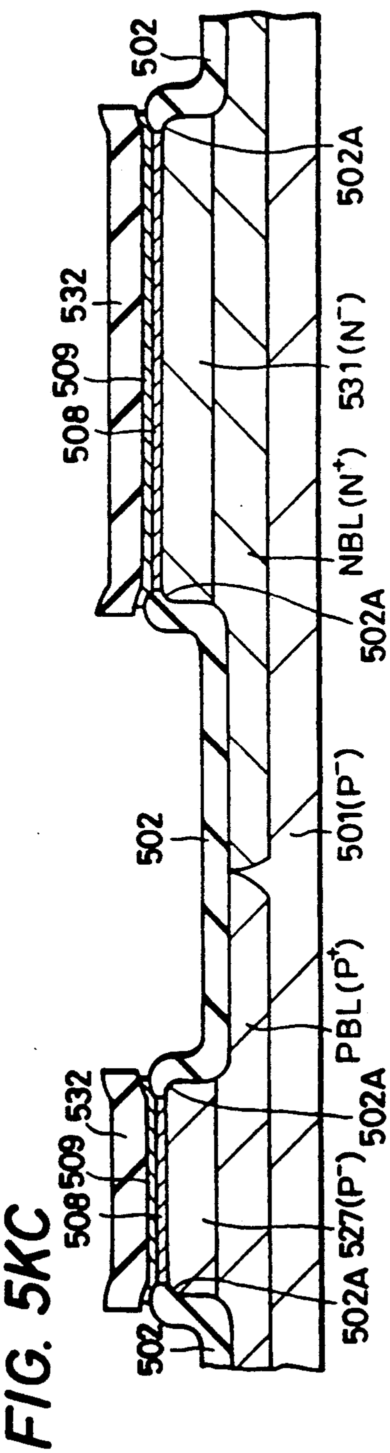

Next, as shown in FIGS. 5J, 5KA, 5KB and 5KC, the projecting region in which are formed the collector region 503, $P^{+}$-semiconductor region 505, intrinsic base region 506 and emitter region 507 of the bipolarg transistor is covered with a mask defined by a resist film, and the side walls 533 which are not covered with this mask are then removed. The mask defined by a resit film is removed after the selective removal of the side walls 533. Next, the surface of each $P_{-}$-well region 527 which is not covered with the stack of the silicon oxide film 532, the silicon nitride film 509 and the silicon oxide film 508 and the surface of each $N^{-}$-well region 531 which is not covered with the side wall 533 nor the stack of the silicon oxide film 532, the silicon nitride film 509 and the silicon oxide film 508 are subjected to thermal oxidation to form a field insulating film 502 which is defined by a silicon oxide film. Since the bottom of the field insulating film 502 reaches the buried layers NBL and PBL, the projecting portion which has its upper surface covered with the stack of the silicon oxide film 532, the silicon nitride film 509 and the silicon oxide film 508 is left alone in each of the $P^{-}$-and $N^{-}$-well regions 527 and 531.

The configuration of the field insulating film 502 at the n- and P-channel MISFETs $MN_1$, $MN_2$, $MN_3$, $MN_4$, $MP_1$, $MP_2$ is the same as that of the field insulating film 502 at the projecting region in which is formed the collector lead-out region 504 of the bipolar transistor. Thus, isolation between the MISFETs and between the MISFETs and the bipolar transistors is carried out in the same manufacturing step as that for the isolation between the bipolar transistors. It should be noted that the reference numeral 502A in FIG. 5J denotes "bird's beaks" of the field insulating film 502.

After the formation of the field insulating film 502, a mask defined by a resist film having a pattern which leaves the side wall 533 exposed is formed on the buried layers NBL and PBL, and the side wall 533 is removed by etching. During this etching, the side surface of the silicon nitride film 509 which is not covered with this resist mask, that is, the silicon nitride film 509 on the projecting region in which are formed the collector region 503, the $p^+$-type semiconductor region 505, the intrinsic base region 506 and the emitter region 507, and the film 509 is thus recessed. After the removal of the side wall 533, the resist mask employed in the etching is removed.

Figure 5L:
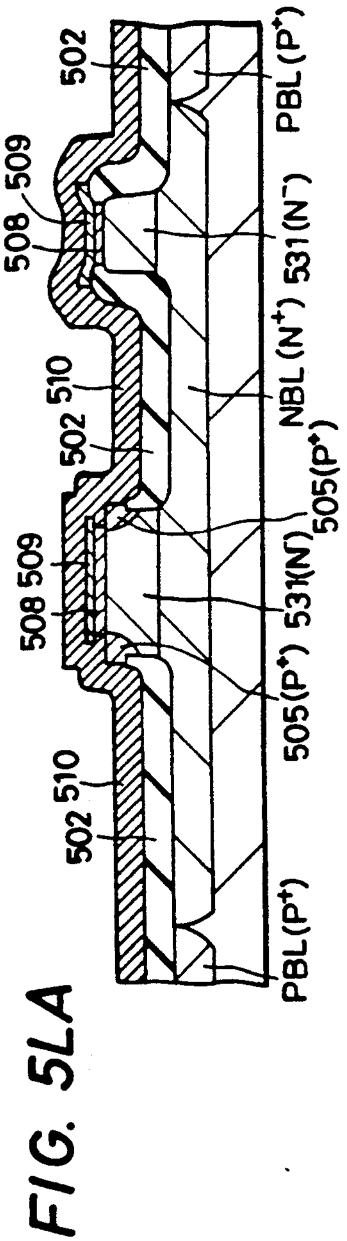
Figure 5L:
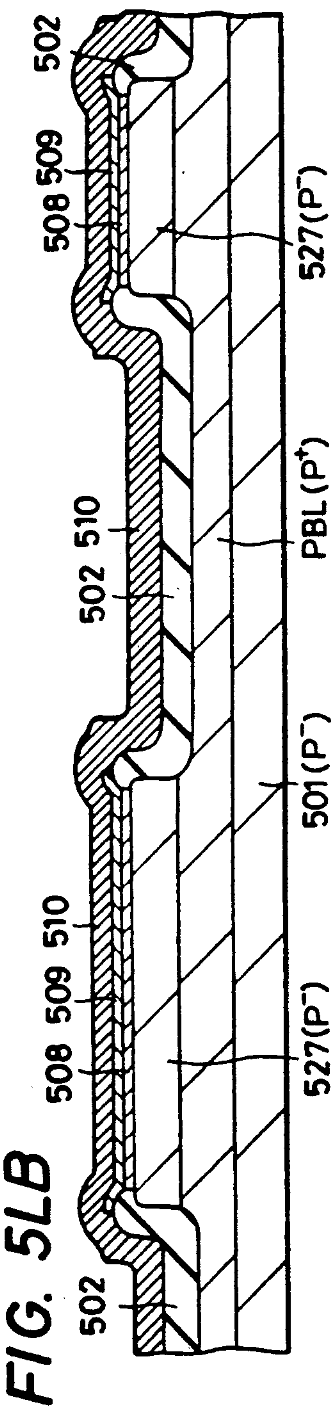
Figure 5L:
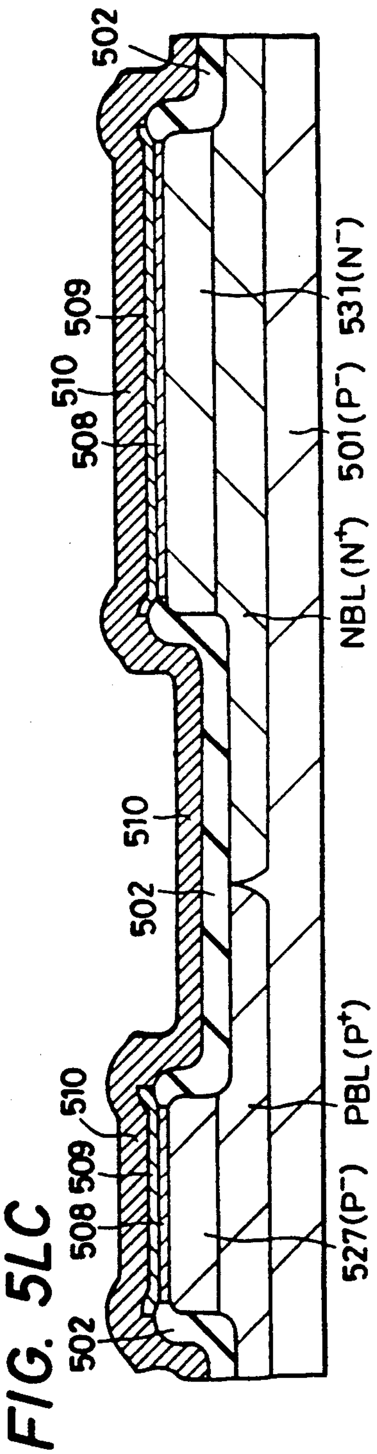

Next, as shown in FIGS. 5LA, 5LB and 5LC, the silicon oxide films 532 are first removed, and etching is then carried out using a mask defined by a resist film having a pattern which leaves uncovered the projecting region in which are formed the collector region 503, the $P^-$-type semiconductor region 505, the intrinsic base region 506 and the emitter region 507 to thereby recess the side surface of the silicon oxide film 508 which is not covered with this mask. Thereafter, the resist mask is removed. Next, a polycrystalline silicon film 510 is formed on the whole surfaces of the buried layers NBL and PBL by, for example, CVD. Next, a P-type impurity, for example, boron, is introduced into the polycrystalline silicon film 510 by, for example, ion implantation, and then annealing is conducted. At this time, the P-type impurity in the polycrystalline silicon film 510 is introduced into the side surface of the $N^{--}$-well region 531 on which the film 510 is deposited to form a $p^+$-semiconductor region 505.

Figure 5M:
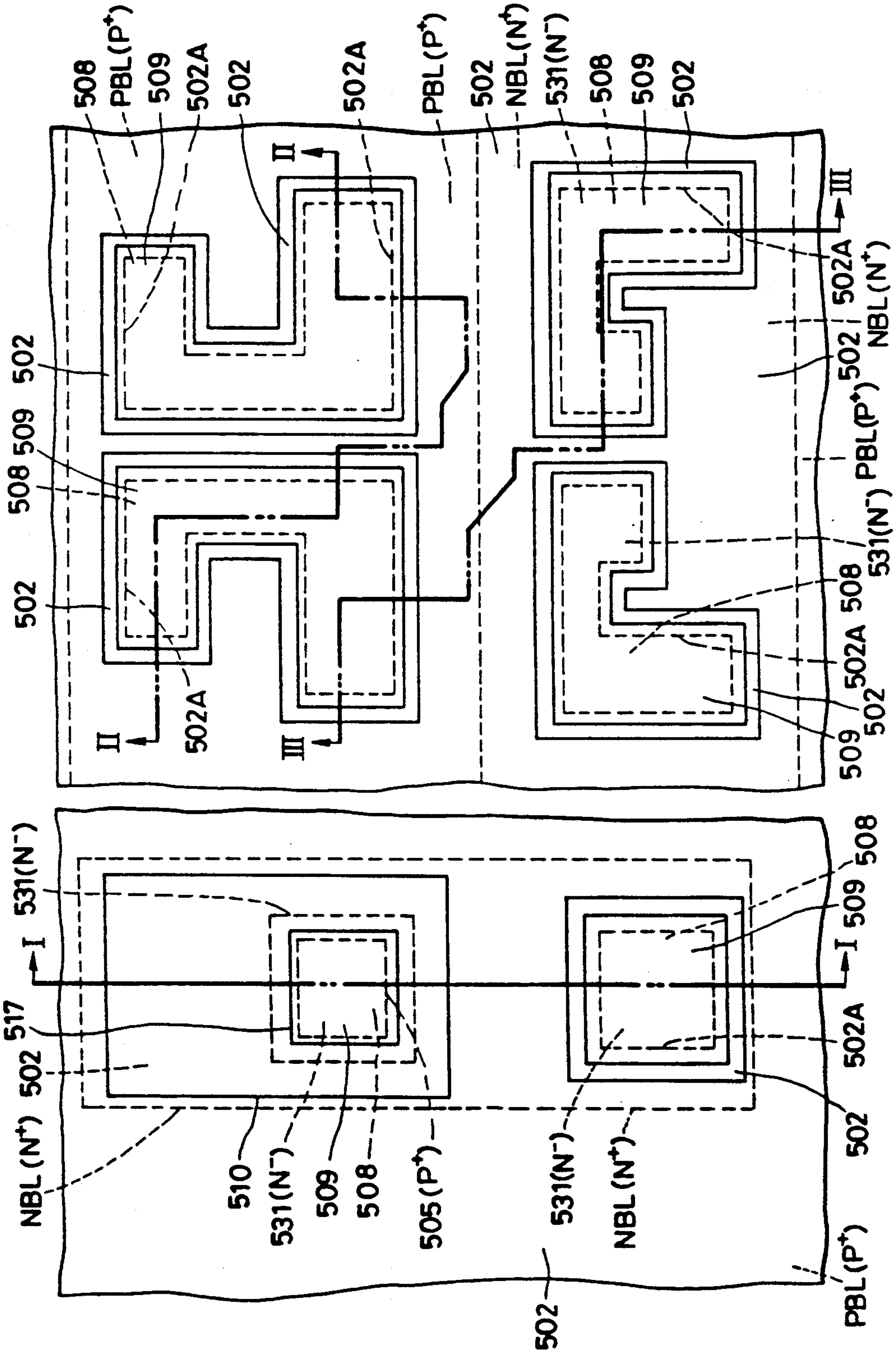
Figure 5N:
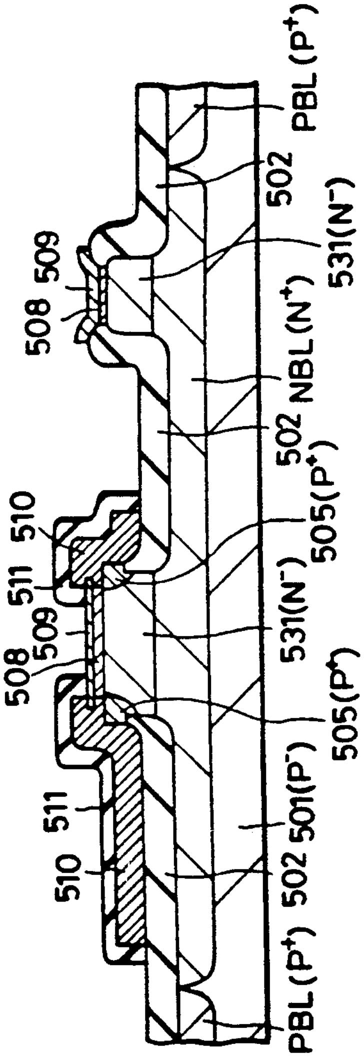
Figure 5N:
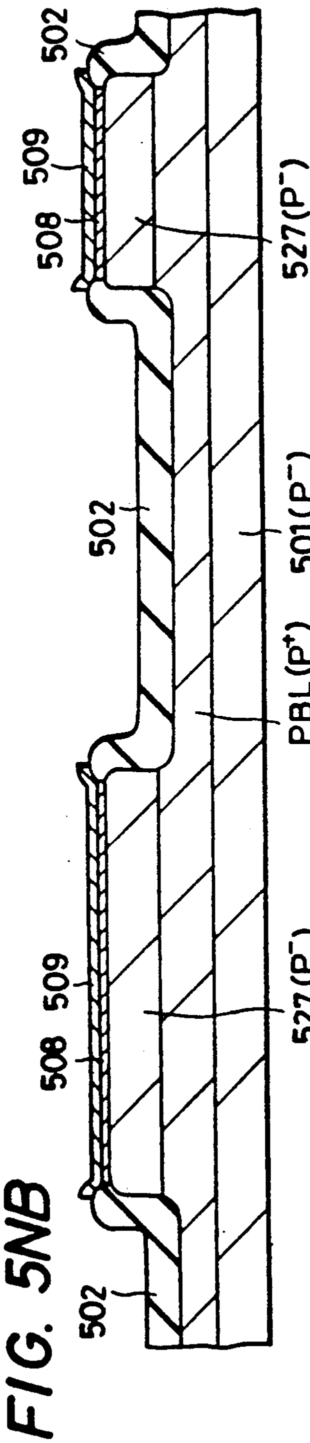
Figure 5N:
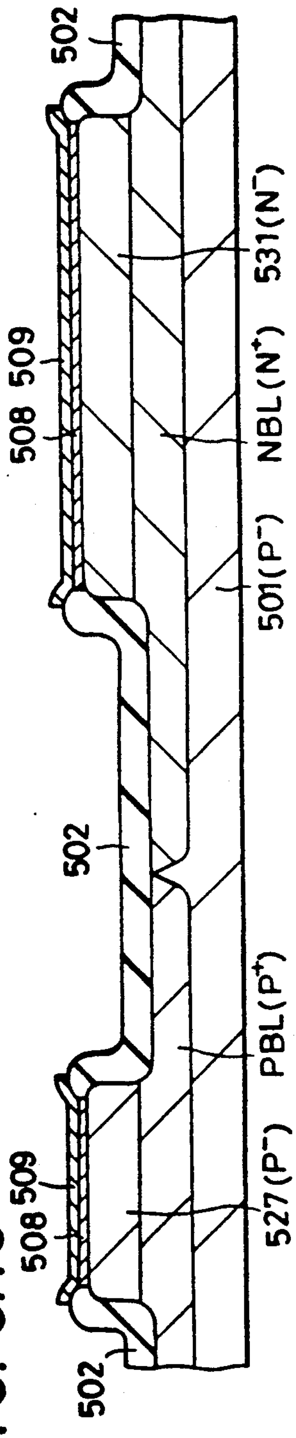
Figure 50:
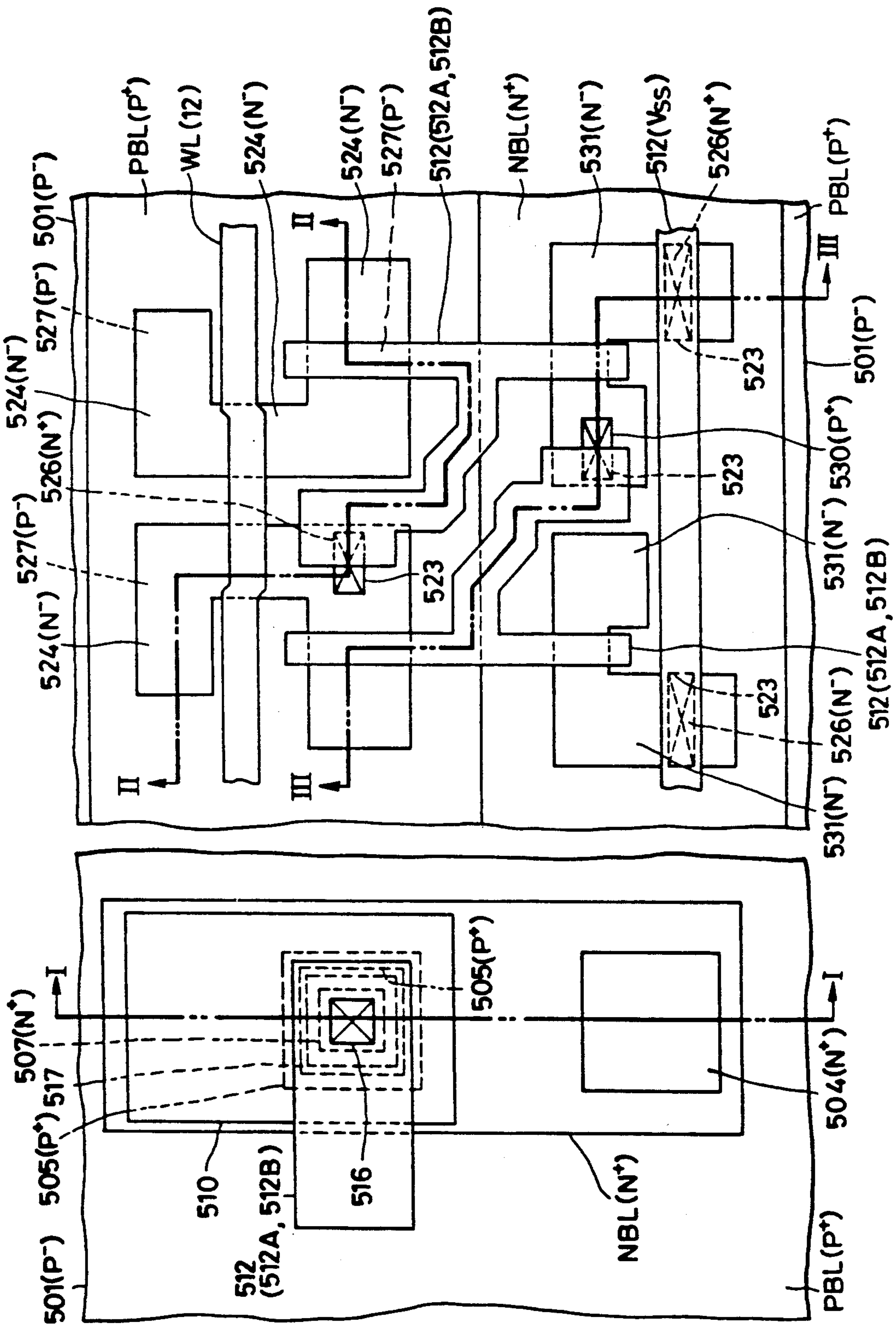

Next, as shown in FIGS. 5M, 5NA, 5NB and 5NC, the polycrystalline silicon film 510 is patterned by etching using a mask defined by a resist film to form a base electrode 510. Next, the exposed surface of the base electrode 510 is subjected to thermal oxidation to form an insulating film 511 defined by a silicon oxide film. The silicon nitride film 509 serves as a mask to the thermal oxidation.

Figure 5P:
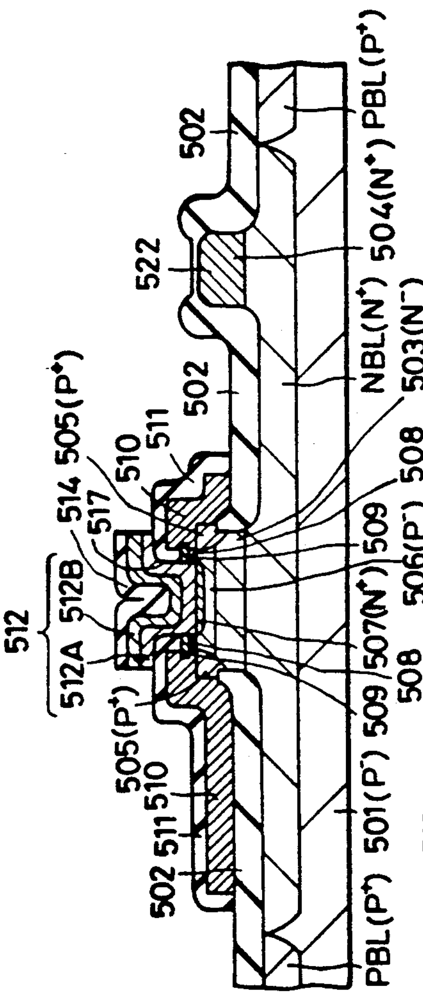
Figure 5P:
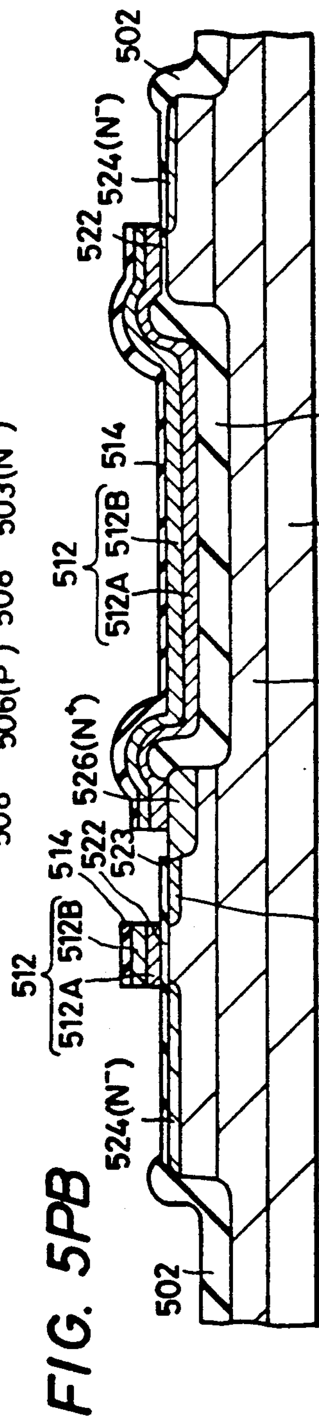
Figure 5P:
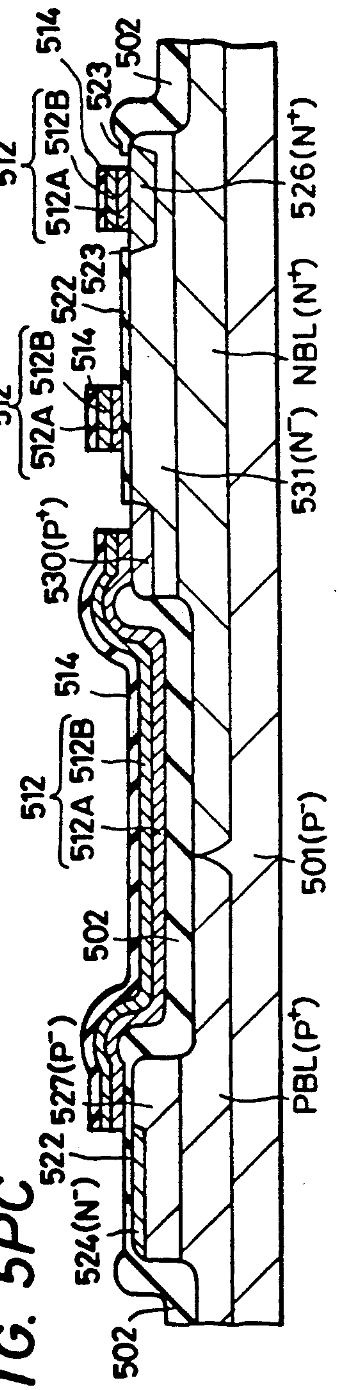

Next, as shown in FIGS. 5O, 5PA, 5PB and 5PC, the exposed silicon nitride films 509 are removed by etching, and then the silicon oxide films 508 are removed by etching. The exposed upper surfaces of the $P^-$-and $N^-$-well regions 527 and 531 are subjected to thermal oxidation to form gate insulating films 522 which are defined by silicon oxide films. Next, a $P^-$-intrinsic base region, and $N^+$-emitter region 507 and an $N^+$-collector lead-out region 504 are successively formed by ion implantation using a mask which is defined by a resist film. Next, the gate insulating film 522 is selectively removed to expose the emitter region 507 and provide openings 523 by etching using a mask which is defined by a resist film. After the etching, the resist mask is removed. Next, a polycrystalline silicon film 512A is formed on the whole surfaces of the buried layers PBL and NBL by, for example, CVD. An N-type impurity, for example, phosphorus or arsenic, is introduced by, for example, ion implantation, into that portion of the polycrystalline silicon film 512A which extends over the $P^+$-buried layer PBL and into that portion of the film 512A which is present on the $N^+$-buried layer NBL and which is used as a part of the interconnection 512 for feeding the power supply voltage Vcc, while a P-type impurity is similarly introduced into the other portion of the polycrystalline silicon film 512A, to thereby lower the resistivity. During the annealing that is carried out to activate the impurities introduced into the polycrystalline silicon film 512A, the N- and P-type impurities in the polycrystalline silicon film 512A are diffused through the openings 523 to form $N^+$- and $P^+$-type semiconductor regions 526 and 530, respectively. It should be noted that the $N^+$-emitter region 507 may be formed at the same time as the formation of the semiconductor regions 526 and 530. Alternatively, the arrangement may be such that the $N^+$- and $P^+$-type semiconductor regions 526 and 530 are formed before the formation of the openings 523 by ion implantation using a mask defined by a resist film and the $N^+$-emitter region 507 is formed by diffusion of an impurity from the polycrystalline silicon film 512A. A film of a refractory metal, e.g., W, Mo, Ta, Ti or Pt, is formed on the polycrystalline silicon film 512A by CVD or sputtering, and then annealed to form a refractory metal silicide film 512B. Further, a silicon oxide film 514 is formed on the refractory metal silicide film 512B by, for example, CVD. Next, the silicon oxide film 514, the refractory metal silicide film 512B and the polycrystalline silicon film 512A are successively etched by etching process using a mask defined by a resist film to form an emitter electrode 512, a gate electrode 512, a word line WL and an interconnection 512 for feeding the power supply potential Vcc. Next, $N^-$-type semiconductor regions 524 are formed by introducing an N-type impurity, for example, phosphorus, by ion implantation using a mask defined by a resist film.

After the formation of the $N^-$-type semiconductor regions 524, the following constituent elements, which are shown in FIGS. 5A to 5D, are formed: the side walls 513 defined by a silicon oxide film formed by, for example, CVD; the $N^+$-type semiconductor region 525 serving as a part of each of the source and drain regions of each of the N-channel MISFETs $MN_1$, $MN_2$, $MN_3$, $MN_4$; $P^+$-type semiconductor regions 529 serving as the source and drain regions of each of the P-channel MISFETs $MP_1$, $MP_2$; the insulating film 515 defined by a combination of a silicon oxide film and a PSG film formed by, for example, CVD; the contact holes 516; the interconnections 518, 518B, 518C and 518E defined by a first-level aluminum film formed by, for example, sputtering; the insulating film 519 defined by a stack of a silicon oxide film, a spin-on-glass film and a PSG film formed by, for example, CVD; the contact holes 520; and the interconnections 521, 528 and the data liens D, $\overline{D}$ which are defined by a second-level aluminum film formed by, for example, sputtering.

Thereafter, and an interlayer insulating film is formed on Al (2) by any of the methods shown in the embodiments 1 to 4 and those which have been described above. Further, by-pass signal lines 550 which are formed from Al (3) are formed thereon so as to extend above the memory mats, as shown in FIG. 5A, and a final passivation film is formed on the signal lines 550. Thereafter, openings are, if necessary, provided in predetermined portions of the final passivation film and bonding pads or CCB pads are then formed to complete the LSI chip according to this embodiment.

As has been described above, the technique of isolation between the bipolar transistors is effectively employed for isolation between the MISFETs and also between the MISFETs and the bipolar transistors by the process comprising the steps of: forming the silicon nitride film 509 (the first mask) on each of the three regions on the substrate 501, that is, the first region in which are provided the collector region 503, the $P^+$-type semiconductor region 505, the intrinsic base region 506 and the emitter region 507, the second region in which the collector lead-out region 504 is provided, and the third region in which a MISFET is provided; etching the respective peripheries of the first, second and third regions to thereby project these regions; forming the silicon nitride film 533 (the second mask) on the side surface of the first projecting region; and oxidizing the surface of the substrate 501 which is not covered with the first nor second mask to form the field insulating film 502. Thus, it is possible to effect in the same manufacturing step the isolation between the bipolar transistors, between the MISFETs and also between the bipolar transistors and the MISFETs.

Figure 5Q:
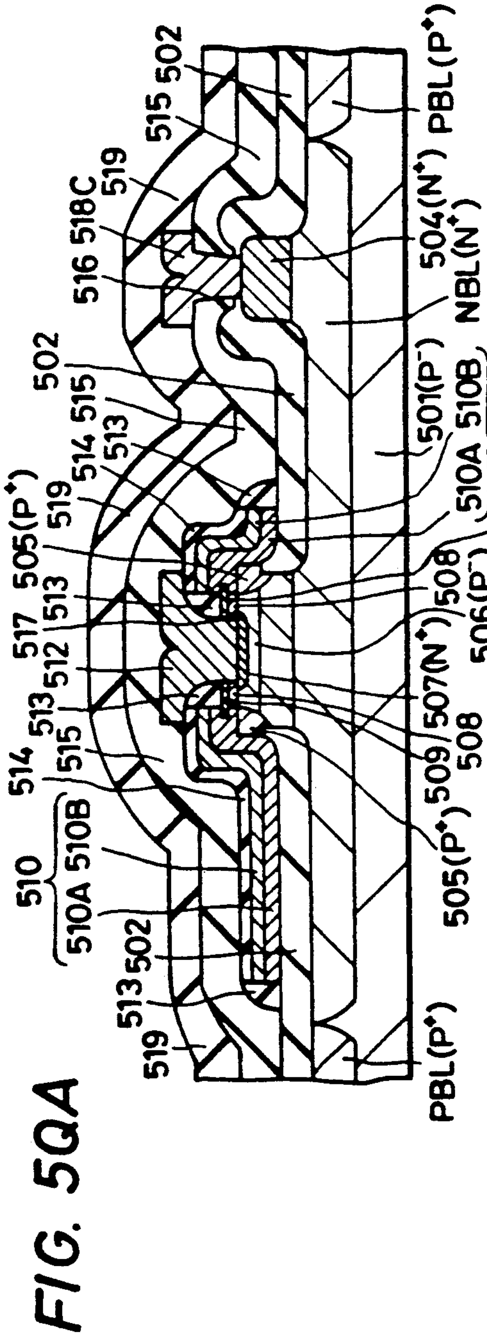
Figure 5Q:
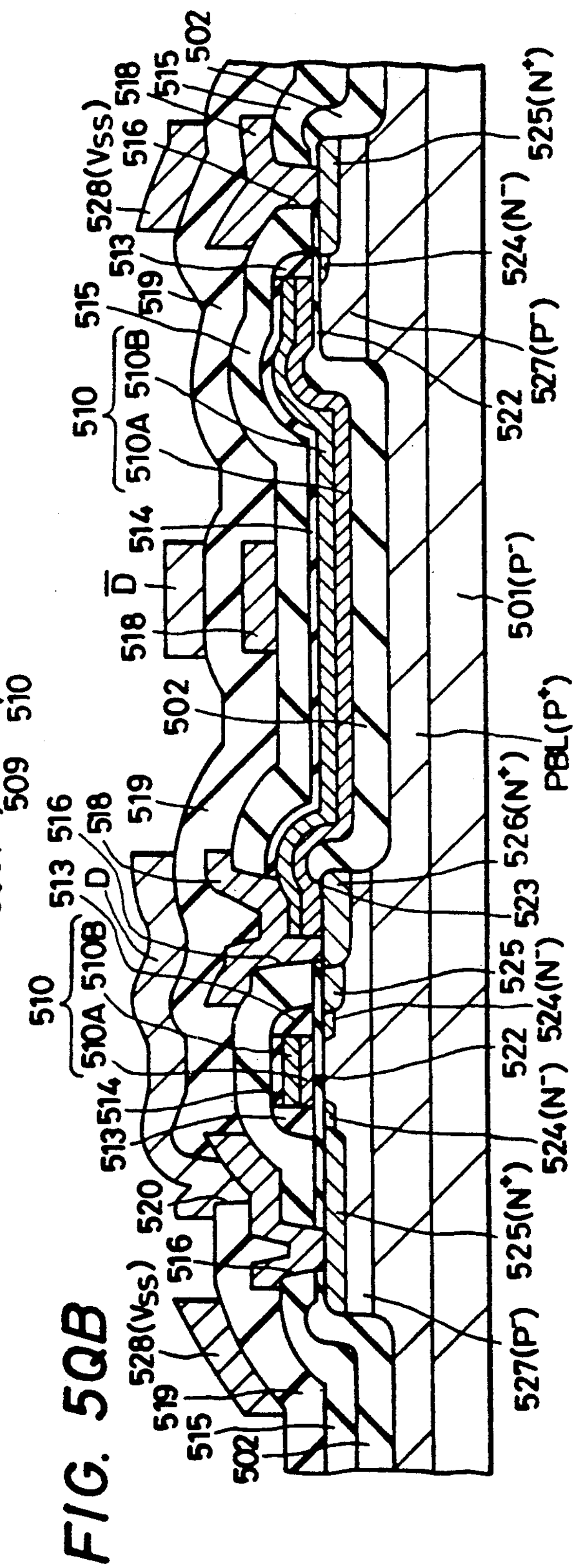
Figure 5Q:
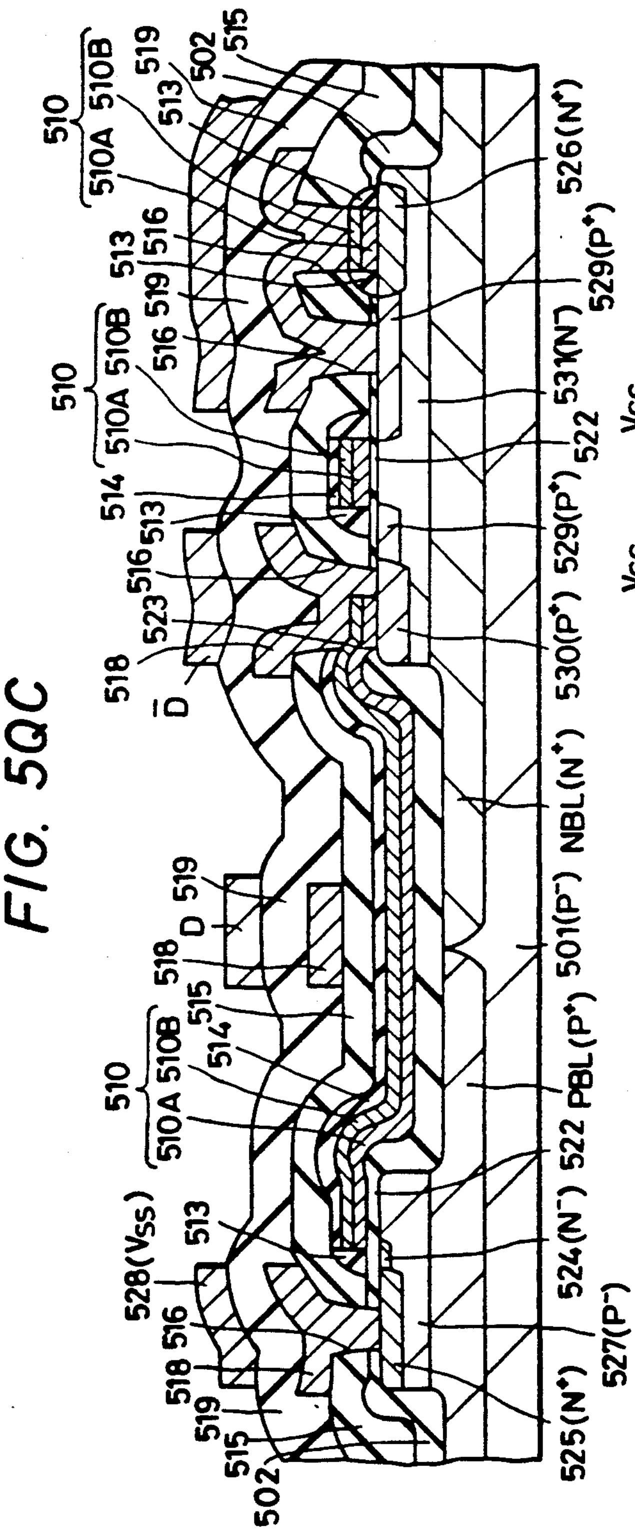
Figure 5R:
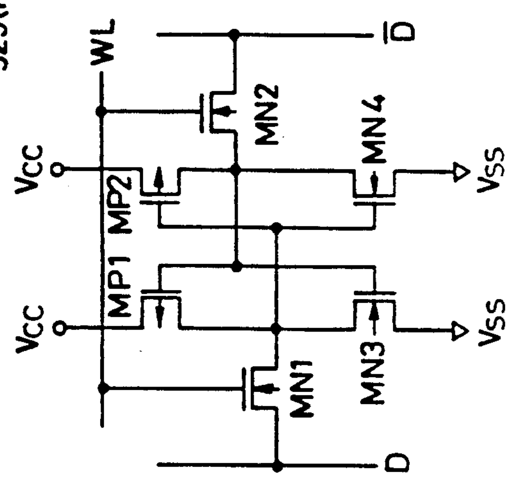
FIG. 5R shows an equivalent circuit of a memory cell of the SRAM in the embodiment 5—II.

FIGS. 5QA, 5QB and 5QC are sectional views showing in combination a semiconductor integrated circuit device according to the embodiment 5-II of the present invention, in which: FIG. 5QA is a sectional view of the same portion as that shown in FIG. 5B; FIG. 5QB is a sectional view of the same portion as that shown in FIG. 5C; and FIG. 5QC is a sectional view of the same portion as that shown in FIG. 5D.

In this embodiment, the base electrode of the bipolar transistor and the gate electrode 510 and the interconnection for feeding the power supply voltage Vcc of each of the P- and N-channel MISFETs $MP_1$, $MP_2$, $MN_1$, $MN_2$, $MN_3$, $MN_4$ are formed using a two-layer film comprising a polycrystalline silicon film 510A formed by, for example, CVD, and a film 510B of a refractory metal, for example, W, Mo, Ta, Ti, Pt or the like, or a film 510B of a silicide of such a refractory metal. Further, the emitter region 507 of the bipolar transistor is determined by a side wall 513 provided on the gate electrode 510, the side wall 513 being defined by a silicon oxide film formed by, for example, CVD, and the heavily-doped region 525 defining a part of each of the source and drain regions of each of the N-channel MISFETs $MN_1$, $MN_2$, $MN_3$, $MN_4$ is determined by a side wall 513 which is formed in the same manufacutring step as that for the side wall 513 provided on the base electrode 510.

A silicon oxide film 514 is formed on the refractory metal or refractory metal silicide film 510B by, for example, CVD. After the formation of the polycrystalline silicon film 510A, an N-type impurity is introduced by, for example, ion implantation, into that portion of the polycrystalline silicon film 510A which extends over the $P^+$-buried layer PBL and into that portion of the film 510A which is present on the $N^+$-buried layer NBL and which is used as a part of the interconnection 510 for feeding the power supply voltage Vcc, while a P-type impurity is introduced by, for example, ion implantation, into the other portion of the polycrystalline silicon film 510A, to thereby lower the resistivity.

The $N^+$-type semiconductor regions 526 in the memory cell forming region are formed by diffusion of an N-type impurity, e.g., phosphorus or arsenic, introduced in the polycrystalline silicon film 510A, while the $P^+$-type semiconductor region 530 is formed by diffusion of a P-type impurity, e.g., boron, introduced in the polycrystalline silicon film 510A. The $P^+$-type semiconductor region 505 of the bipolar transistor is formed by diffusion of a P-type impurity, e.g., boron, introduced in the polycrystalline silicon film 510A.

The emitter electrode 512 of the bipolar transistor is defined by a second-level polycrystalline silicon film which is formed by, for example, CVD. The emitter electrode 512 is connected to the emitter region 507 through a contact hole 517 defined by the side wall 513 provided on the side wall of the base electrode 510 which is opened above the emitter region 507, together with the silicon nitride film 509 and the silicon oxide film 508. The thickness of the side wall 513 in the horizontal direction, that is, in the planar direction, can be controlled by adjusting the thickness of the silicon oxide film which is formed on the buried layers NBL and PBL in order to form the side wall 513. On the other hand, the emitter region 507 is formed by diffusion of an N-type impurity, e.g. phosphorus, introduced in the emitter electrode (polycrystalline silicon film). However, the emitter region 507 may also be formed by ion implantation using a mask which is defined by a resist film.

As has been described above, the side wall 513, which is defined by the same layer as that for the side wall 513 which is provided on the side of the gate electrode 510 of each MISFET to determine the heavily-doped region 525 of each of the source and drain regions, is provided around the opening which is provided in the base electrode 510 to allow the emitter electrode 512 to be connected to the emitter region 507, thereby determining the emitter region 507, and thus enabling the emitter region 507 to be formed in self-alignment with the base electrode 510. Accordingly, it is possible to achieve reduction in the device size and high integration. Further, since the side wall 513 of the bipolar transistor and the side wall 513 of each MISFET are formed in the same manufacturing step, it is possible to prevent an increase in the number of manufacturing steps.

It should be noted that the arrangement may be such that the polycrystalline silicon film in the same layer as the emitter electrode 512 is provided as electrodes on the $P^+$-type semiconductor region 529 which defines each of the source and drain regions of each of the P-channel MISFETs $MP_1$, $MP_2$ and the $N^+$-type semiconductor region 525 which defines a part of each of the source and drain regions of each of the N-channel MISFETs $MN_1$, $MN_2$, $MN_3$, $MN_4$, and the aluminum interconnections 518 are connected to these electrodes, thereby enabling the interconnections to be self-alignedly connected to the $P^+$-type semiconductor region 529 and the $N^+$-type semiconductor region 525. The portions of the gate insulating films 522 which are above the $N^+$-type semiconductor region 525 and the $P^+$-type semiconductor region 529 are removed when the side walls 513 are formed. In addition, the electrode which is defined by the polycrystalline silicon film on the $N^+$-type semiconductor region 525 and the gate electrode 510 are isolated from each other by the silicon oxide film 514 and the side wall 513.

In the embodiment 5-III, a conductive layer which is the same layer as that of the base electrodes and a thermal oxidation mask 533 are insulatively provided around the collector lead-out region 504 and around the MISFET region, thereby flattening the surface of the substrate 501 and further suppressing the undesirable extension of the field insulating film 502 so as to eliminate a possible dimensional change.

This embodiment will be described hereinunder according to the manufacturing steps.

Figure 5S:
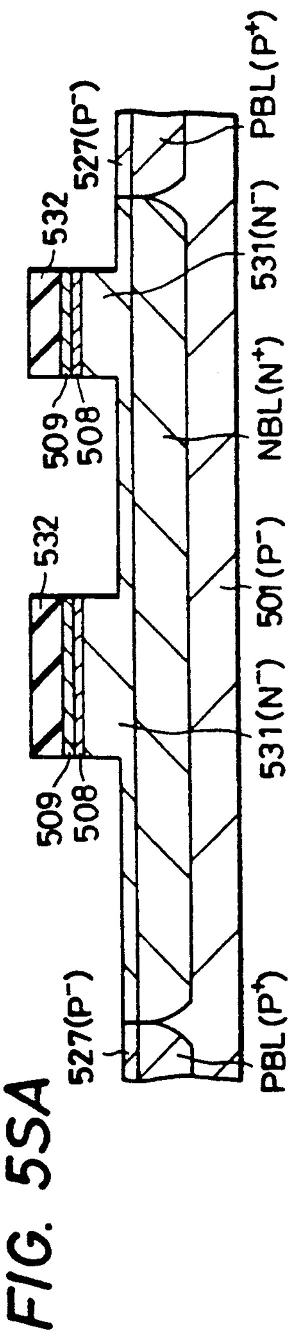
FIGS. 5SA to 5VB are sectional views showing the process for producing an SRAM according to the embodiment 5—III of the present invention.
Figure 5S:
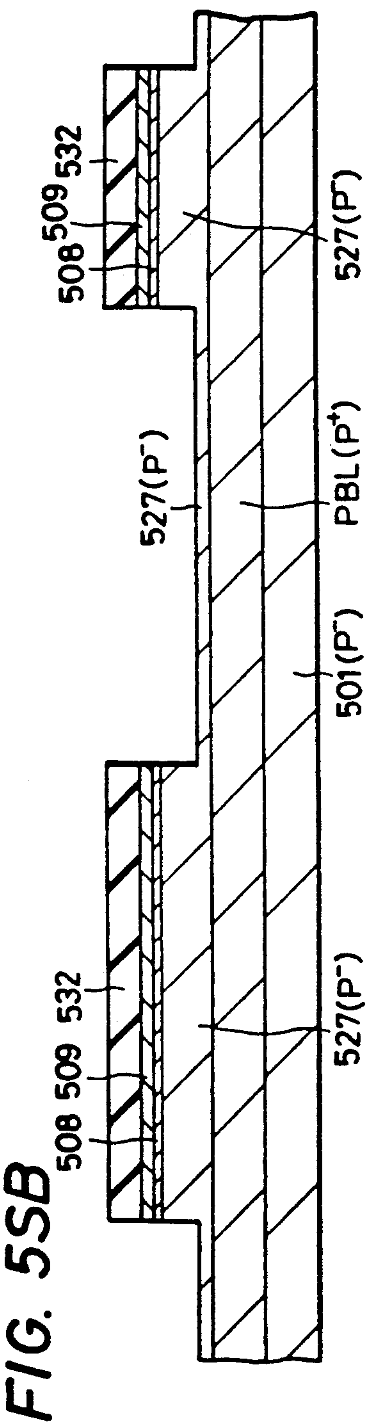
Figure 5T:
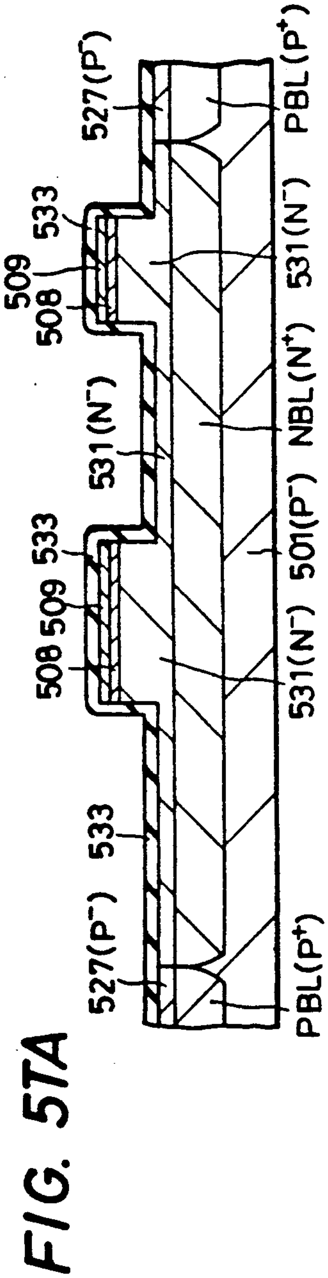
Figure 5T:
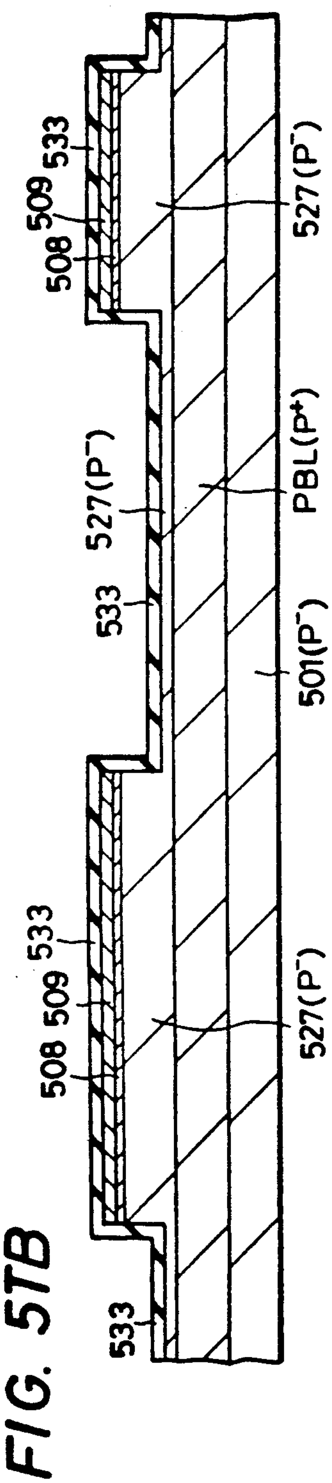
Figure 5U:
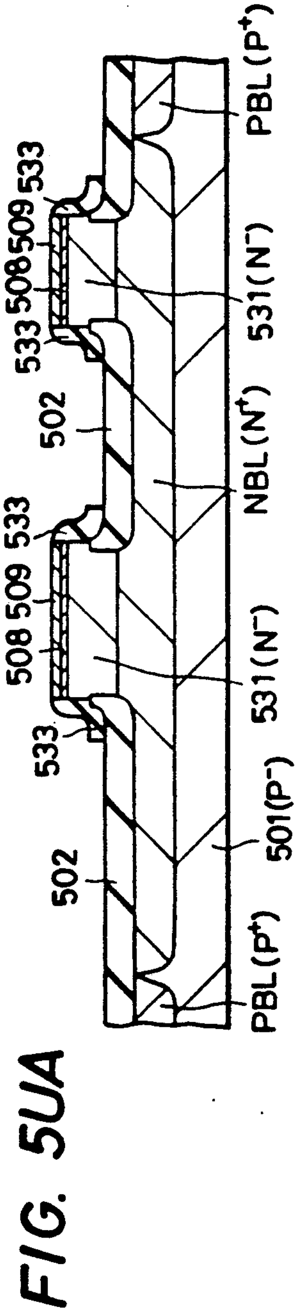
Figure 5U:
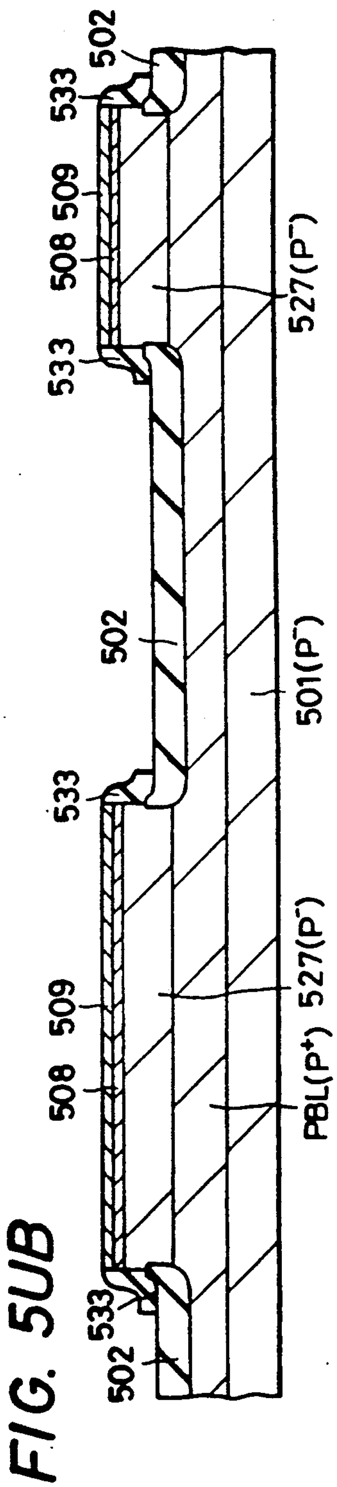
Figure 5V:
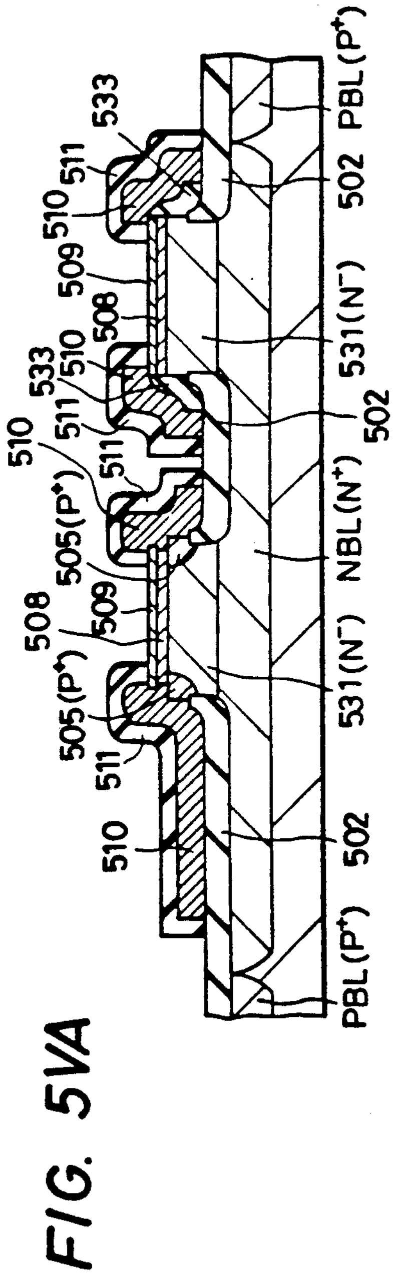
Figure 5V:
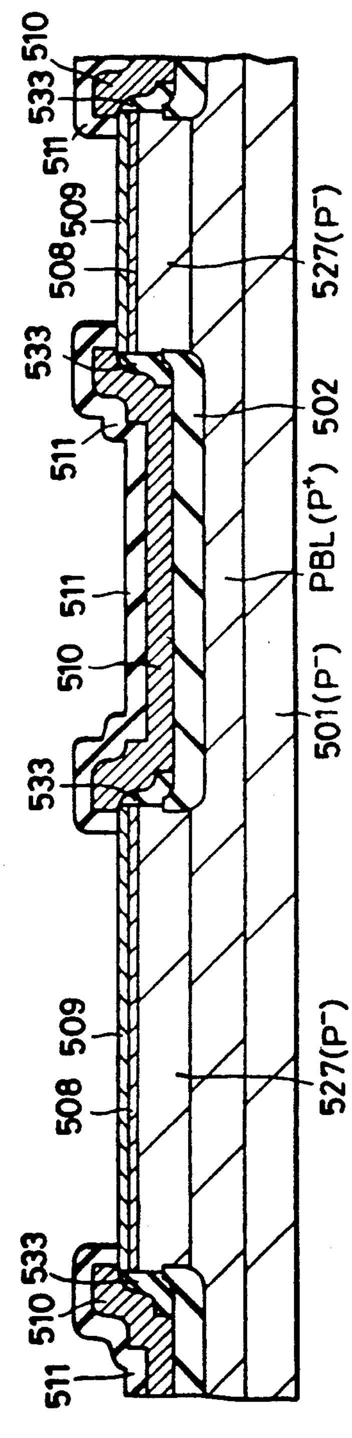

FIGS. 5SA, 5SB to FIGS. 5VA, 5VB are sectional views of the embodiment in the manufacturing steps, in which each of the numbers of these figures consists of an Arabic numeral and letters in the alphabet, and the first alphabet letter denotes sectional views in the same step, while the second alphabet letter A denotes the section of the same portion as that shown in FIG. 5B, and B the section of the same portion as that shown in FIG. 5C. It should be noted that there is shown no section of the same portion as that shown in FIG. 5D.

As shown in FIGS. 5SA and 5SB, an $N^+$-buried layer NBL, a $P^-$-buried layer PBL, a $P^-$-well region 527, an $N^-$-well region 531, a silicon oxide film 508, a silicon nitride film 509 and a silicon oxide film 532 are formed, and then the $P^-$-well region 527 and the $N^-$-well region 531 are patterned so that they are left in predetermined patterns, in the same way as in the steps carried out in the embodiment 5-I (from FIGS. 5EA, 5EB to 5HA, 5HB).

Next, as shown in FIGS. 5TA and 5TB, a silicon nitride film 533 is formed all over the upper surfaces of the $N^+$-buried layer NBL and the $P^+$-buried layer PBL by, for example, CVD.

Next, as shown in FIGS. 5UA and 5UB, the silicon nitride film 533 is etched by RIE until the upper surfaces of the $P^-$-and $N^-$-well regions 527 and 531 are exposed to thereby form side walls 533. Thereafter, the surfaces of the $P^-$-and $N^-$-well regions 527 and 531 which are not covered with the silicon nitride film 509 nor the side walls 533 are subjected to thermal oxidation to form a field insulating film 502.

The field insulating film 502 is not formed on the upper surface of each projecting region but only on the side surface thereof not only in the projecting region in which are formed the collector region 503, $P^+$-type semiconductor region 505, intrinsic base region 506 and emitter region 507 of the bipolar transistor, but also in the projecting region in which the collector lead-out region is formed and the projecting region in which each MISFET is formed. Accordingly, there is no fear of the field insulating film 502 undesirably extending into the above-described projecting regions, and therefore there is no dimensional change, that is, there is no difference in size of each projecting region before and after the formation of the field insulating film 502.

Next, as shown in FIGS. 5VA abd 5VB, the side wall 533 only in the projecting region in which are provided the collector region 503, $P^+$-type semiconductor region 505, intrinsic base region 506 and emitter region 507 is removed by etching using a mask which is defined by a resist film to thereby expose the side surface of the $N^-$-well region 531. Thereafter, a polycrystalline silicon film 510 is formed all over the upper sides of the $N^+$-buried layer NBL and the $P^-$-buried layer PBL by, for example, CDV. This polycrystalline silicon film 510 is deposited on the side surface of the $N^-$-well region 531 in the projecting region in which are formed the collector region 503, $P^+$-type semiconductor region 505, intrinsic base region 506 and emitter region 507, but in the projecting region in which the collector lead-out region 504 is formed and in the projecting region in which each MISFET is formed, the polycrystalline silicon film 10 is isolated by the side wall 533. Next, a P-type impurity, e.g., boron, is introduced into the polycrystalline silicon film 510 by, for example, ion implantation, and then annealing is carried out to lower the resistivity of the film 510. In addition, the above-described P-type inpurity is diffused into the $N^-$-well region 531 on which the polycrystalline silicon film 510 is deposited to thereby form $P^+$-type semiconductor region 505. Next, the portions of the polycrystalline silicon film 510 which are deposited on the upper sides of the projecting regions, that is, on the silicon nitride films 509, are mainly removed by etching using a mask which is defined by a resist film. The resist mask is removed after the etching. The polycrystalline silicon film 510 which is connected to each $P^+$-type semiconductor region 505 is defined as a base electrode 510, and this polycrystalline silicon film 510 is separated from the polycrystalline silicon film 510 which is provided around the projecting region in which the collector lead-out region 504 is formed and that which is provided around the projecting region in which each MISFET is formed.

Since the area between the projecting regions is filled with the polycrystalline silicon film 510, it is possible to flatten the surface of the substrate 501. Next, the exposed surfaces of the polycrystalline silicon film 510 and base electrode 510 are subjected to thermal oxidation to form an insulating film 511 which is defined by a silicon oxide film. Next, that portion of the stack of the silicon nitride film 509 and the silicon oxide film 508 in the upper surface of each projecting region which is not covered with the insulating film 511 is etched to expose the surfaces of the $P^-$-and $N^-$-well regions 527 and 531.

The steps which are out carried thereafter are the same as those which are carried out after the step shown in FIGS. 5O, 5PA, 5PB and 5PC in the embodiment 5-I.

As has been described above, according to this embodiment, the field insulating film 502 provided around the projecting region (second projecting region) in which is provided the collector lead-out region 504 of the bipolar transistor and the field insulating film 502 provided around the projecting region (third projecting region) in which each MISFET is formed are not provided on the upper surfaces of these projecting regions in the same way as in the case of the field insulating film 502 provided around the projecting region (first projecting region) in which are provided the collector region 503, $P^+$-type semiconductor region 505, intrinsic base region 506 and emitter region 507 of the bipolar transistor. Thus, there is no fear of the field insulating film 502 undesirably extending into each of these projecting regions, and it is therefore possible to eliminate the occurrence of an undesired dimensional change.

Further, since the polycrystalline silicon film (conductive layer) 510 which is defined by the same layer as that for the base electrode 510 is left on the field insulating film 502, the area between the projecting regions is filled, and therefore it is possible to flatten the surface of the substrate 501.

Figure 5W:
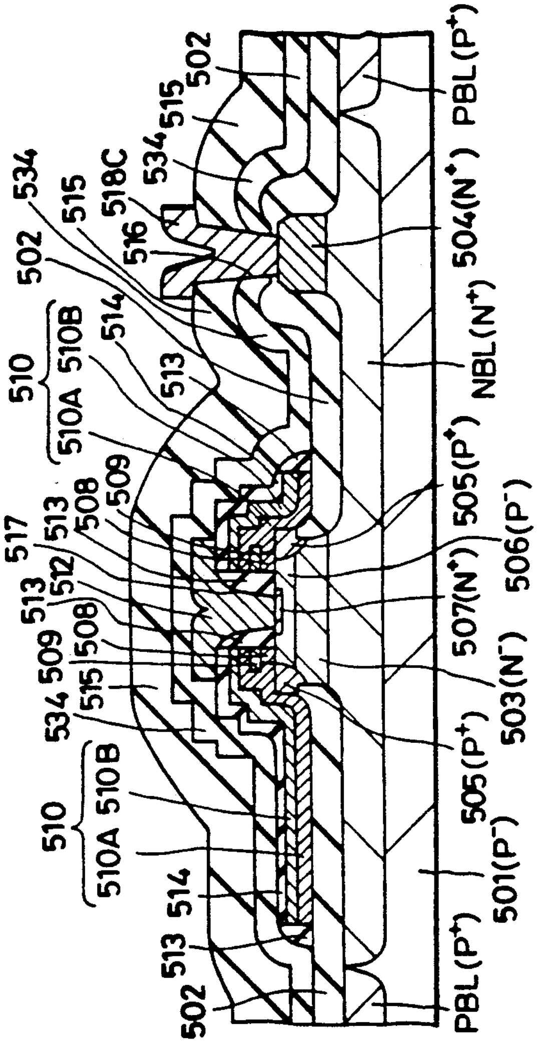
FIGS. 5W to 5Y are plan or sectional views showing the arrangement of an SRAM according to the embodiment 5—IV of the present invention.
Figure 5Y:
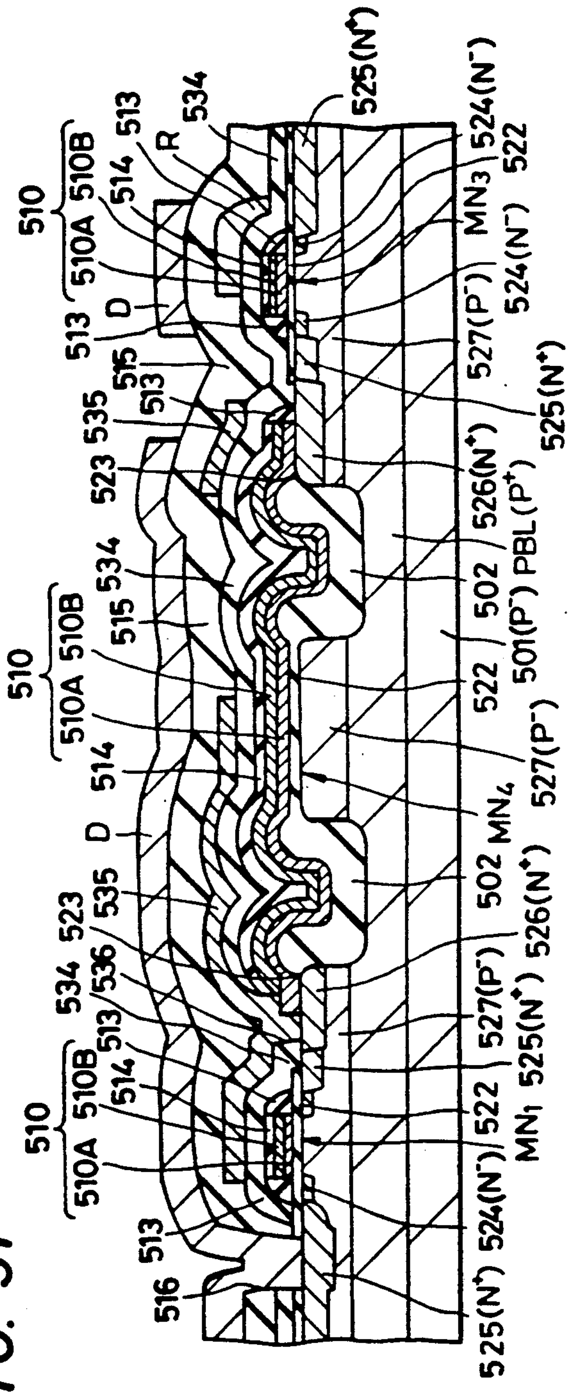
Figure 5X:
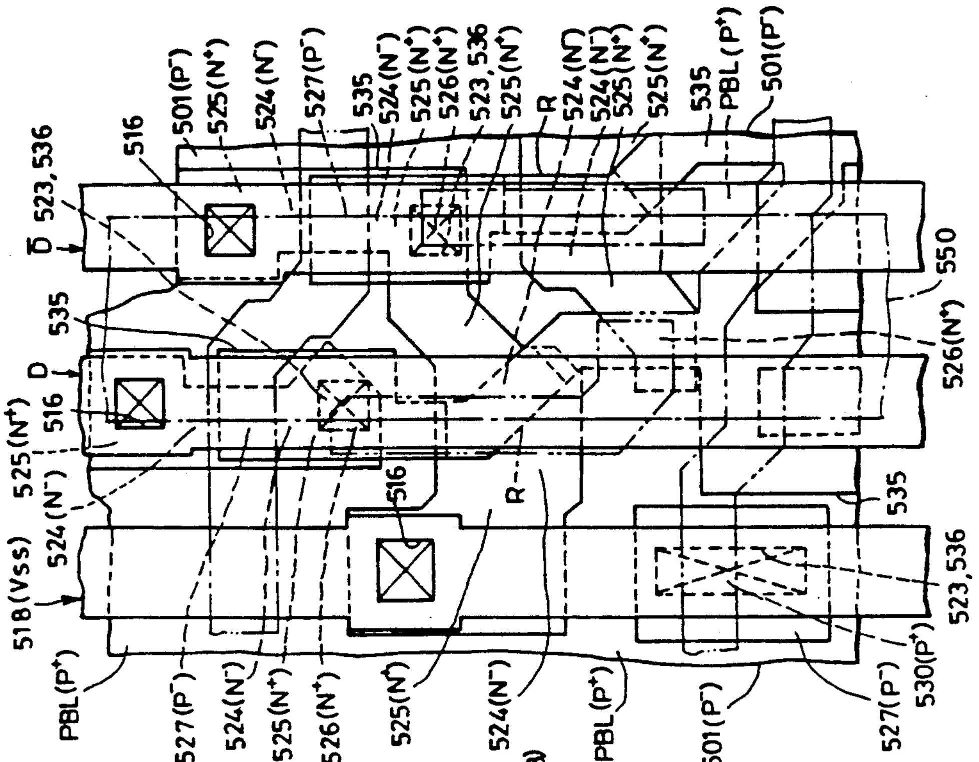
Figure 5X:
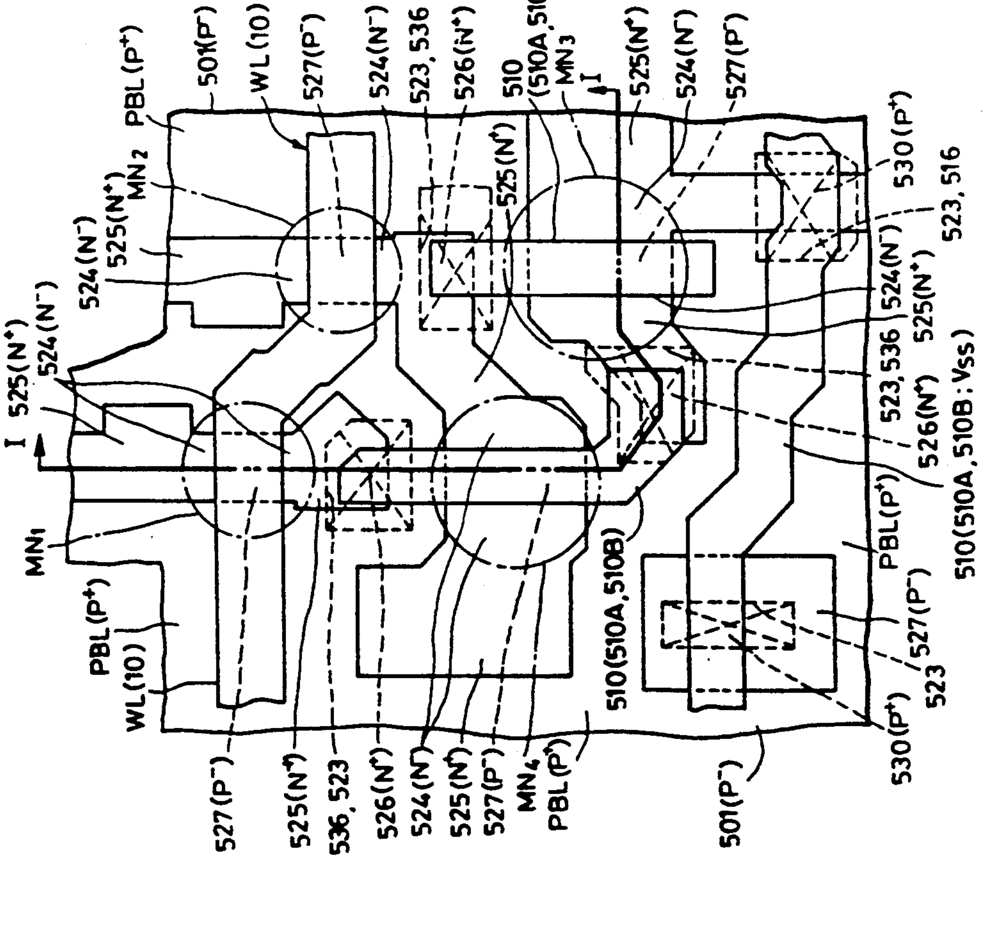

FIG. 5W is a sectional view of a bipolar transistor; FIG. 5XA is a plan view of a memory cell in an SRAM, which shows the first-level conductive layer of the cell, with the second-and third-level conductive layers removed; FIG. 5XB is a plan view showing the memory cell of the SRAM with the first-level conductive layer removed; and FIG. 5Y is a sectional view taken along the line I—I of FIG. 5X. FIG. 5Y shows all the conductive layers, that is, the first, second and third conductive layers. In FIGS. 5XA and 5XB, neither field nor interlayer insulating film is shown for the purpose of facilitating understanding of the arrangement of the elements.

The SRAM cell according to the embodiment 5-IV comprises two resistors R having high resistance and four N-channel MISFETs $MN_1$, $MN_2$, $MN_3MN_4$.

The base electrode 510 of the bipolar transistor, the gate electrode 510 of each of the N-channel MISFETs $MN_1$, $Mn_2$, $Mn_3$, $Mn_4$, and the interconnection 510 for feeding the ground potential Vss to the substrate 501 are each defined by a combination of a first-level polycrystalline silicon film 510A formed by, for example, CVD, and a refractory metal or refractory metal silicide film 510B stacked thereon. The polycrystalline silicon film 510A constituting the base electrode 510 has a P-type impurity, e.g., boron, introduced thereinto, while the polycrystalline silicon film 510A constituting the gate electrode 510 of each of the N-channel MISFETs $MN_1$, $MN_2$, $MN_3$, $MN_4$ and that for the interconnection 510 have an N-type impurity, e.g., phosphorus or arsenic, introduced thereinto. The interconnection 510 is connected with an interconnection 518 which is defined by a first-level aluminum film through a contact hole 516 provided by selectively removing the following three insulating films, that is, an insulating film 514 defined by a silicon oxide film formed by, for example, CVD, an insulating film 534 defined by a silicon oxide film, and an insulating film 515 defined by a combination of a silicon oxide film, a spin-on-glass film and a PSG film which are stacked in the mentioned order by, for example, CVD. The ground potential Vss is fed by this interconnection 518. The interconnection 518 is connected through a contact hole 516 to the surface of the $N^+$-type semiconductor region 525 which defines a part of the source region of the MISFET $MN_4$. The load resistors R and the conductive layer 535 are defined by a second-level polycrystalline silicon film formed by, for example, CVD. The conductive layer 535 has an N-type impurity, e.g., phosphorus or arsenic, introduced thereinto by, for example, ion implantation so that the resistivity is lowered. Isolation between the gate electrodes 510 and the interconnection 510 and that between the conductive layer 535 and the load resistors R are effected by the insulating film 534 defined by a silicon oxide film formed by, for example, CVD. The conductive layer 535 is connected to the upper surfaces of the gate electrodes 510 and the $N^+$-type semiconductor regions 526 through contact holes 536 formed by removing the stack of the insulating film 534 and the insulating film 514 or the gate insulating film 522. The data lined D and $\overline{D}$ are defined by a first-level aluminum film formed by, for example, sputtering, and is connected through a contact hole 516 to one $N^+$-type semiconductor region 525 of each of the MISFETs $MN_1$ and $MN_2$.

Each of the the N-channel MISFETs $MN_1$, $MN_2$, $MN_3$, $MN_4$ is formed in an $N^-$-well region 531 projecting from the surface of $N^+$-buried layer NBL, and these N-channel MISFETs $MN_1$, $MN_2$, $MN_3$, $MN_4$ are isolated from each other by the field insulating film 502 and the $P^+$-buried layer PBL.

Thereafter, signal lines 550 of Al (3) which extend above the memory section to connect together the gate array section and the I/O cells are formed, as shown by the one-dot chain line in FIG. 5XB, in the same way as in the foregoing embodiments. Since the gate array section is formed from Al (1) to Al (2), it is possible to take out signals from the gate array section through Al (3) as desired. In this case, the I/O circuits and the memory peripheral circuits are defined by BiCMOS circuits, while the memory cells and the gate array section are defined by single-channel MOS type SRAM cells and CMOS logic circuits, respectively. Accordingly, it is possible to provide a memory gate array LSI which has low power consumption and yet exhibits high driving capacity with respect to an external device.

(6) Explanation of Literatures, Patents and Applications for Supplementing the Description of the Embodiments ECL logic and memory circuits and the like are described in Taub & Schilling, 1977, McGraw-Hill, Inc., "Digital Integrated Circuits", pp. 416–431 and pp. 229–256; therefore, the description therein is used to constitute part of the description of the embodiments in this application.

Techniques of designing and manufacturing gate arrays are described in D. G. Ong, 1986, McGraw-Hill, Inc., "Modern MOS Technology", pp. 327–331; therefore, the description therein is used to constitute part of the description of the embodiments in this application.

Detailed circuit systems of various portions of bipolar memories are described in Leucke, Mize and Carr, 1973, McGraw-Hill Inc., "Semiconductor Memory Design and Application", pp. 93–113; therefore, the description therein is used to constitute part of the description of the embodiments in this application.

A method of arranging a CMOS gate array is described in the article by Fujii et al. in the July 1986 issue of "Denshi Zairyo (Electronic Materials)", a journal, pp. 86–91; therefore, the description therein is used to constitute part of the description of the embodiments in this application.

The details of the arrangement of a memory gate array is described in the article by Shimizu in the same issue of the same journal as the above, pp. 66–71; therefore, the description therein is used to constitute part of the description of the embodiments in this application.

The arrangement of an ECL gate array, disposition of pads and I/O cells, package, basic circuits and devices, etc. are described in the articles by Takahaski and Nishimura et al. in the same issue of the same journal as the above, pp. 104–109 and pp. 110–115, respectively; therefore, the description therein is used to constitute part of the description of the embodiments in this application.

ECL gate array TAB techniques are described in the article by Hans Ullrich et al. in Extended Abstracts (The Proceedings of the Solid-State Circuits Conference, 1985), pp. 200–201; therefore, the description therein is used to constitute part of the description of the embodiments in this application.

ECL-PLA (ECL Programmable Array Logic IC) is described in the article by M. S. Millhollan et al, in the above-mentioned Extended Abstracts, pp. 202–203; therefore, the description therein is used to constitute part of the description of the embodiments in this application.

The cell circuits, word drivers, array drivers, cell layout and other systems of bipolar memories are described in the article by Y. H. Chan in Extended Abstracts (The proceedings of the Solid-State Circuits Conference, 1986), pp. 210–211; therefore, the description therein is used to constitute part of the description of the embodiments in this application.

The device structure, input buffers, word decoders, word drivers, memory cells, level control circuits, sense amplifiers, output buffers and general system arrangement of an ECL-RAM Having a BiCMOS arrangement are described in the article by K. Ogiue et al. in the above-mentioned Extended Abstracts (1986), pp. 212–213; therefore, the description therein is used to constitute part of the description of the embodiments in this application.

The details of the circuits of a high-speed bipolar ECL RAM, that is, the address buffers, operating timing, word drivers and the cross-sectional structure of the memory cells, are described in the article by K. Yamaguchi et al. in the above-mentioned Extended Abstracts (1986), pp. 214–215; therefore, the description of the embodiments in this application.

The device cross-section of a peripheral ECL BiCMOS SRAM and the bit line arrangement are described in the article by H. V Tran et al. in Extended Abstracts (The proceedings of the Solid-State Circuits Conference, 1988), pp. 188–189; therefore, the description therein is used to constitute part of the description of the embodiments in this application.

The ECL-BiCMOS level converting circuit, read/write circuit,, column sense circuit, timing chart, etc. of a BiCMOS SRAM are described in the article by R. A. Kertis et al. in the above-mentioned Extended Abstracts (1988), pp. 186–187; therefore, the description therein is used to constitute part of the description of the embodiments in this application.

The arrangement of a poly-Si load N-channel MOS memory cell type BiCMOS RAM, i.e., the outline of the device, general layout, input buffers and connection of memory cells and peripheral circuits thereof, are described in the article by N. Tamba et al. in the above-mentioned Extended Abstracts (1988), pp. 184–185; therefore, the description therein is used to constitute part of the description of the embodiments in this application.

A method of arranging logic cells and power supply interconnections (Vss and Vcc) of a CMOS gate array are described in the article by R. Blumberg in the above-mentioned Extended Abstracts (1988), pp. 74–75; therefore, the description therein is used to constitute part of the description of the embodiments in this application.

A technique of designing a CMOS gate array and a method of arranging each block and power bus line are described in the article by M. Takechi et al. in the above-mentioned Extended Abstracts (1988); therefore, the description therein is used to constitute part of the description of the embodiments in this application.

A gate array that employs SST (Super Self-Aligned Process Technology) is described in the article by M. Suzuki et al. in the above-described Extended Abstracts (1988), pp. 70–71; therefore, the description therein is used to constitute part of the description of the embodiments in this application.

The device structure and read/write circuit of an ECL RAM having PNP transistor load memory cells are described in Extended Abstracts (The proceedings of the Solid-State Circuits Conference, 1983), pp. 106–107; therefore, the description therein is used to constitute part of the description of the embodiments in this application.

Devices or elements which are similar to but different in type from those described above are described in the article by K. Toyoda et al. for the high-speed RAM session in the above-mentioned Extended Abstracts (1983); therefore, the description therein is used to constitute part of the description of the embodiments in this application.

A high-speed RAM that employs MTL (Merged Transistor Logic) is described in the article by S. K. Wiedman et al. for the high-speed RAM session in the above-mentioned Extended Abstracts (1983); therefore, the description therein is used to constitute part of the description of the embodiments in this application.

An ECL RAM that is mounted on an LCC (Leadless Chip Carrier) is described in the article by Nokuba et al. for the high-speed RAM session in the above-mentioned Extended Abstracts (1983); therefore, the description therein is used to constitute part of the description of the embodiments in this application.

An ECL RAM that employs poly-Si buried isolation and the general circuit arrangement are described in the article by Ooami et al. for the high-speed RAM session in the above-mentioned Extended Abstracts (1983); therefore, the description therein is used to constitute part of the description of the embodiments in this application.

A TTL-CMOS level converting circuit which is used in a BiCMOS gate array is described in detail in U.S. Pat. No. 4,689,503, Suzuki et al., and the details of the general circuit and device arrangement thereof are described in detail in European Patent Laid-Open Number 0125504-Al, Y. Nishio et al.; therefore, the descriptions therein are used to constitute part of the description of the embodiments in this application.

A specific example of I/O cells (in the case of a MOS FFF arrangement) and a method of arranging bonding pads which are employed in place of bump electrodes, that is, CCB's (Controlled-Collapse Solder Bumps), are described in G.B. Patent Number 2,104,284, Takahashi et al.; therefore, the description therein is used to constitute part of the description of the embodiments in this application.

Other uses of I/O cells and bonding pads in gate arrays are described in European Patent Laid-Open Number 0023118-Al, O. Ohba et al.; therefore, the description therein is used to constitute part of the description of the embodiments in this application.

A general ECL gate array arranging method and a process therefore are described in U.S. Pat. No. 4,255,672, K. Ohno et al., general other bipolar master slice techniques, particularly I/O pads and I/O cells, in U.S. Pat. No. 4,249,193, Balyoz et al., a general signal channel technique usable in gate arrays in U.S. Pat. No. 4,161,662, R. B. Malcolm et al., and a general interconnection arranging technique usable in CMOS gate arrays in U.S. Pat. No. 4,412,237, Matsumura et al. Therefore, these descriptions are used to constitute part of the description of the embodiments in this application.

So-called assembly techniques, particularly wafer separation, e.g., dicing, die bonding, wire bonding, TAB technology, flip-chip technology, ceramic sealing, glass sealing, plastic sealing, leadframes, transfer molding using a mold, epoxy sealing resins, and packages, e.g., chip carriers, are described in S. M. Sze, 1983, McGraw-Hill Inc., "VLSI Technology", pp. 551–598. Therefore, these descriptions are used to constitute part of the description of the embodiments in this application.

What is claimed is:

1. A semiconductor integrated circuit device comprising:

a semiconductor chip having a main surface;

a logic circuit block being disposed on the main surface of said chip at a substantially central position thereof and which includes a plurality of logic gates;

an input/output (I/O) cell group being comprised of input/output (I/O) cells disposed on the main surface of said chip along a periphery thereof;

a RAM type memory mat and a peripheral circuit thereof being provided between said logic circuit block and said I/O cell group, said RAM type memory mat including a plurality of RAM type memory cells, a plurality of first signal lines of a first level wiring layer and a plurality of second signal lines of a second level wiring layer which are electrically connected to said RAM type memory cells;

a plurality of third signal lines of a third level wiring layer interconnecting the respective I/O cells in said I/O cell group and said logic circuit block; and wherein said second signal lines of said second level wiring layer and third signal lines of said third level wiring layer are directionally disposed so as to intersect each other substantially at right angles over at least said RAM type memory mat, and wherein said third signal lines are extended along a direction orthogonal to that of said second signal lines and in a substantially straight-line form over said RAM type memory mat.

2. A semiconductor integrated circuit device according to claim 1, wherein said second signal lines of said second level wiring layer are word lines of said RAM type memory mat.

3. A semiconductor integrated circuit device according to claim 2, wherein said first signal lines of said first level wiring layer include complementary data line pairs.

4. A semiconductor integrated circuit device according to claim 3, wherein said complementary data line pairs are electrically connected to said peripheral circuit of said RAM type memory mat, and wherein said peripheral circuit is electrically connected to said logic circuit block.

5. A semiconductor integrated circuit device according to claim 1, wherein said second signal lines of said second level wiring layer include complementary data line pairs of said RAM type memory mat.

6. A semiconductor integrated circuit device according to claim 5, wherein said first signal lines of said first level wiring layer include word lines of said RAM type memory mat.

7. A semiconductor integrated circuit device according to claim 6, wherein said complementary data line pairs are electrically connected to said peripheral circuit of said RAM type memory mat, and wherein said peripheral circuit is electrically connected to said logic circuit block.

8. A semiconductor integrated circuit device comprising:

a semiconductor chip having a main surface;

a logic circuit block being disposed on the main surface of said chip;

an input/output (I/O) cell group being comprised of input/output (I/O) cells disposed on the main surface of said chip;

a RAM type memory mat and a peripheral circuit thereof being provided on the main surface between said logic circuit block and said I/O cell group, said RAM type memory mat including a plurality of memory cells, a plurality of first signal lines and a plurality of second signal lines, wherein said first and second signal lines are disposed in a coupling arrangement with said memory cells so that each memory cell is coupled to a first signal line and a second signal line;

a plurality of third signal lines interconnecting the respective I/O cells in said I/O cell group and said logic circuit block; and wherein said third signal lines and one of said first and second signal lines which is formed as a relatively higher level wiring layer with respect to the main surface of said chip are directionally disposed so as to intersect each other at substantially right angles over at least the entire width of said RAM type memory mat, and wherein said third signal lines overlie said RAM type memory mat and are extended along a direction orthogonal to those signal lines corresponding to said one of said first and second signal lines.

9. A semiconductor integrated circuit device according to claim 8, wherein said one of said first and second signal lines which is formed as the relatively higher level layer include word lines of said RAM type memory mat.

10. A semiconductor integrated circuit device according to claim 9, wherein said third signal lines correspond to a wiring level layer which is a relatively higher level layer with respect to the main surface of said chip than the wiring layer corresponding to said word lines.

11. A semiconductor integrated circuit device according to claim 8, wherein said first signal lines include a plurality of complementary data line pairs, and wherein said third signal lines and said complementary data line pairs are disposed along a parallel direction with respect to each other.

12. A semiconductor integrated circuit device according to claim 11, wherein said third signal lines correspond to a wiring level layer which is a relatively higher level layer with respect to the main surface of said chip than the wiring layer corresponding to said second signal lines.

13. A semiconductor integrated circuit device according to claim 8, wherein said one of said first and second signal lines include complementary data line pairs of said RAM type memory mat.

14. A semiconductor integrated circuit device according to claim 13, wherein said third signal lines correspond to a wiring level layer which is a relatively higher level layer with respect to the main surface of said chip than the wiring layer corresponding to said word lines.

15. A semiconductor integrated circuit device according to claim 8, wherein said first signal lines include a plurality of word lines, and wherein said third signal lines and said word lines are disposed along a parallel direction with respect to each other.

16. A semiconductor integrated circuit device according to claim 15, wherein said third signal lines correspond to a wiring level layer which is a relatively higher level layer with respect to the main surface of said chip than the wiring layer corresponding to said second signal lines.

17. A semiconductor integrated circuit device comprising:

a semiconductor chip having a main surface;

a logic circuit block being disposed on the main surface of said chip at a substantially central position thereof and which includes a plurality of logic gates;

an input/output (I/O) cell group being comprised of input/output (I/O) cells disposed on the main surface of said chip along a periphery thereof;

a memory region being comprised of at least one RAM type memory mat and a correspondingly associated at least one peripheral circuit and being provided between said logic circuit block and correspondingly associated I/O cells of said I/O cell group, wherein each RAM type memory mat of said at least one RAM type memory mat includes a plurality of RAM type memory cells, a plurality of first signal lines of a first level wiring layer and a plurality of second signal lines of a second level wiring layer which are electrically connected to said RAM type memory cells;

a plurality of third signal lines of a third level wiring layer interconnecting the respective I/O cells in said I/O cell group and said logic circuit block; and wherein said second signal lines of the second level wiring layer and third signal lines of the third level wiring layer are disposed so as to intersect each other substantially at right angles over at least each corresponding RAM type memory mat of said at least one RAM type memory mat, and wherein said third signal lines are disposed so as to be extended along a direction orthogonal to that of said second signal lines in a substantially straight-line form over respective ones of said at least one RAM type memory mat and along a substantially parallel plane to the main surface of said chip.

18. A semiconductor integrated circuit device according to claim 17, wherein said second signal lines of said second level wiring layer include word lines of said at least one RAM type memory mat.

19. A semiconductor integrated circuit device according to claim 18, wherein said first signal lines of said first level wiring layer include complementary data line pairs.

20. A semiconductor integrated circuit device according to claim 19, wherein said complementary data line pairs are disposed so as to be electrically connected to a peripheral circuit of a correspondingly associated RAM type memory mat with respect to each one of said at least one RAM type memory mat, and wherein said at least one peripheral circuit is electrically connected to said logic circuit block.

21. A semiconductor integrated circuit device according to claim 33, wherein said second signal lines of said second level wiring layer include complementary data line pairs of said at least one RAM type memory mat.

22. A semiconductor integrated circuit device according to claim 21, wherein said first signal lines of said first level wiring layer include word lines of said at least one RAM type memory mat.

23. A semiconductor integrated circuit device according to claim 22, wherein said complementary data line pairs are disposed so as to be electrically connected to a peripheral circuit of a correspondingly associated RAM type memory mat with respect to each one of said at least one RAM type memory mat, and wherein said at least on peripheral circuit is electrically connected to said logic circuit block.

* * * * *